United States Patent [19]
Yamamoto et al.

[11] Patent Number: 5,619,369
[45] Date of Patent: Apr. 8, 1997

[54] DIFFRACTING DEVICE HAVING DISTRIBUTED BRAGG REFLECTOR AND WAVELENGTH CHANGING DEVICE HAVING OPTICAL WAVEGUIDE WITH PERIODICALLY INVERTED-POLARIZATION LAYERS

[75] Inventors: Kazuhisa Yamamoto, Settsu; Kiminori Mizuuchi, Neyagawa, both of Japan

[73] Assignee: Matsushita Electric Industrial Co., Ltd., Japan

[21] Appl. No.: 91,955

[22] Filed: Jul. 15, 1993

[30] Foreign Application Priority Data

Jul. 16, 1992 [JP] Japan .................................. 4-189138
Jul. 31, 1992 [JP] Japan .................................. 4-204815
Jul. 31, 1992 [JP] Japan .................................. 4-204821
Apr. 13, 1993 [JP] Japan .................................. 5-085950

[51] Int. Cl.$^6$ .................................................... G02F 1/37
[52] U.S. Cl. ......................... 359/332; 359/328; 372/22; 385/37; 385/122
[58] Field of Search ............ 385/37, 122; 359/326–332; 372/21, 22, 96

[56] References Cited

U.S. PATENT DOCUMENTS

| | | | |
|---|---|---|---|
| 4,102,560 | 7/1978 | Miller | 385/37 |
| 4,914,667 | 4/1990 | Blonder et al. | 372/96 X |
| 5,033,812 | 7/1991 | Yoshida et al. | 385/37 |
| 5,036,220 | 7/1991 | Byer et al. | 359/328 |
| 5,064,265 | 11/1991 | Khanarian et al. | 359/332 X |
| 5,121,250 | 6/1992 | Shinozaki et al. | 359/328 |
| 5,128,948 | 7/1992 | Papuchon et al. | 372/21 |
| 5,157,537 | 10/1992 | Rosenblatt | 385/37 X |
| 5,185,752 | 2/1993 | Welch et al. | 372/22 |
| 5,243,676 | 9/1993 | Bierlein et al. | 385/122 |
| 5,249,191 | 9/1993 | Sawaki et al. | 372/22 |
| 5,285,508 | 2/1994 | Chikuma | 385/37 X |
| 5,303,247 | 4/1994 | Yamamoto et al. | 372/22 |
| 5,357,533 | 10/1994 | Mizuuchi et al. | 372/22 |
| 5,373,575 | 12/1994 | Yamamoto et al. | 385/122 |
| 5,387,998 | 2/1995 | Kitaoka et al. | 359/328 |

FOREIGN PATENT DOCUMENTS

| | | |
|---|---|---|
| 0379358 | 7/1990 | European Pat. Off. . |
| 0423702 | 4/1991 | European Pat. Off. . |
| 3536497 | 4/1986 | Germany . |

OTHER PUBLICATIONS

Electronics Letters. vol. 24, No. 14, 7 Jul. 1988 Stevenage GB, pp. 844 – 845 J. Söchtig 'Ti:LiNbO$_3$ Stripe Waveguide Bragg Reflector Gratings'.
"Ti:LinbO$_3$ Stripe Waveguide Bragg Reflector Gratings" by J. Söchtig; Electronics Letters 7th Jul. 1988, vol. 24, No. 14; pp. 844 and 845.
"Milliwatt–Order Blue–Light Generation in a Periodically Domain–Inverted LiTaO$_3$ Waveguide" by K. Yamamoto et al., Optics Letters/vol. 16, No. 15/Aug. 1, 1991; pp. 1156–1158.

(List continued on next page.)

Primary Examiner—John D. Lee
Attorney, Agent, or Firm—Rossi & Associates

[57] ABSTRACT

A diffracting device consists of a substrate made of LiTaO$_3$, an optical waveguide extending in a central upper side of the substrate for transmitting 860 nm wavelength coherent light radiated from a semiconductor laser, a plurality of gratings periodically arranged on the optical waveguide at regular intervals, and a covering layer arranged on the gratings and the optical waveguide. The optical waveguide is formed according to a proton-exchange process. The gratings are made of photoresist material having a refractive index N1=1.5 and a high workability, and the gratings are uniformly formed according to an interference-exposure process. Therefore, the photoresist material is patterned without damaging the optical waveguide with reactive ions. The covering layer is made of Ta$_2$O$_5$ having a refractive index N2=2.0. Therefore, periodic change in the refractive index is generated in a periodic structure of the gratings and the covering layer, and a part of the coherent light is reflected by the periodic structure to fix the wavelength of the coherent light radiated from the semiconductor laser.

79 Claims, 30 Drawing Sheets

OTHER PUBLICATIONS

"Self-Quasi-Phase-Matched Second-Harmonic Generation in the Proton-Exchanged LiNbO$_3$ Optical Waveguide with Periodically Domain-Inverted Regions" by K. Shinozaki et al.; Appl. Phys. Lett. 59 (5), 29 Jul. 1991; pp. 510–512.

Robert G. Hunsperger "Integrated Optics: Theory and Technology" Springer–Verlag Berlin Heidelberg New York 1982, pp. 100 – 101 [No Month].

M. L. Dakss, et al. "Granting Coupler For Efficient Excitation Of Optical Guided Waves In Thin Films" pp. 523 – 525, *Appl. Phys. Lett.*, vol. 16, No. 12, Jun. 1970.

INTENSITY DISTRIBUTION OF COHERENT LIGHT

FIG. 12

| | OPTICAL CHARACTERISTICS | | | |
|---|---|---|---|---|
| | REFLECTION EFFICIENCY | TRANSMISSION EFFICIENCY | GUIDED WAVE LOSS | FULL WIDTH AT HALF MAXIMUM |
| DIFFRACTING DEVICE 51 (FIRST EMBODIMENT) | 50 % | 40 % | 1 dB/cm | 0.03 nm |
| SAMPLE 1 | 5 % | 10 % | 10 dB/cm | 1 nm |
| SAMPLE 2 | 20 % | 40 % | 5 dB/cm | 0.5 nm |
| DIFFRACTING DEVICE 71 (SECOND EMBODIMENT) | 60 % | 20 % | 2 dB/cm | 0.05 nm |
| DIFFRACTING DEVICE 73 (SECOND EMBODIMENT) | 70 % | 5 % | 2 dB/cm | — |

INTENSITY DISTRIBUTION
OF COHERENT LIGHT

INTENSITY DISTRIBUTION
OF COHERENT LIGHT

FIG. 21

| POSITION OF GRATINGS 54 | RADIATION LOSS OF SECOND HARMONIC WAVES P2 | INTENSITY OF SECOND HARMONIC WAVES P2 |
|---|---|---|
| FRONT OF INVERTED-POLARIZATION LAYERS 93 | 0 % | 5 mW |
| REAR OF INVERTED-POLARIZATION LAYERS 93 | 50 % | 3 mW |

DIRECTION OF POLARIZATION

DIFFRACTING DEVICE HAVING DISTRIBUTED BRAGG REFLECTOR AND WAVELENGTH CHANGING DEVICE HAVING OPTICAL WAVEGUIDE WITH PERIODICALLY INVERTED-POLARIZATION LAYERS

BACKGROUND OF THE INVENTION

1. Field of the Invention

The present invention relates to a diffracting device having a distributed bragg reflector, a wavelength changing device having an optical waveguide with periodically inverted-polarization layers, a laser beam generating apparatus in which a laser beam having a fixed wavelength is generated with the diffracting device or the wavelength changing device, an optical information processing apparatus in which information is optically read or written with the laser beam generating apparatus, and an integrated optical circuit in which a laser beam having a fixed waveguide is converged with integrated devices, in an optical information processing field, an optical applied measuring control field and an optical communication field in which coherent light is utilized. Also, the present invention relates to a manufacturing method of the diffracting device and a manufacturing method of the wavelength changing device.

2. Description of the Related Art

A diffracting device is important to be utilized for not only a device having an optical waveguide but also a light integrated circuit. In cases where a plurality of gratings are periodically arranged in an optical waveguide to manufacture a diffracting device, light propagated through the optical waveguide is controlled by the gratings. For example, in cases where the gratings periodically arranged in the optical waveguide act as a distributed Bragg reflector, coherent light having a particular wavelength is selectively reflected in the optical waveguide, and the coherent light reflected is propagated through the optical waveguide in the opposite direction.

2.1. FIRST PREVIOUSLY PROPOSED ART:

A conventional diffracting device is described with reference to FIG. 1.

FIG. 1 is a diagonal view of a conventional diffracting device having a distributed Bragg reflector.

As shown in FIG. 1, a conventional diffracting device 11 consists of a $LiNbO_3$ substrate 12, a plurality of gratings 13 periodically arranged in series in a central surface of the substrate 12 at regular intervals $\Lambda 1$, and a Ti diffused optical waveguide 14 extending from one side of the substrate 12 to the other side through the gratings 13. In the above configuration, light beams having various wavelengths are radiated to an incident surface 14a positioned at one side of the optical waveguide 14, and a particular light beam having a particular wavelength is reflected by the gratings 13 because periodic change in a refractive index of the optical waveguide 14 is formed by the gratings 14 periodically arranged. That is, the gratings 13 act as a distributed Bragg reflector. Therefore, the particular light beam is output from the incident surface 14a of the optical waveguide 14, and remaining light beams except the particular light beam are output from an output surface 14b positioned at the other side of the optical waveguide 14.

Next, a conventional manufacturing method of the conventional diffracting device 11 is described with reference to FIGS. 2A to 2D. The method is performed with two superimposed masks (J. SOCHTIG, "Ti:$LiNbO_3$ Stripe Waveguide Bragg Reflector Grating", Electronics Letters, Vol. 24, No. 14, p. 844–845 (1988)).

As shown in FIG. 2A, after the optical waveguide 14 is formed by diffusing Ti into a central surface region of the substrate 12, a thin Ti film 15 is deposited on the substrate 12 and the optical waveguide 14. The thin Ti film 15 is utilized as a first superimposed mask. Thereafter, a photoresist 16 is spin coated on the Ti film 15. The photoresist 16 is utilized as a second superimposed mask. Thereafter, as shown in FIG. 2B, the photoresist 16 is exposed to interference light according to an interference-exposure process, and the photoresist 16 exposed is developed to remove exposed areas of the photoresist 16. Therefore, a periodic grating pattern is transferred to the photoresist 16. Thereafter, as shown in FIG. 2C, the Ti film 15 is periodically etched at regular intervals $\Lambda 1$ by reactive ions generated in an atmosphere of $CCl_2F_2$ gas according to a reactive ion etching to transfer the periodic grating pattern of the photoresist 16 to the Ti film 15. Thereafter, as shown in FIG. 2D, the patterned film 15 is used as a mask, and the $LiNbO_3$ substrate 12 is etched at the regular intervals $\Lambda 1$ by reactive ions generated in an atmosphere of $CF_4$, Ar, and $N_2$ according to the reactive ion etching. Therefore, the gratings 13 are periodically formed in surface portions of the substrate 12 at the regular intervals $\Lambda 1$. Thereafter, both sides of the optical waveguide 14 are polished.

FIG. 3 graphically shows transmitting and reflecting characteristics of the diffracting device 11.

As shown in FIG. 3, when light beams having wavelengths of 1.5 μm band are radiated from a light emitting diode and are coupled to the optical waveguide 14 of the diffracting device 11, a particular light beam having a particular wavelength λp which satisfies a Bragg condition is selectively reflected. The Bragg condition is determined by regular intervals of the gratings 13 and the effective refractive index of the grating.

2.2. SECOND PREVIOUSLY PROPOSED ART:

FIG. 4 is a cross-sectional view of another conventional diffracting device.

As shown in FIG. 4, another conventional diffracting device 21 consists of a glass substrate 22, an optical waveguide 23 formed in a central surface portion of the substrate 22 according to an ion-exchange process, and a plurality of $SiO_2$ gratings 24 periodically arranged at regular intervals $\Lambda 1=1.2$ μm. A total length of the $SiO_2$ gratings 24 is 10 mm in a propagation direction of the coherent light.

A distributed Bragg reflector is formed by a periodic structure composed of the $SiO_2$ gratings 24 and spaces between the gratings 24 in cases where a distributed Bragg reflector condition (or DBR condition) $\Lambda 1=m\lambda/2N$ is satisfied. Here the symbol $\Lambda 1$ denotes the regular intervals of the gratings 24, the symbol m is a grating order off the periodic structure, the symbol $\lambda$ denotes a wavelength of coherent light, and the symbol N denotes an averaged refractive index of the periodic structure. When the wavelength of the coherent light is 1.3 μm, the DBR condition is satisfied to reflect the coherent light in the periodic structure of which the grating order m is equal to 3.

In the above configuration, coherent light converged at an incident end facet 23a transmits through the optical waveguide 23. In this case, a part of the coherent light is distributed off the optical waveguide 23, so that the coherent light distributed off the optical waveguide 23 is reflected by the gratings 24.

Next, a manufacturing method of the diffracting device 21 is described.

After the optical waveguide 23 is formed in the substrate 22, a $SiO_2$ film is deposited on the optical waveguide 23 and the substrate 22. Thereafter, a photoresist film is coated on the $SiO_2$ film. Thereafter, grating pattern areas of the photoresist is selectively exposed to ultraviolet radiation according to a conventional interference-exposure process, and the photoresist is developed to remove the grating pattern areas of the photoresist. Therefore, a grating pattern is transferred to the photoresist film. Thereafter, the $SiO_2$ film etched by reactive ions according to a dry etching while the photoresist film is utilized as a mask. Therefore, the grating pattern is transferred to the $SiO_2$ film, and the gratings 24 made of $SiO_2$ are formed on the optical waveguide 23.

When 1.3 μm wavelength coherent light is coupled to the optical waveguide 23, 5% of the coherent light is reflected by the $SiO_2$ gratings 24.

2.3. PROBLEMS TO BE SOLVED BY THE INVENTION:

However, because the substrate 12 is made of a hard material $LiNbO_3$, complicated processes are required to directly etch the substrate 12 in the conventional diffracting device 11. Also, it is difficult to etch the gratings 13 made of the hard material by a predetermined depth. Therefore, the reprobability of the apparatus 11 deteriorates, and the gratings 13 are often excessively etched. Also, the surfaces of the gratings 13 become rough because of the radiation of the reactive ions. Therefore, light beams transmitting through the optical waveguide 14 are increasingly scattered. In the same manner, because the gratings 24 on the substrate 22 are made of a hard material $SiO_2$, complicated processes are required to form the gratings 24 according to an etching process in the conventional diffracting device 21. Also, it is difficult to etch the gratings 24 without erroneously etching the optical waveguide 23 according to a dry etching process. Therefore, the reprobability of the apparatus 21 deteriorates, and the gratings 24 are often excessively etched to etch the optical waveguide 23. As a result, the surfaces of the optical waveguide 24 become rough so that the coherent light is increasingly scattered.

Also, it is difficult to etch material having a large refractive index and a large transmission coefficient because an etching rate of those materials is very low in general. Therefore, it is troublesome to deeply form the gratings 13, 24. As a result, it is difficult to reflect the light with high reflecting efficiency. Also, because the gratings 13, 24 are formed according to the complicated processes in which a plurality of pattern transferring processes are performed, the unevenness of the periodic pattern in the gratings 13, 24 is increased. Therefore, as shown in FIG. 3, though the reflection of the light beams theoretically occurs at a single particular wavelength λp, the reflection of the light beams actually occurs in a wide wavelength range. In other words, the condition that the gratings 13, 24 function as the distributed Bragg reflector deteriorates because of the complicated processes.

Also, because the unevenness of the periodic pattern in the gratings 13, 24 is increased and because the light transmitting through the optical waveguides 14, 23 is scattered by the roughness of the gratings 13 and the optical waveguide 23, a transmission loss of the fundamental waves is increased. Therefore, the intensity of the light is lowered, and a diffraction efficiency of the gratings 13, 24 is lowered.

Also, because the position of the gratings 13, 24 is limited near to the surfaces of the substrates 12, 22, the intensity of the light reflected by the gratings 13, 24 is limited. Therefore, it is difficult to reflect the light with high reflecting efficiency unless the length of the gratings 13, 24 extending in a propagation direction is extremely lengthened to increase the number of gratings 13, 24.

2.4. THIRD PREVIOUSLY PROPOSED ART:

A wavelength changing device having an optical waveguide has been proposed. The optical waveguide is provided with alternate rows of non-inverted and inverted polarization layers to change fundamental waves transmitting through the optical waveguide to second harmonic waves. The inverted polarization layers are formed by compulsorily inverting the non-linear polarization of ferroelectric substance. The wavelength changing device is utilized for a small-sized shorter wavelength laser beam generating apparatus because fundamental waves radiated from a semiconductor laser are changed to second harmonic waves such as a green or blue light. Therefore, the wavelength changing device is useful in a printing operation, an optical information processing, an optical applied measuring control field, and an optical communication field.

The wavelength change in the wavelength changing device can be performed with high efficiency because fundamental waves radiated from a semiconductor laser are changed to second harmonic waves in the alternate rows of non-inverted and inverted polarization layers. Also, because the wavelength of the fundamental waves changed to the second harmonic waves depends on regular intervals of the alternate rows, the wavelength of the second harmonic waves obtained in the wavelength changing device can be arbitrarily changed. However, because the regular intervals of the alternate rows in the wavelength changing device are fixed, the output power of the second harmonic waves considerably fluctuates when the wavelength of the fundamental waves radiated from a semiconductor laser fluctuates.

For example, the change of wavelength in a shorter wavelength laser beam generating apparatus has been proposed (K. Yamamoto et. al, "Milliwatt-Order Blue-light Generation in a Periodically domain-Inverted $LiTaO_3$ waveguide", Optica letters, Vol. 16, No. 15, p. 1156–1158, (1991)). In the laser beam generating apparatus of Yamamoto, fundamental waves of semiconductor laser beams are changed to second harmonic waves in an optical waveguide having alternate rows of non-inverted and inverted polarization layers according to quasi-phase matching.

FIG. 5 is a constitutional view of a conventional shorter wavelength laser beam generating apparatus.

As shown in FIG. 5, a conventional shorter wavelength laser beam generating apparatus 31 consists of a semiconductor laser 32, a collimator lens 33 for collimating fundamental waves radiated from the semiconductor laser 32, a λ/2 plate 34 for rotatively polarizing the fundamental waves, a focusing lens 35 having a numerical aperture NA=0.6, and a wavelength converting device 36 having an optical waveguide 37 for changing the fundamental waves converged at an incident end facet 37a to second harmonic waves such as blue light according to the quasi-phase matching. The optical waveguide 37 is provided with alternate rows of non-inverted and inverted polarization layers. The incident end facet 37a and an output end facet 37b of the optical waveguide 37 are coated with antireflection coating to prevent the fundamental waves from being reflected in the incident and output end facets 37a, 37b.

In the above configuration, 874 nm wavelength fundamental waves are radiated from the semiconductor laser 32 and are collimated by the collimator lens 34. Thereafter, the fundamental waves are rotatively polarized by the λ/2 plate 34 and are converged at the incident end facet 37a of the optical waveguide 37 by the focusing lens 35. In this case, though the antireflection coating is coated on the incident end facet 37a, approximately 1% of the fundamental waves are fed back to the semiconductor laser 32 in practical use. Thereafter, blue light consisting of 437 nm wavelength second harmonic waves are radiated from the output end facet 37b of the optical waveguide 37 on condition that a quasi-phase matching condition formulated by an equation $\Lambda 2 = \lambda_f / \{2*(N2\omega - N\omega)\}$ is satisfied. Here the symbol $\Lambda 2$ denotes regular intervals of the alternate rows in the optical waveguide 37, the symbol $\lambda_f$ denotes a wavelength of the fundamental waves, the symbol $N2\omega$ denotes an effective refractive index of the non-inverted and inverted polarization layers for the second harmonic waves, and the symbol $N\omega$ denotes an effective refractive index of the non-inverted and inverted polarization layers for the fundamental waves.

Accordingly, the fundamental waves such infrared light can be reliably changed to blue light. For example, when the pumping power of the fundamental waves converged at the incident end facet 37a of the optical waveguide 37 is 35 mW, the pumping power of the blue light radiated from the output end facet 37b is 1.1 mW.

However, because the blue light is generated by changing the fundamental waves to the second harmonic waves and multiplying the second harmonic waves in the optical waveguide 37 in which the alternated rows of the non-inverted and inverted polarization layers are arranged at regular intervals, a wavelength range of the fundamental waves allowed to obtain the second harmonic waves is only 0.2 nm in the optical waveguide 37. Also, the wavelength of the fundamental waves radiated from the semiconductor laser 32 fluctuates depending on the ambient temperature of the semiconductor laser 32. The fluctuation ratio of the wavelength to the ambient temperature is about 0.2 nm/° C. Therefore, in cases where the ambient temperature of the semiconductor laser 32 varies by 1° C., the blue light cannot be generated in the optical waveguide 37.

In addition to the fluctuation of the ambient temperature, the amplification mode of the fundamental waves radiated from the semiconductor laser 32 varies because approximately 1% of the fundamental waves converged at the incident end facet 37a of the optical waveguide 37 is fed back to the semiconductor laser 32. In this case, the wavelength of the fundamental waves radiated from the semiconductor laser 32 varies about 1 nm after a short time. Therefore, the stable change period of the fundamental waves to the second harmonic waves is no more than several seconds.

Accordingly, the stabilization of the wavelength of the fundamental waves is required to stably generate the blue light in the conventional shorter wavelength laser beam generating apparatus 31.

2.5. FOURTH PREVIOUSLY PROPOSED ART:

To stably change fundamental waves to second harmonic waves with a wavelength changing device according to the quasi-phase matching, a wavelength changing device having a plurality of gratings periodically arranged has been proposed (K. Shinozaki, et. al, "Self-Quasi-Phase-Matched Second-Harmonic Generation in the Proton-Exchanged LiNbO₃ Optical Waveguide with Periodically Domain-Inverted Regions", Apply. Phys. Lett., Vol. 59, No. 29, p. 510–512(1991)).

FIG. 6 is a constitutional view of another conventional shorter wavelength laser beam generating apparatus in which a conventional wavelength changing device of Shinozaki is arranged.

As shown in FIG. 6, a conventional shorter wavelength laser beam generating apparatus 41 consists of a semiconductor laser 42, a conventional wavelength changing device 43 for changing 1.3 μm wavelength fundamental waves radiated from the semiconductor laser 42 to 0.65 μm wavelength second harmonic waves, a spectrum analyzer 44 for analyzing the wavelength of the fundamental waves radiated from the semiconductor laser 42, and two pairs of optical lenses 45 for converging the fundamental waves radiated from the semiconductor laser 42 at single mode fibers connected to the wavelength changing device 43 and the spectrum analyzer 44. The wavelength changing device 43 consists of a polarized LiNbO₃ substrate 46, an optical waveguide 47 having inverted polarization layers 48 (or domain-inverted regions) periodically arranged at regular intervals $\Lambda$. Regions between the inverted polarization layers 48 are called non-inverted polarization layers 49 for convenience.

In the optical waveguide 47, mismatching between a propagation constant of the fundamental waves and another propagation constant of the second harmonic waves is compensated by alternate rows of the inverted and non-inverted polarization layers 48, 49. This is, because the difference in the propagation constant between the fundamental waves and the second harmonic waves occurs, the phase of the fundamental waves agrees with that of the second harmonic waves in the optical waveguide 47 each time the fundamental waves transmit a minimum distance. Therefore, in cases where the regular intervals $\Lambda$ of the inverted polarization layers 48 agree with a multiple of the minimum distance, the quasi-phase matching condition $\Lambda = \lambda_f / \{2*(N2\omega - N\omega)\}$ is satisfied, and the fundamental waves are changed to the second harmonic waves. The condition that the regular intervals $\Lambda$ of the inverted polarization layers 48 agree with the minimum distance is called a first-order quasi-phase matching. Also, the condition that the regular intervals $\Lambda$ agree with N times minimum distance is called an Nth-order quasi-phase matching.

In the above configuration, fundamental waves having various wavelengths around 1.3 μm are radiated from the semiconductor laser 42 and are converged at the optical waveguide 47 through the optical lenses 45 and the single mode fiber. In the optical waveguide 47, quasi-phase matching (QPM) fundamental waves having a QPM wavelength satisfying the quasi-phase matching condition are selectively changed to second harmonic waves, and the second harmonic waves are efficiently amplified and output from the optical waveguide 47. Therefore, the QPM fundamental waves are selectively changed to the second harmonic waves in the wavelength changing device 43.

In addition, because an effective refractive index of the inverted polarization layers 48 is slightly higher than another effective refractive index of the non-inverted polarization layers 49, a periodic structure in the effective refractive index consisting of the inverted polarization layers 48 and the non-inverted polarization layers 49 is produced in the optical waveguide 47. Therefore, a plurality of gratings are substantially formed in the optical waveguide 47. A group of the gratings substantially formed functions as a distributed Bragg reflector on condition that the DBR condition $\Lambda = m\lambda / 2N$ is satisfied. That is, DBR fundamental waves having a DBR wavelength satisfying the DBR condition are selectively reflected in the gratings. Thereafter, the reflected DBR fundamental waves are fed back to the semiconductor laser 42. Therefore, the wavelength of the fundamental waves radiated from the semiconductor laser 42 is fixed to the DBR wavelength.

Accordingly, in cases where the DBR wavelength of the DBR fundamental waves reflected in the periodic structure functioning as the distributed Bragg reflector agrees with the QPM wavelength of the QPM fundamental waves, the change of the fundamental waves to the second harmonic waves can be stably performed in the conventional shorter wavelength laser beam generating apparatus 41.

To achieve an agreement of the DBR wavelength of the reflected DBR fundamental waves and the QPM wavelength of the QPM fundamental waves, regular intervals a of the inverted polarization layers 48 periodically arranged are set to 13 μm μm. In this case, the wavelength of the fundamental waves radiated from the semiconductor laser 42 is fixed to 1.327 μm, and 1.327/2 μm wavelength second harmonic waves are stably generated. Also, the alternate rows of the inverted and non-inverted polarization layers 48, 49 becomes a first-order in the QPM structure, and the gratings functioning as the distributed Bragg reflector becomes a forty-third order in the DBR periodic structure. The grating order m is defined as an equation $m=\Lambda/(\lambda_f/2N)$. Here the symbol A denotes the regular intervals of the inverted polarization layers 48, the symbol $\lambda_f$ denotes a wavelength of the fundamental waves, and the symbol N denotes an effective averaged refractive index of the optical waveguide 47 for the fundamental waves. In cases where the pumping power of the fundamental waves converged at the optical waveguide 47 is 60 μW and the length of the optical waveguide 47 is 2 mm, the output power of the second harmonic waves is 0.652 pW.

2.6. PROBLEMS TO BE SOLVED BY THE INVENTION:

However, because the inverted polarization layers 48 periodically arranged function as a distributed Bragg reflector grating in the conventional shorter wavelength laser beam generating apparatus 41, a propagation speed of the fundamental waves and another propagation speed of the second harmonic waves are required to be controlled with high accuracy to achieve the agreement of the DBR wavelength of the DBR fundamental waves and the QPM wavelength of the QPM fundamental waves.

Also, the range of the wavelength of the fundamental waves changed in the apparatus 41 is limited. Therefore, even though 1.3 μm wavelength fundamental waves can be stably changed to 0.65 μm wavelength second harmonic waves, there is a drawback that shorter wavelength second harmonic waves (the wavelengths range from 400 nm to 500 nm) useful in various fields are difficult to be generated in the apparatus 41.

Also, because the inverted polarization layers 48 periodically arranged are utilized as the distributed Bragg reflector in the conventional shorter wavelength laser beam generating apparatus 41, the grating order in the DBR periodic structure becomes large in the apparatus 41. For example, in cases where the alternate rows of the inverted and non-inverted polarization layers 48, 49 is equivalent to the first-order in the QPM structure, the periodic structure functioning as the distributed Bragg reflector is equivalent to a several tens of grating order in the DBR periodic structure. Therefore, the fundamental waves are coupled to various radiation modes in the optical waveguide 47. The radiation modes consists of N types of radiation modes from a first radiation mode corresponding to the first grating order to an Nth radiation mode corresponding to an Nth grating order in cases where the periodic structure of the inverted polarization layers 48 is equivalent to the Nth grating order. Thereafter, the fundamental waves are radiated to various directions without being changed to the second harmonic waves while being led by the various radiation modes. As a result, the fundamental waves attenuates in the optical waveguide 47, and a radiating loss of the fundamental waves is increased. Accordingly, because the fundamental waves contributing the generation of the second harmonic waves are decreased by the increase of the radiating loss, there is a drawback that a changing efficiency of the fundamental waves to the second harmonic waves deteriorates. This drawback is illustrated in FIG. 7.

FIG. 7 graphically shows a relationship between a reflection efficiency of the fundamental waves and the grating order and another relationship between a radiation loss of the fundamental waves and the grating order. As shown in FIG. 7, in cases where the gratings are arranged in a tenth grating order periodic structure, the reflection efficiency is only 10%, and the radiation loss is no less than 75%. Therefore, in cases where the grating order of periodic structure in the the distributed Bragg reflector grating is equal to or more than third grating order, the radiation loss of the fundamental waves is too many so that the conventional shorter wavelength laser beam generating apparatus 41 is not useful in practical use.

In addition, higher grating order of the DBR periodic structure adversely influences on not only the fundamental waves but also the second harmonic waves generated in the optical waveguide 47 to increase a radiation loss of the second harmonic waves. Therefore, the second harmonic waves are scattered and reflected in the optical waveguide 47 to decrease the second harmonic waves radiated from an output end facet 47b of the optical waveguide 47. As a result, there is a drawback that the changing efficiency of the fundamental waves to the second harmonic waves moreover deteriorates. Accordingly, a wavelength changing device having the DBR periodic structure of a lower grating order (a first grating order or a second grating order) is required to change the fundamental waves to the second harmonic waves at high efficiency in practical use.

SUMMARY OF THE INVENTION

A first object of the present invention is to provide, with due consideration to the drawbacks of such a conventional diffracting device, a diffracting device in which coherent light is reflected at high reflection efficiency while reducing a transmission loss of the fundamental waves, and a method in which the diffracting device is manufactured according to simple processes at high reprobability.

A second object of the present invention is to provide a wavelength changing device in which a plurality of gratings periodically arranged are uniformly formed on a substrate having an optical waveguide to efficiently change fundamental waves to second harmonic waves and to stably generate the second harmonic waves, and a manufacturing method of the wavelength changing device in which a plurality of gratings are uniformly arranged on a substrate having an optical waveguide to efficiently reflect fundamental waves and to efficiently change the fundamental waves to second harmonic waves.

A third object of the present invention is to provide a laser beam generating apparatus in which a laser beam having a fixed wavelength is stably generated with the diffracting device or the wavelength changing device.

A fourth object of the present invention is to provide an optical information processing apparatus in which information is optically read or written with the laser beam generating apparatus.

A fifth object of the present invention is to provide an integrated optical circuit in which a laser beam having a fixed wavelength is converged with integrated devices.

The first object is achieved by the provision of a diffracting device, comprising:

a substrate;

an optical waveguide arranged in the substrate for transmitting coherent light from an incident side to an output side;

a plurality of gratings periodically arranged adjacent to the optical waveguide at regular intervals in a propagation direction of the coherent light transmitting through the optical waveguide, the gratings being made of a soft material which has high workability, and a first refractive index of the gratings being equal to N1; and a covering layer arranged between the gratings for covering the gratings, a second refractive index of the covering layer being equal to N2 which differs from the first refractive index N1 of the gratings to form a refractive change in a periodic structure consisting of the covering layer and the gratings, and a part of the coherent light being reflected in the periodic structure to diffract the coherent light.

In the above configuration, coherent light radiated to the incident side of the optical guide transmits through the optical waveguide towards the output side thereof. In this case, a part of the coherent light is distributed in the periodic structure consisting of the covering layer and the gratings. Also, the refractive index of the gratings differs from that of the covering layer. Therefore, the periodic structure functions as a diffraction grating, and the coherent light is reflected in the periodic structure. As a result, in cases where the regular intervals of the gratings are equal to a multiple of a half wavelength of the coherent light, the reflected light is amplified and output from the incident side of the optical guide.

A reflection efficiency is increased as the regular intervals of the gratings become shorter because the number of the gratings is increased. Therefore, a minute periodic structure is required of the diffracting device to enhance the reflection efficiency. Where a wavelength $\lambda$ of the coherent light, an averaged refractive index N of the periodic structure, and the grating order m of the diffracting device are defined, the regular intervals $\Lambda$ of the gratings satisfy an equation $\Lambda=m*\lambda/(2N)$. Specifically, when the wavelength $\lambda=800$ nm and the averaged refractive index N=2 are given, the regular intervals $\Lambda$ in a first order grating (m=1) is 0.2 μm. The value 0.2 μm is very small. Also, the reflection efficiency is increased as the height of the gratings is large because a reflecting area in each of the gratings is increased.

In the present invention, because the soft material is utilized as a material of the gratings, the regular intervals of the gratings can be easily shortened. For example, in cases where a photoresist material is utilized as a material of the gratings, the gratings can be minutely patterned according to an interference-exposure process. Therefore, the periodic structure of a low grating order such as a first grating order or a second grating order can be easily manufactured with high accuracy. Also, because any etching process in which the soft material is etched by reactive ions is not required to minutely pattern the soft material, the optical waveguide is not damaged by the reactive ions. In addition, the gratings can be deeply formed because the soft material has high workability.

Accordingly, the diffracting device according to the present invention has superior reflection efficiency. Also, a transmission loss is lowered in the diffracting device according to the present invention.

In addition, because the gratings are covered by the covering layer, the covering layer functions as a protector for protecting the gratings from the atmosphere. Therefore, the superior reflection efficiency of the diffracting device can be maintained for a long time.

Also, the first object is achieved by the provision of a diffracting device, comprising:

a substrate made of a non-linear crystal, the substrate being polarized in a first direction;

an optical waveguide arranged in the substrate for transmitting coherent light, the optical waveguide extending in a propagation direction perpendicular to the first direction;

a plurality of inverted polarization layers periodically arranged in the substrate at regular intervals in the propagation direction to cross the optical waveguide, a polarization direction of the inverted polarization layers being opposite to the first direction of the substrate, and each of non-inverted polarization layers being arranged between the inverted polarization layers;

an electrode arranged on the optical waveguide, in which alternate rows of the inverted polarization layers and the non-inverted polarization layers are arranged, for inducing electric field which penetrates through the inverted polarization layers and the non-inverted polarization layers to change a first refractive index of the inverted polarization layers and to change a second refractive index of the non-inverted polarization layers, increase or decrease of the first refractive index being opposite to that of the second refractive index to produce a diffraction grating formed by periodic change of the first and second refractive indexes in the alternate rows, and a part of the coherent light being reflected in the diffracting grating; and an electric source for applying an electric potential to the electrode.

In the above configuration, when an electric potential is applied to the electrode by the electric source, electric field penetrating through the inverted polarization layers and the non-inverted polarization layers is induced. Therefore, the refractive index of the inverted polarization layers and the non-inverted polarization layers change according to an electro-optic effect. Also, because the polarization direction of the inverted polarization layers is opposite to that of the non-inverted polarization layers, increase or decrease of the first refractive index of the inverted polarization layers is opposite to the second refractive index of the non-inverted polarization layers. Therefore, a diffraction grating is formed by periodic change of the refractive index in the alternate rows of the inverted polarization layers and the non-inverted polarization layers.

When coherent light transmits through the optical waveguide, the coherent light is reflected by the alternate rows which function as the diffraction grating, on condition that a distributed Bragg condition $\Lambda=m*\lambda/(2N)$ is satisfied. Here the symbol $\Lambda$ denotes the regular intervals of the inverted polarization layers, the symbol $\lambda$ denotes the wavelength of the coherent light, the symbol N denotes an averaged refractive index of the alternate rows, and the symbol m denotes a grating number.

Accordingly, because the second inverted polarization layers are generally formed at a high uniformity without any damage, the diffracting device according to the present invention has superior reflection efficiency. Also, a transmission loss can be lowered.

Also, the first object is achieved by the provision of a diffracting device, comprising:

substrate;

an optical waveguide arranged in the substrate for transmitting coherent light from an incident side to an output side;

a plurality of gratings periodically arranged adjacent to the optical waveguide at regular intervals in a propagation direction of the coherent light transmitting through the optical waveguide, a ratio of a width of each of the gratings in the propagation direction to the regular intervals $\Lambda$ of the gratings is in a first range from 0.05 to 0.24 or in a second range from 0.76 to 0.95 on condition that an equation $\Lambda = m*\lambda/(2N)$, $m=2$ where the symbol $\lambda$ is a wavelength of the coherent light and the symbol N is an effective refractive index of the optical waveguide, and a part of the coherent light being reflected by the gratings.

In the above configuration, the regular interval of the gratings is set to satisfy the DBR condition expressed by the equation $m*\lambda/(2N)$, $m=2$. In this case, a radiation loss for the coherent ligt transmitting through the optical waveguid is generally increased. For example, when the ratio W/$\Lambda$ of the width W of each of the gratings to the regular intervals $\Lambda$ of the gratings is in the vicinity of 0.5, the diffracting device does not function as the distributed Bragg reflector. However, in cases where the ratio W/$\Lambda$ is in the first range from 0.05 to 0.24 or in the second range from 0.76 to 0.95, the diffracting device functions as the distributed Bragg reflector at high efficiency.

Also, the first object is achieved by the provision of a method for manufacturing a diffracting device, comprising the steps of:

forming an optical waveguide in a substrate, coherent light transmitting through the optical waveguide which extends in a propagation direction;

patterning a soft material on the optical waveguide to form a plurality of gratings periodically arranged at regular intervals in the propagation direction of the coherent light, the soft material having high workability, and a first refractive index of the gratings being equal to N1; and arranging a covering layer between the gratings to cover the gratings, a second refractive index of the covering layer being equal to N2 which differs from the first refractive index N1 to form a refractive change in a periodic structure consisting of the covering layer and the gratings, and the coherent light being reflected in each of alternate rows of the covering layer and the gratings to diffract the coherent light.

In the above steps, as the regular intervals of the gratings becomes shorter, the number of the gratings is increased. Therefore, coherent light transmitting the optical waveguide is reflected more times in the alternate rows of the covering layer and the gratings, and a reflection efficiency is increased. Therefore, a minute periodic structure is required to enhance the reflection efficiency in the diffracting device.

Also, the reflection efficiency is increased as the height of the gratings is large because a reflecting area in each of the gratings is increased. Therefore, the gratings deeply formed are required to enhance the reflection efficiency in the diffracting device.

In the present invention, because the soft material is utilized as a material of the gratings, the regular intervals of the gratings can be easily shortened. For example, in cases where a photoresist material is utilized as a material of the gratings, the gratings can be minutely patterned according to an interference-exposure process. That is, the photoresist film arranged on the optical waveguide is exposed to interference-exposing light, and grating patterned areas of the photoresist film becomes soluble in a developer solution. Thereafter, the photoresist film is developed in the developer solution to remove the grating patterned areas of the photoresist film exposed. Therefore, the gratings are formed on the optical waveguide. In this case, because the photoresist film is exposed to interference-exposing light, regular intervals of the gratings can be easily shortened to about 0.2 μm. Accordingly, a large number of gratings can be arranged in a limited area to enhance the reflection efficiency.

Also, in cases where the soft material is deeply arranged on the optical waveguide, the gratings deeply formed can be easily arranged because the soft material has high workability.

In addition, because any etching process in which the soft material is etched by reactive ions is not required to minutely pattern the soft material, the optical waveguide is not damaged by any reactive ion. Therefore, the surface of the optical waveguide is smooth. Also, because two superimposed masks are not utilized, the gratings can be reliably uniform in size, and the regular intervals of the gratings can be reliably the same as one another. Accordingly, the coherent light transmitting though the optical wave guide can be selectively reflected by the alternate rows of the covering layer and the gratings with high accuracy.

In addition, because the gratings are covered by the covering layer, the covering layer functions as a protector for protecting the gratings from the atmosphere. Therefore, the superior reflection efficiency of the diffracting device can be maintained for a long time.

The second object is achieved by the provision of a wavelength changing device, comprising;

a substrate made of a non-linear crystal, the substrate being polarized in a first direction;

an optical waveguide arranged in the substrate for transmitting fundamental waves, the optical waveguide extending in a propagation direction perpendicular to the first direction;

a plurality of inverted polarization layers periodically arranged in the substrate at phase-matching intervals in the propagation direction to cross the optical waveguide, a polarization direction off the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers;

a plurality of gratings periodically arranged on the optical waveguide at grating intervals in the propagation direction, the gratings being made of a soft material which has high workability, and a first refractive index of the gratings being equal to N1; and a covering layer arranged between the gratings for covering the gratings, a second refractive index of the covering layer being equal to N2 which differs from the first refractive index N1 of the gratings to form a refractive change in a periodic structure consisting of the covering layer and the gratings, and the fundamental waves which do not change to the second harmonic waves in the alternate rows being reflected in the periodic structure.

In the above configuration, a part of fundamental waves radiated to the optical waveguide change to second harmonic waves, of which a wavelength $\lambda_h$ is half of another wavelength $\lambda_f$ of the fundamental waves, in the alternate rows of the inverted polarization layers and the non-inverted polarization layers. Thereafter, the second harmonic waves are output from an output end facet of the optical waveguide.

Also, the fundamental waves not changing to the second harmonic waves are reflected by the periodic structure of the covering layer and the gratings because the first refractive index N1 of the gratings differs from the second refractive index of the covering layer to form a refractive change functioning as a diffraction grating. The fundamental waves reflected are output from an incident end facet of the optical waveguide and are fed back to a fundamental wave source such as a semiconductor laser. Therefore, the wavelength $\lambda_f$ of the fundamental waves radiated from the fundamental source is fixed. Accordingly, the fundamental waves stably change to the second harmonic waves.

A reflection efficiency is increased as the grating intervals of the gratings become shorter because the number of the gratings is increased. Therefore, a minute periodic structure is required of the wavelength changing device to enhance the reflection efficiency. Where an averaged refractive index N of the periodic structure and the grating order m of the periodic structure are defined, the regular intervals $\Lambda 1$ of the gratings satisfy an equation $\Lambda 1 = m * \lambda_f/(2N)$. Specifically, when the wavelength $\lambda_f = 800$ nm and the averaged refractive index N=2 are given, the regular intervals $\Lambda 1$ in a first order grating (m=1) is 0.2 µm. The value 0.2 µm is very small. Also, the reflection efficiency is increased as the height of the gratings is large because a reflecting area in each of the gratings is increased.

In the present invention, because the soft material is utilized as a material of the gratings, the grating intervals of the gratings can be easily shortened. For example, in cases where a photoresist material is utilized as a material of the gratings, the gratings can be minutely patterned according to an interference-exposure process. Therefore, the periodic structure of a low grating order such as a first grating order or a second grating order can be easily manufactured with high accuracy. Also, because any etching process in which the soft material is etched by reactive ions is not required to minutely pattern the soft material, the optical waveguide is not damaged by the reactive ions. In addition, the gratings can be deeply formed because the soft material has high workability.

Accordingly, the wavelength changing device according to the present invention has superior reflection efficiency. Also, a transmission loss is lowered.

In addition, because the gratings are covered by the covering layer, the covering layer functions as a protector for protecting the gratings from the atmosphere. Therefore, the superior reflection efficiency can be maintained for a long time.

Also, the second object is achieved by the provision of a wavelength changing device, comprising;
- a substrate made of a non-linear crystal, the substrate being polarized in a first direction;
- an optical waveguide arranged in the substrate for transmitting fundamental waves, the optical waveguide extending in a propagation direction perpendicular to the first direction;
- a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers;
- a dielectric film arranged on the optical waveguide for confining the second harmonic waves which spread outside the optical waveguide, the fundamental waves spreading outside the optical waveguide and the dielectric film; and
- a plurality of gratings periodically arranged on the dielectric film at grating intervals in the propagation direction, the fundamental waves which spread outside the dielectric film being reflected by the gratings.

In the above configuration, a part of fundamental waves radiated to the optical waveguide change to second harmonic waves, of which a wavelength $\lambda_h$ is half of another wavelength $\lambda_f$ of the fundamental waves, in the alternate rows of the inverted polarization layers and the non-inverted polarization layers. Therefore, the fundamental waves not changing to the second harmonic waves and the second harmonic waves transmit through the optical waveguide on which the dielectric film and the gratings are arranged.

An intensity distribution in a depth direction (parallel to the first direction) of the fundamental and second harmonic waves transmitting through the optical waveguide generally depends on the wavelength of the waves. That is, the spread of the fundamental waves in intensity distribution is larger than that of the second harmonic waves. Therefore, the fundamental waves spread out over the dielectric film. In contrast, the second harmonic waves are confined into the dielectric film and the optical waveguide. As a result, the fundamental waves are selectively reflected by the grating, and the fundamental waves are fed back to a fundamental wave source to fix the wavelength of the fundamental waves. Also, the second harmonic waves are output from an output end facet of the optical waveguide without being reflected by the gratings.

Accordingly, the fundamental waves can be selectively reflected at high reflection efficiency in the wavelength changing device according to the present invention. Also, a transmission loss for the harmonic waves is lowered.

Also, the second object is achieved by the provision of a wavelength changing device, comprising;
- a substrate made of a non-linear crystal, the substrate being polarized in a first direction;
- an optical waveguide arranged in the substrate for transmitting fundamental waves, the optical waveguide extending in a propagation direction perpendicular to the first direction;
- a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers; and
- a plurality of gratings periodically arranged on a side of the optical waveguide at grating intervals in the propagation direction, the fundamental waves which spread outside the optical waveguide being reflected by the gratings.

In the above configuration, an intensity distribution in a width direction (perpendicular to both the first direction and the propagation direction) of the fundamental and second harmonic waves transmitting through the optical waveguide generally depends on the wavelength of the waves. That is, the spread of the fundamental waves in intensity distribution is larger than that of the second harmonic waves. Therefore, the fundamental waves spread outside the optical waveguide. In contrast, the second harmonic waves are confined in the the optical waveguide. As a result, even though the gratings are not arranged just on the optical waveguide, the fundamental waves are selectively reflected by the grating, and the fundamental waves are fed back to a fundamental wave source to fix the wavelength of the fundamental waves. Also, the second harmonic waves are output from an output end facet of the optical waveguide without being reflected by the gratings.

Accordingly, the fundamental waves can be selectively reflected at high reflection efficiency in the wavelength changing device according to the present invention. Also, a transmission loss for the harmonic waves is lowered.

Also, the second object is achieved by the provision of a wavelength changing device, comprising;

a substrate made of a non-linear crystal, the substrate being polarized in a first direction;

an optical waveguide arranged in the substrate for transmitting fundamental waves, the optical waveguide extending in a propagation direction perpendicular to the first direction;

a plurality of first inverted polarization layers periodically arranged in the substrate at phase-matching intervals in the propagation direction to cross the optical waveguide, a polarization direction of the first inverted polarization layers being opposite to the first direction of the substrate, each of first non-inverted polarization layers being arranged between the first inverted polarization layers, and a part of the fundamental waves changing to second harmonic waves in alternate rows of the first inverted polarization layers and the first non-inverted polarization layers;

a plurality of second inverted polarization layers periodically arranged in the substrate at grating intervals in the propagation direction to cross the optical waveguide, a polarization direction of the second inverted polarization layers being opposite to the first direction of the substrate, each of second non-inverted polarization layers being arranged between the second inverted polarization layers;

an electrode arranged on the optical waveguide, in which a periodic structure of the second inverted polarization layers and the second non-inverted polarization layers are arranged, for inducing electric field which penetrates through the second inverted polarization layers and the second non-inverted polarization layers to change a first refractive index of the second inverted polarization layers and to change a second refractive index of the second non-inverted polarization layers, increase or decrease of the first refractive index being opposite to that of the second refractive index to produce a diffraction grating formed by periodic change of the first and second refractive indexes in the periodic structure, and another part of the fundamental waves being reflected in the diffraction grating; and an electric source for applying an electric potential to the electrode.

In the above configuration, a part of fundamental waves radiated to the optical waveguide change to second harmonic waves, of which a wavelength $\lambda_h$ is half of another wavelength $\lambda_f$ of the fundamental waves, in the alternate rows of the first inverted polarization layers and the first non-inverted polarization layers. Therefore, the fundamental waves not changing to the second harmonic waves and the second harmonic waves transmit through the optical waveguide in which the second inverted polarization layers and the second non-inverted polarization layers are arranged.

When an electric potential is applied to the electrode by the electric source, electric field penetrating through the second inverted polarization layers and the second non-inverted polarization layers is induced. Therefore, the refractive index of the second inverted polarization layers and the second non-inverted polarization layers change according to an electro-optic effect. Also, because the polarization direction of the second inverted polarization layers is opposite to that of the second non-inverted polarization layers, increase or decrease of the first refractive index of the second inverted polarization layers is opposite to the second refractive index of the second non-inverted polarization layers. Therefore, a diffraction grating is formed by periodic change of the refractive index in the periodic structure of the second inverted polarization layers and the second non-inverted polarization layers. As a result, the fundamental waves are reflected by the periodic structure functioning as the diffraction grating. Also, because a refractive index of the optical waveguide for the second harmonic waves differs from that for the fundamental waves, the second harmonic waves are not reflected by the periodic structure. That is, the second harmonic waves are output from an output end facet of the optical waveguide.

Accordingly, because the second inverted polarization layers are generally formed at a high uniformity without any damage, the wavelength changing device according to the present invention has superior reflection efficiency for the fundamental waves. Also, a transmission loss for the fundamental waves can be lowered.

Also, the second object is achieved by the provision of a wavelength changing device, comprising;

a substrate made of a non-linear crystal, the substrate being polarized in a first direction;

an optical waveguide arranged in the substrate for transmitting fundamental waves from an incident side to an output side, the optical waveguide extending in a propagation direction perpendicular to the first direction;

a plurality of gratings periodically arranged on the optical waveguide at grating intervals in the propagation direction, the gratings being locally positioned in the neighborhood of the incident side of the optical waveguide, and a part of the fundamental waves which transmit through the optical waveguide being reflected by the gratings towards the incident side; and a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a remaining part of the fundamental waves changing to second harmonic waves in alternate rows of the inverted polarization layers and the non-inverted polarization layers.

In the above configuration, a part of the fundamental waves radiated to the optical waveguide are initially reflected by the gratings. Thereafter, the fundamental waves not reflected by the gratings are changed to the second harmonic waves in the alternate rows. Therefore, the gratings do not adversely influence on the second harmonic waves. That is, the second harmonic waves do not transmit through the substrate. Accordingly, the second harmonic waves can be efficiently output.

Also, the second object is achieved by the provision of a wavelength changing device, comprising;

a substrate made of a non-linear crystal, the substrate being polarized in a first direction;

an optical waveguide arranged in the substrate for transmitting fundamental waves, the optical waveguide extending in a propagation direction perpendicular to the first direction;

a plurality of gratings periodically arranged on the optical waveguide at grating intervals $\Lambda 1$ in the propagation direction, a ratio of a width of each of the gratings in the propagation direction to the grating intervals $\Lambda 1$ of the gratings is in a first range from 0.05 to 0.24 or in a second range from 0.76 to 0.95 on condition that an equation $\Lambda 1 = m*\lambda_f/(2N)$, m=2 where the symbol $\lambda_f$ is a wavelength of the fundamental waves and the symbol N is an effective refractive index of the optical waveguide, and a part of the fundamental waves being reflected by the gratings; and a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers.

In the above configuration, the regular interval of the gratings is set to satisfy the DBR condition expressed by the equation $m*\lambda/(2N)$, m=2. In this case, a radiation loss for the fundamental waves transmitting through the optical waveguid is generally increased. For example, when the ratio $W/\Lambda$ of the width W of each of the gratings to the regular intervals $\Lambda$ of the gratings is in the vicinity of 0.5, a large part of the fundamental waves are lost.

However, in cases where the ratio $W/\Lambda$ is in the first range from 0.05 to 0.24 or in the second range from 0.76 to 0.95, the loss of the fundamental waves is decreased, and a reflection efficiency of the gratings for the fundamental waves is increased. Therefore, the fundamental waves can be efficiently changed to the second harmonic waves in the alternate rows.

Also, the second object is achieved by the provision of a method for manufacturing a wavelength changing device, comprising the steps of:

preparing a substrate made of a non-linear crystal, the substrate being polarized in a first direction;

forming an optical waveguide in the substrate to transmit fundamental waves, the optical waveguide extending in a propagation direction perpendicular to the first direction of the substrate;

periodically arranging a plurality of inverted polarization layers in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers;

patterning a soft material on the optical waveguide to form a plurality of gratings periodically arranged at grating intervals in the propagation direction of the fundamental waves, the soft material having high workability, and a first refractive index of the gratings being equal to N1; and arranging a covering layer between the gratings to cover the gratings, a second refractive index of the covering layer being equal to N2 which differs from the first refractive index N1 of the gratings to form a refractive change in a periodic structure consisting of the covering layer and the gratings, and the fundamental waves which do not change to the second harmonic waves in the alternate rows being reflected in the periodic structure.

In the above steps, an optical waveguide is formed in an upper side of the substrate. Thereafter, a plurality of inverted polarization layers are periodically arranged in the substrate to cross the optical waveguide. Thereafter, a plurality of gratings and a cover layer are arranged on the optical waveguide to cross over the optical waveguide. In this case, the gratings are patterned on the optical waveguide in the same manner as in the diffracting device. Therefore, the optical waveguide is not damaged, and the gratings can be patterned at high uniformity.

The third object is achieved by the provision of a laser beam generating apparatus, comprising:

a semiconductor laser for radiating a beam of coherent light consisting of fundamental waves; and a diffracting device for fixing a wavelength of the coherent light radiated from the semiconductor laser, the diffracting device including (1) a substrate, (2) an optical waveguide arranged in the substrate for transmitting the coherent light radiated from the semiconductor laser from an incident side to an output side, (3) a plurality of gratings periodically arranged adjacent to the optical waveguide at grating intervals in a propagation direction of the coherent light transmitting through the optical waveguide, the gratings being made of a soft material which has high workability, and a first refractive index of the gratings being equal to N1, and (4) a covering layer arranged between the gratings for covering the gratings, a second refractive index of the covering layer being equal to N2 which differs from the first refractive index N1 of the gratings to form a refractive change in a periodic structure consisting of the covering layer and the gratings, a part of the coherent light being reflected by the periodic structure to the semiconductor laser to fix the wavelength of the coherent light radiated from the semiconductor laser, and the coherent light of which the wavelength is fixed being output from the output side of the optical waveguide.

When a driving current supplied to a semiconductor laser or an ambient temperature varies, a refractive index of material of the semiconductor laser also varies. As a result, the wavelength of coherent light radiated from the semiconductor laser generally changes. For example, a first driving current supplied to the semiconductor laser to read information stored in an optical disk greatly differs from a second driving current supplied to the semiconductor laser to write information in the optical disk. Therefore, a focal point of an objective lens utilized to converge the coherent light at the optical disk conventionally changes each time a reading operation and a writing operation are exchanged to each other. To avoid adverse influence of the change in the focal point, the adjustment of the focal point is conventionally required.

In the above configuration, because a part of coherent light radiated from the semiconductor laser is fed back to the semiconductor laser by the function of the diffracting device, the wavelength of the coherent light radiated from the semiconductor laser is fixed. Therefore, even though the driving current or the ambient temperature varies, the focal point does not change. Therefore, the exchange between the reading operation and the writing operation can be quickly performed without any adjustment of the focal point. Accordingly, lens material having a large wavelength dispersion coefficient can be utilized in the laser beam generating apparatus. Also, a lens having a large numerical aperture (NA) can be utilized.

Also, the third object is achieved by the provision of a laser beam generating apparatus, comprising:

a semiconductor laser for radiating a beam of coherent light consisting of fundamental waves; and a diffracting device for fixing a wavelength of the coherent light radiated from the semiconductor laser, the diffracting device including (1) a substrate made of a non-linear crystal, the substrate being polarized in a first direction, (2) an optical waveguide arranged in the substrate for transmitting the coherent light radiated from the semiconductor laser, the optical waveguide extending in a propagation direction perpendicular to the first direction from an incident side to an output side, (3) a plurality of inverted polarization layers periodically arranged in the substrate at grating intervals in the propagation direction to cross the optical waveguide, a polarization direction of the inverted polarization layers being opposite to the first direction of the substrate, and each of non-inverted polarization layers being arranged between the inverted polarization layers, (4) an electrode arranged on the optical waveguide, in which alternate rows of the inverted polarization layers and the non-inverted polarization layers are arranged, for inducing electric field which penetrates through the inverted polarization layers and the non-inverted polarization layers to change a first refractive index of the inverted polarization layers and to change a second refractive index of the non-inverted polarization layers, increase or decrease of the first refractive index being opposite to that of the second refractive index to produce a diffraction grating formed by periodic change of the first and second refractive indexes in the alternate rows, a pare of the coherent light being reflected in the diffraction grating to the semiconductor laser to fix the wavelength of the coherent light radiated from the semiconductor laser, and the coherent light of which the wavelength is fixed being output from the output side of the optical waveguide, and (5) an electric source for applying an electric potential to the electrode.

In the above configuration, because the diffraction gratings is formed in the diffracting device by applying the electric potential to the electrode, the wavelength of the coherent light radiated from the semiconductor laser is fixed. Therefore, even though a driving current supplied to the semiconductor laser or an ambient temperature varies, the coherent light having a fixed wavelength can be obtained in the laser beam generating apparatus.

Also, the third object is achieved by the provision of a laser beam generating apparatus, comprising:

a semiconductor laser for radiating a beam of fundamental waves; and a wavelength changing device for fixing a wavelength of the fundamental waves radiated from the semiconductor laser, the wavelength changing device including (1) a substrate made of a non-linear crystal, the substrate being polarized in a first direction, (2) an optical waveguide arranged in the substrate for transmitting the fundamental waves radiated from the semiconductor laser, the optical waveguide extending in a propagation direction perpendicular to the first direction from an incident side to an output side, (3) a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, and a part of the fundamental waves changing to second harmonic waves in alternate rows of the inverted polarization layers and the non-inverted polarization layers, (4) a dielectric film arranged on the optical waveguide for confining the second harmonic waves which spread outside the optical waveguide, the fundamental waves spreading outside the optical waveguide and the dielectric film, and (5) a plurality of gratings periodically arranged on the dielectric film at grating intervals in the propagation direction, the fundamental waves which spread outside the dielectric film being reflected by the gratings to the semiconductor laser to fix the wavelength of the fundamental waves radiated from the semiconductor laser, and the second harmonic waves of which the wavelength is fixed being output from the output side of the optical waveguide.

In the above configuration, the fundamental waves radiated from the semiconductor laser spread outside the optical waveguide and the dielectric film. Therefore, the fundamental waves are selectively reflected by the gratings to the semiconductor laser, and the wavelength of the fundamental waves radiated from the semiconductor laser are fixed. Therefore, even though a driving current supplied to the semiconductor laser or an ambient temperature varies, the coherent light having a fixed wavelength can be obtained in the laser beam generating apparatus.

In contrast, the second harmonic waves produced in the alternate rows do not spread outside the dielectric film. Therefore, the second harmonic waves transmitting through the optical waveguide are not reduced by the gratings. Accordingly, the second harmonic waves can be efficiently obtained.

Also, the third object is achieved by the provision of a laser beam generating apparatus, comprising:

a semiconductor laser for radiating a beam of coherent light consisting of fundamental waves; and a diffracting device for fixing a wavelength of the coherent light radiated from the semiconductor laser, the diffracting device including (1) a substrate, (2) an optical waveguide arranged in the substrate for transmitting the coherent light radiated from the semiconductor laser from an incident side to an output side, and (3) a plurality of gratings periodically arranged adjacent to the optical waveguide at regular intervals in a propagation direction of the coherent light transmitting through the optical waveguide, a ratio of a width of each of the gratings in the propagation direction to the regular intervals Λ of the gratings is in a first range from 0.05 to 0.24 or in a second range from 0.76 to 0.95 on condition that an equation Λ=m*λ/(2N), m=2 where the symbol λ is a wavelength of the coherent light and the symbol N is an effective refractive index of the optical waveguide, a part of the coherent light being reflected by the gratings to the semiconductor laser to fix the wavelength of the coherent light radiated from the semiconductor laser, and the coherent light of which the wavelength is fixed being output from the output side of the optical waveguide.

In the above configuration, because the ratio of the width of the gratings to the regular intervals Λ of the gratings is in the first range from 0.05 to 0.24 or in the second range from 0.76 to 0.95, the fundamental waves are efficiently reflected by the gratings to the semiconductor laser without being absorbed into the substrate even though the DBR condition Λ=m*λ/(2N), m=2 is satisfied. Therefore, the wavelength of the fundamental waves radiated from the semiconductor laser are fixed even though a driving current supplied to the semiconductor laser or an ambient temperature varies. Accordingly, the fundamental waves having a fixed wavelength can be obtained in the laser beam generating apparatus.

Also, the third object is achieved by the provision of a laser beam generating apparatus, comprising:

a semiconductor laser for radiating a beam of fundamental waves; and a wavelength changing device for fixing a wavelength of the fundamental waves radiated from the semiconductor laser, the wavelength changing device including (1) a substrate made of a non-linear crystal, the substrate being polarized in a first direction, (2) an optical waveguide arranged in the substrate for transmitting the fundamental waves radiated from the semiconductor laser, the optical waveguide extending in a propagation direction perpendicular to the first direction from an incident side to an output side, (3) a plurality of gratings periodically arranged on the optical waveguide at grating intervals in the propagation direction, the gratings being locally positioned in the neighborhood of the incident side of the optical waveguide, and a part of the fundamental waves which transmit through the optical waveguide being reflected by the gratings to the semiconductor laser to fix the wavelength of the fundamental waves radiated from the semiconductor laser, and (4) a plurality of inverted polarization layers periodically arranged in the substrate at phase-matching intervals in the propagation direction to cross the optical waveguide, a polarization direction of the inverted polarization layers being opposite to the first direction of the substrate, each of non-inverted polarization layers being arranged between the inverted polarization layers, a remaining part of the fundamental waves changing to second harmonic waves in alternate rows of the inverted polarization layers and the non-inverted polarization layers, and the second harmonic waves of which the wavelength is fixed being output from the output side of the optical waveguide.

In the above configuration, because the gratings are locally positioned in the neighborhood of the incident side of the optical waveguide, a part of the fundamental waves transmitting through the optical waveguide are reflected by the gratings to the semiconductor laser without reducing the intensity of the second harmonic waves. Therefore, the wavelength of the fundamental waves radiated from the semiconductor laser are fixed even though a driving current supplied to the semiconductor laser or an ambient temperature varies. Accordingly, the fundamental waves having a fixed wavelength can be obtained in the laser beam generating apparatus, and the second harmonic waves can be efficiently obtained.

Also, the third object is achieved by the provision of a laser beam generating apparatus, comprising:

a semiconductor laser having an active layer for radiating a beam of coherent light from the active layer; and a diffracting device for fixing a wavelength of the coherent light radiated from the semiconductor laser, the diffracting device including (1) a substrate, (2) an optical waveguide arranged in the substrate for transmitting the coherent light from an incident side to an output side, the optical waveguide having an incident taper region positioned in the neighborhood of the incident side, the active layer of the semiconductor laser being arranged closely to the incident taper region at the same height as the incident taper region, and the incident taper region being deeper than another region of the optical waveguide to receive the coherent light radiated from the active layer in the incident taper region, and (3) a plurality of gratings periodically arranged adjacent to the optical waveguide at grating intervals in a propagation direction of the coherent light transmitting through the optical waveguide, a part of the coherent light being reflected by the gratings to the semiconductor laser to fix the wavelength of the coherent light radiated from the semiconductor laser, and the coherent light of which the wavelength is fixed being output from the output side of the optical waveguide.

In the above configuration, because the active layer of the semiconductor laser is arranged closely to the incident taper region at the same height as the incident taper region, any optical system is not required to converge the coherent light at the optical waveguide. Therefore, the laser beam generating apparatus can be manufactured in a small size. Also, the coherent light can be efficiently radiated to the optical waveguide.

The fourth object is achieved by the provision of an optical information processing apparatus for reading or writing information from/in an information medium, comprising:

a semiconductor laser for radiating a beam of coherent light consisting of fundamental waves;

a diffracting device for fixing a wavelength of the coherent light radiated from the semiconductor Laser, the diffracting device including (1) a substrate, (2) an optical waveguide arranged in the substrate for transmitting the coherent light radiated from the semiconductor laser from an incident side to an output side, (3) a plurality of gratings periodically arranged adjacent to the optical waveguide at grating intervals in a propagation direction of the coherent light transmitting through the optical waveguide, the gratings being made of a soft material which has high workability, and a first refractive index of the gratings being equal to N1, and (4) a covering layer arranged between the gratings for covering the gratings, a second refractive index of the covering layer being equal to N2 which differs from the first refractive index N1 of the gratings to form a refractive change in a periodic structure consisting of the covering layer and the gratings, a part of the coherent light being reflected by the periodic structure to the semiconductor laser to fix the wavelength of the coherent light radiated from the semiconductor laser, and the coherent light of which the wavelength is fixed being output from the output side of the optical waveguide;

an optical system for converging the coherent light output from the output side of the optical waveguide at the information medium; and a detector for detecting intensity of the coherent light reflected by the information medium, the intensity of the coherent light detected depending on the information stored in the information medium.

In the above configuration, the wavelength of the coherent light radiated from the semiconductor laser is fixed because the coherent light is fed back to the semiconductor laser with the diffracting device. Thereafter, the coherent light having a fixed wavelength is converged at the information medium by the optical system, and the intensity of the coherent light is detected to read the information stored in the information medium.

Accordingly, because the wavelength of the coherent light is fixed even though an ambient temperature varies, a focal length of the optical system does not vary. Therefore, the information can be reliably read.

Also, even though a driving current supplied to the semiconductor laser varies, the wavelength of the coherent light is stably fixed. Therefore, even though a reading operation and a writing operation are exchanged to each other, the adjustment of the focal length is not required.

The fifth object is achieved by the provision of an integrated optical circuit, comprising:

a substrate;

an optical waveguide arranged in the substrate for transmitting coherent light from an incident side to an output side;

a semiconductor laser arranged closely to the incident side of the optical waveguide, a beam of the coherent light being directly radiated from the semiconductor laser to the optical waveguide;

a plurality of gratings periodically arranged adjacent to the optical waveguide at grating intervals in a propagation direction of the coherent light transmitting through the optical waveguide, a part of the coherent light being reflected by the gratings to be fed back to the semiconductor laser, and a wavelength of the coherent light radiated from the semiconductor laser being fixed; and a plurality of converging devices compactly arranged on the optical waveguide for converging the coherent light not reflected by the gratings at an information medium to read information stored in the information medium.

In the above configuration, a part of coherent light radiated from the semiconductor laser is reflected by the gratings to be fed back to the semiconductor laser. Therefore, the wavelength of the coherent light is fixed. Thereafter, the coherent light is converged by the converging devices at the information medium. In this case, the converging devices can be manufactured with material having a large wavelength dispersion coefficient because the wavelength of the coherent light is fixed. Therefore, the converging devices can be compactly arranged on the slab optical waveguide, so that the integrated optical circuit can be manufactured in a small size.

Also, the fifth object is achieved by the provision of an integrated optical circuit, comprising:

a semiconductor laser for radiating a beam of fundamental waves;

a substrate made of a non-linear crystal, the substrate being polarized in a first direction;

a first optical waveguide arranged in the substrate for transmitting the fundamental waves radiated from the semiconductor laser, the first optical waveguide extending in a propagation direction perpendicular to the first direction from an incident side to an output side;

a plurality of gratings periodically arranged adjacent to the first optical waveguide at grating intervals in the propagation direction, a part of the fundamental waves being reflected by the gratings towards the semiconductor laser to fix a wavelength of the fundamental waves radiated from the semiconductor laser, and the gratings being locally positioned in the neighborhood of the incident side of the first optical waveguide;

an electrode arranged on the first optical waveguide positioned in the neighborhood of the output side for inducing electric field which penetrates through the first optical waveguide to reduce a refractive index of the first optical waveguide;

a second optical waveguide arranged in parallel closely to the first optical waveguide for transmitting the fundamental waves transferred from the first optical waveguide according to an electro-magnetic coupling in cases where electric field is not induced in the first optical waves by the electrode; and a plurality of inverted polarization layers periodically arranged at phase-matching intervals in the propagation direction to cross the second optical waveguide, a polarization direction of the inverted polarization layers being opposite to the first direction of the substrate, each of non-inverted polarization layers being arranged between the inverted polarization layers, and the fundamental waves changing to second harmonic waves in alternate rows of the inverted polarization layers and the non-inverted polarization layers.

In the above configuration, a part of fundamental waves radiated from the semiconductor laser are reflected by the gratings to be fed back to the semiconductor laser. Therefore, the wavelength of the fundamental waves is fixed. Also, a remaining part of the fundamental waves transmit through the first optical waveguide on which the electrode is arranged.

In cases where no electric potential is applied to the electrode, the first and second optical waveguides are coupled to each other according to the electro-magnetic coupling. Therefore, the fundamental waves are transferred to the second optical waveguide and are changed to second harmonic waves in the alternate rows. Thereafter, the second harmonic waves are output.

In contrast, in cases where an electric potential is applied to the electrode, the refractive index of the first optical waveguide is reduced. Therefore, the fundamental waves cannot be transferred to the second optical waveguide. That is, no second harmonic wave is output.

Accordingly, when the electric potential applied to the electrode is modulated, the output power of the second harmonic waves is also modulated.

BRIEF DESCRIPTION OF THE DRAWINGS

The objects, features and advantages of the present invention will be apparent from the following description taken in conjunction with the accompanying drawings, in which:

FIG. 12 shows the comparison in optical characteristics between the diffracting device shown in FIG. 8 and samples 1, 2;

FIG. 21 shows influence of the positional relation between a wave reflecting region and a wavelength changing region on optical characteristics of a wavelength changing device shown in FIG. 20B;

DETAIL DESCRIPTION OF THE PREFERRED EMBODIMENTS

Preferred embodiments of a diffracting device according to the present invention are described with reference to drawings.

1. FIRST EMBODIMENT:

A first embodiment is described with reference to FIGS. 8 to 12.

Figure 8A:
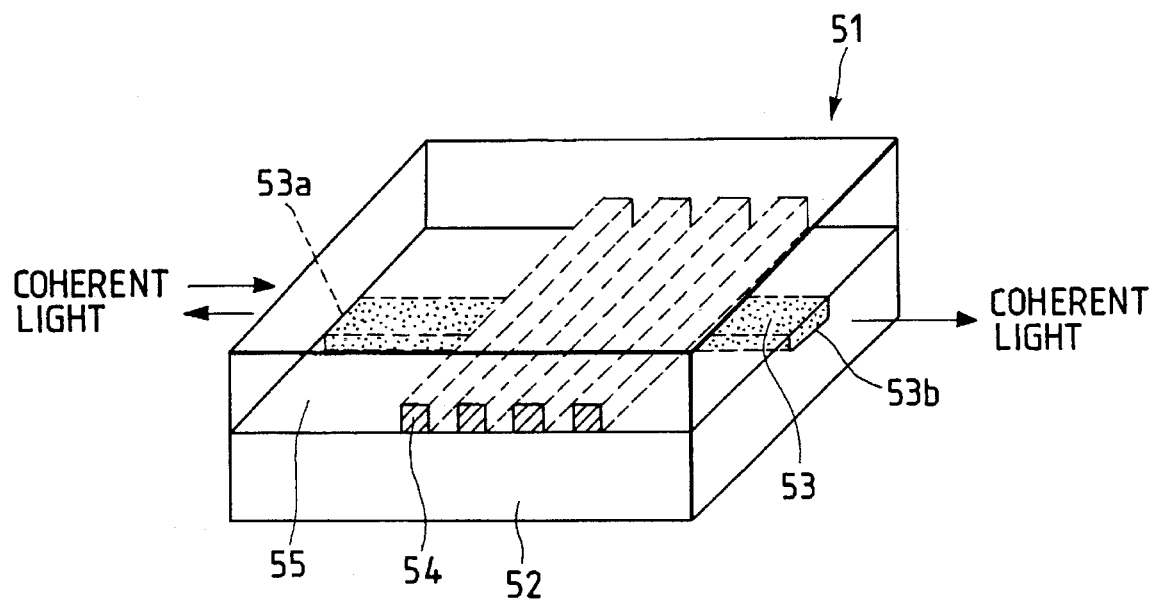
FIG. 8A is a diagonal perspective view of a diffracting device according to a first embodiment of the present invention.
Figure 8B:
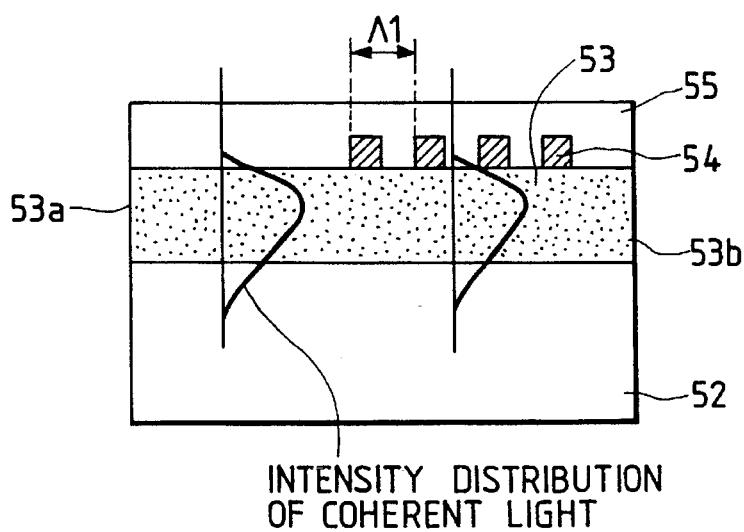
FIG. 8B is a cross-sectional view of the diffracting device shown in FIG. 8A to illustrate intensity distribution of coherent light transmitting through an optical waveguide.

FIG. 8A is a diagonal perspective view of a diffracting device according to a first embodiment of the present invention. FIG. 8B is a cross-sectional view of the diffracting device shown in FIG. 8A to illustrate intensity distribution of coherent light transmitting through an optical waveguide.

As shown in FIGS. 8A, 8B, a diffracting device 51 comprises a $LiTaO_3$ substrate 52, an optical waveguide 53 extending in a central upper side of the $LiTaO_3$ substrate 52 for transmitting coherent light consisting of 860 nm wavelength fundamental waves P1 from an incident end facet 53a to an output end facet 53b, a grating 54 composed of a series of grating elements periodically arranged on the $LiTaO_3$ substrate 52 at first regular intervals $\Lambda 1$ for reflecting the coherent light transmitting through the optical waveguide 53, and a covering layer 55 covering the grating 54 for protecting the gratings 54.

The $LiTaO_3$ substrate 52 is formed by cutting out $LiTaO_3$ crystal in a direction perpendicular to a Z-axis defined as [001]-direction in Miller indices. Therefore, the $LiTaO_3$ substrate 52 (or -Z plate) has an upper surface defined as (001)-plane in Miller indices.

The optical waveguide 53 is formed by exchanging a part of $Li^+$ ions of the $LiTaO_3$ substrate 52 for $H^+$ ions. Therefore, an effective refractive index of the optical waveguide 53 is slightly higher than that of the $LiTaO_3$ substrate 52 to confine a large part of the coherent light in the optical waveguide 53. A width of the optical guide 53 is 4 μm, and A depth of of the optical guide 53 is 2 μm.

The grating elements 54 are made of a photoresist material (manufactured by Shiply Ltd., and product No. AZ1400-17). Because the photoresist material is a radiation-sensitive compound and a soft material having high workability, the grating 54 can be minutely formed by exposing the photoresist material to exposing light and developing the photoresist material to remove exposed areas of the photoresist material. That is, the photoresist can be minutely patterned to form the grating 54 without being etched by reactive ions. An effective refractive index N1 of the grating 54 is equal to 1.5. Also, the grating elements 54 have the same size as one another, and the grating elements 54 cross over the optical waveguide 53 to reflect the coherent light distributed over the optical waveguide 53.

The covering layer 55 is made of $Ta_2O_5$ of which an effective refractive index N2 is equal to 2.0. Because the covering layer 55 is arranged between the grating elements 54, the change of the effective refractive index is generated in a periodic structure consisting of the grating 54 and the covering layer 55. Therefore, the periodic structure is equivalent to a diffraction grating, and the periodic structure functions as the distributed Bragg reflector on condition that the DBR condition is satisfied. Also, because a refractive difference in the effective refractive index between the grating 54 and the covering layer 55 is large, a reflection efficiency of the periodic structure for the coherent light becomes large. Therefore, the combination of the grating 54 made of the photoresist and the covering layer 55 made of $Ta_2O_5$ effectively functions as the diffraction grating.

As shown in FIG. 8B, the coherent light transmitting through the optical waveguide 53 is also distributed in the periodic structure and the substrate 52.

The reflection efficiency of the periodic structure is generally increased in proportional to the height of the grating 54 and the refractive difference in the effective refractive index. Also, because the grating order of the grating 54 is proportional to regular intervals $\Lambda 1$ of the grating elements 54, the reflection efficiency is inversely proportional to the regular intervals $\Lambda 1$ of the grating elements 55.

Next, a manufacturing method of the diffracting device 51 is described.

FIGS. 9A to 9D are diagonal views showing a manufacturing method of the diffracting device 51 shown in FIG. 8.

Figure 9A:
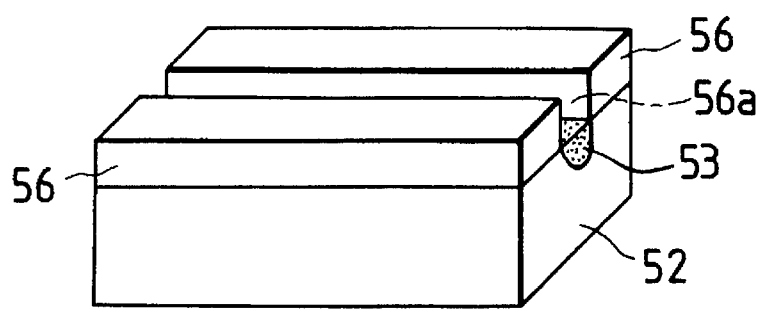
FIGS. 9A to 9D are diagonal views showing a manufacturing method of the diffracting device shown in FIG. 8A.

As shown in FIG. 9A, a Ta film 56 is deposited on the LiTaO$_3$ substrate 52 with a sputtering method, and a stripe hole 56a is formed on a central surface of the LiTaO$_3$ substrate 52 according to a photolithography process. The width of the stripe hole 56a is 4 μm, and the length of the stripe hole 56a is 5 mm. Thereafter, the LiTaO$_3$ substrate 52 is immersed in a pyrophosphoric acid (H$_4$P$_2$O$_7$) solution for fourteen minutes at a temperature of 260° C. to exchange a part of Li$^+$ ions of the LiTaO$_3$ substrate 52 not deposited by the Ta film 56 for H$^+$ ions, according to a proton-exchange process. Thereafter, the LiTaO$_3$ substrate 52 is annealed for sixty seconds at a temperature of 420° C. to form the optical waveguide 53 having a superior transmission efficiency. Thereafter, the Ta film 56 is taken away. The width of the optical waveguide 53 is 4 μm, and the depth is 2 μm. A guided wave loss of the optical waveguide 53 for the coherent light is only 1.0 dB/cm. Thereafter, both end facets of the optical waveguide 53 are optically polished to form the incident end facet 53a and the output end facet 53b.

Figure 9B:
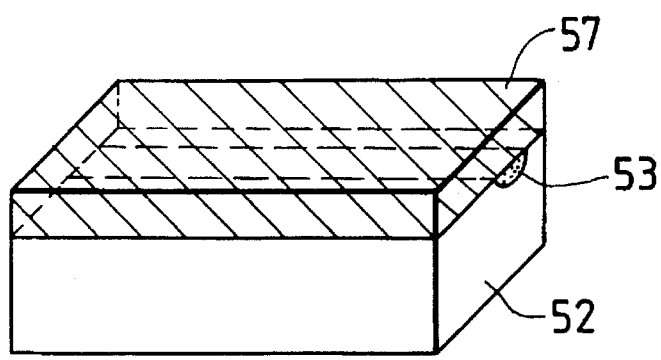
Figure 9C:
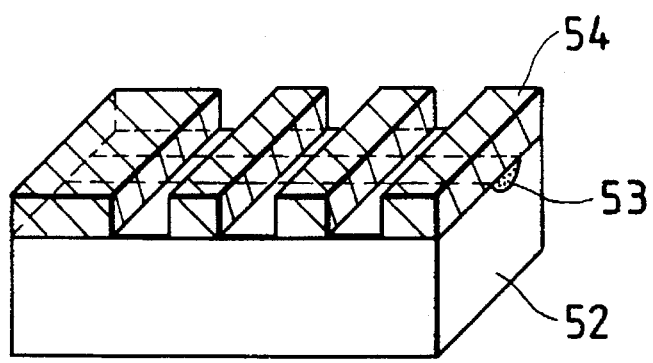

Thereafter, as shown in FIG. 9B, diluted photoresist 57 (AZ1400-17) is coated over the LiTaO$_3$ substrate 52 and the optical waveguide 53. The thickness of the photoresist 57 coated is 0.2 μm. Thereafter, grating pattern areas of the photoresist 57 are exposed to 0.4416 nm wavelength light radiated from He-Cd laser according to an interference-exposure process to transfer a grating pattern to the photoresist 57. Therefore, the photoresist 57 exposed becomes soluble in a developer solution. Thereafter, the photoresist 57 is immersed in the developer solution to develop the photoresist 57. Therefore, the grating patterned areas of the photoresist 57 exposed are removed. Therefore, photoresist portions formed in the grating pattern are arranged on the optical waveguide 53. Thereafter, the photoresist portions are cured so that the grating elements 54 crossing over the optical waveguide 53 are formed, as shown in FIG. 9C. The regular intervals Λ1 of the grating elements 54 periodically arranged are set to 0.4 μm, a grating height is set to 0.2 μm, a ratio of the grating width W1 to the regular intervals Λ1 is set to 0.23, and a total length of the grating 54 in a propagation direction of the coherent light is set to 5 mm.

Figure 9D:
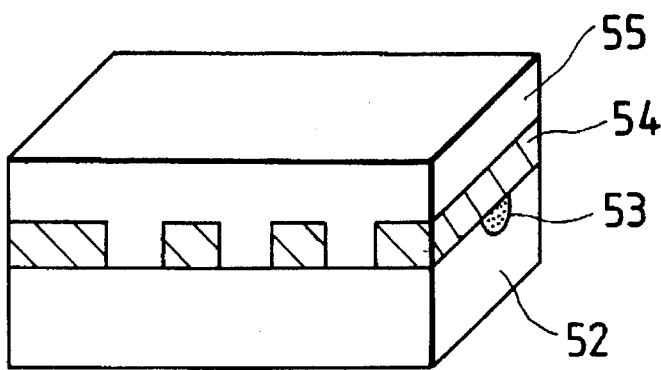

Thereafter, as shown in FIG. 9D, Ta$_2$O$_5$ is deposited over the grating 54 with a sputtering method to form the covering layer 55. The height of the covering Layer 55 deposited on the grating 54 is 0.3 μm in thickness. Therefore, the covering layer 55 protects the grating 54 from the atmosphere.

Next, characteristic estimation results of the diffracting device 51 are described.

Figure 10:
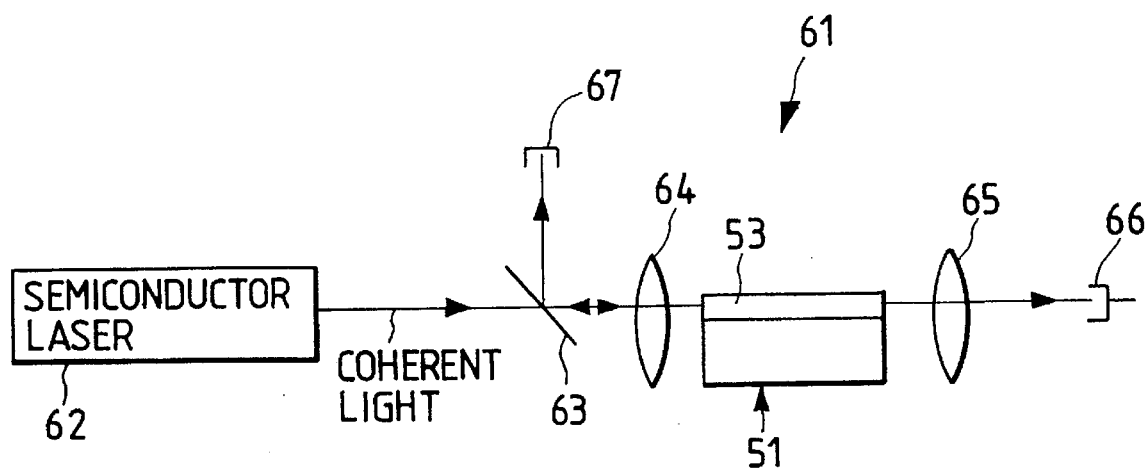
FIG. 10 is a constitutional view of an optical system for measuring optical characteristics of the diffracting device shown in FIG. 8A.

To estimate optical characteristics of the diffracting device 51, an optical system 61 is prepared as shown in FIG. 10. The optical system 61 comprises a Ti—Al$_2$O$_3$ laser 62 for radiating coherent light of which the wavelength is variable, a half mirror 63 for dividing the coherent light, an optically converging system 64 for converging the coherent light at the incident end facet 53a of the diffracting device 51, the diffracting device 51, a collimator lens 65 for collimating the coherent light which transmits through the optical waveguide 53 without being reflected by the grating 54, a transmitting light detector 66 for detecting the intensity of the coherent light transmitting through the optical waveguide 53, and a reflected light detector 67 for detecting the intensity of the coherent light reflected by the grating 54.

In the above configuration, coherent light radiated from the Ti—Al$_2$O$_3$ laser 62 transmits through the half mirror 63 and is converged at the incident end facet 53a of the optical wave guide 53 by the optically converging system 64. Thereafter, the coherent light transmits through the optical waveguide 53. In this case, because a part of coherent light is distributed in the covering layer 55 as shown in FIG. 8B, the part of coherent light is reflected by the grating 54. Therefore, the coherent light reflected is returned to the incident end facet 53a of the optical waveguide 53 and transmits through the optically converging system 64. Thereafter, the reflected coherent light is divided by the half mirror (53 and is detected by the reflected light detector 67. In contrast, the coherent light not reflected by the grating 54 is radiated from the output end facet 53b of the optical waveguide 53 and is collimated by the collimator lens 66. Thereafter, the coherent light not reflected (called transmitting coherent light) is detected by the transmitting light detector 66.

When the wavelength of the coherent light radiated from the Ti—Al$_2$O$_3$ laser 62 agrees with a distributed Bragg reflector wavelength (called DBR wavelength hereinafter), the intensity of the reflected coherent light is remarkably increased. The DBR wavelength λ is determined by the regular intervals Λ1 of the gratings 54 and an effective refractive index N (=2.15) of the optical waveguide 53. That is, a DBR condition is designated by an equation λ=(Λ1*2N)/m. Here the symbol m (=2) denotes a grating number.

Figure 11:
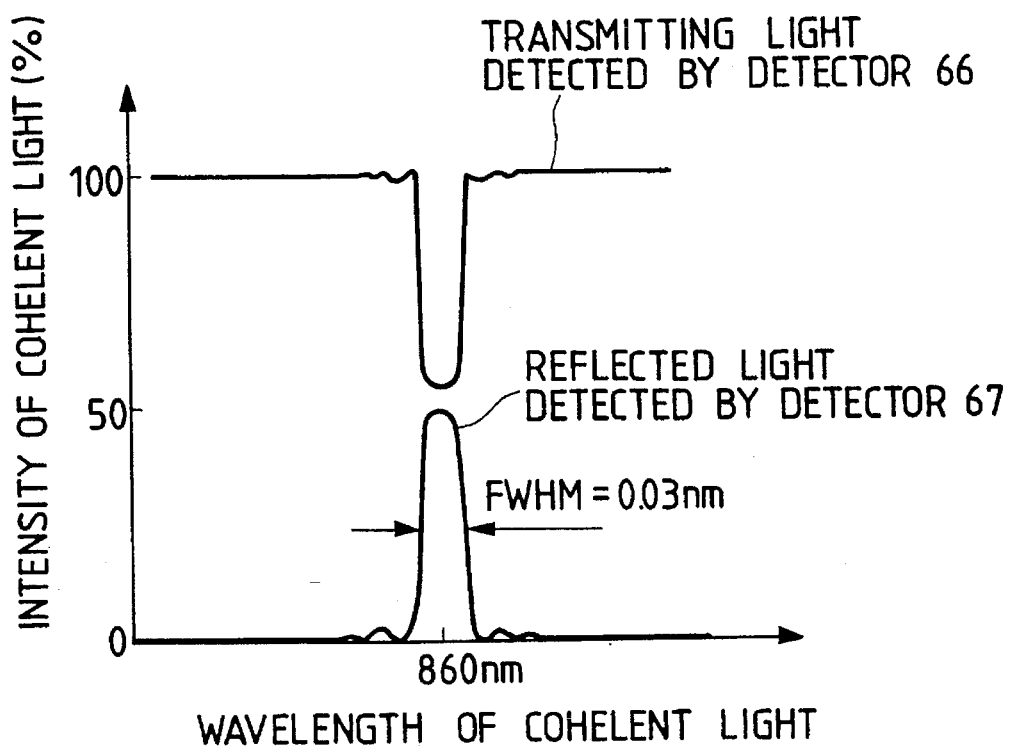
FIG. 11 shows a relationship between the intensity of reflected coherent light and the wavelength of the coherent light and another relationship between the intensity of transmitting coherent light and the wavelength of the coherent light, those relationships being measured with the optical system shown in FIG. 10.

FIG. 11 shows a relationship between the intensity of the reflected coherent light and the wavelength of the coherent light and another relationship between the intensity of the transmitting coherent light and the wavelength of the coherent light.

As shown in FIG. 11, the DBR wavelength is 860 nm, and a diffraction efficiency (or a reflection efficiency) for the coherent light is about 50%. Here the diffraction efficiency is defined as an intensity ratio of the reflected coherent light detected by the reflected light detector 67 to the coherent light coupled to the optical waveguide 53. Because a theoretical value of the diffraction efficiency is 60%, the experimental value 50% of the diffraction efficiency is high and superior to that obtained in a conventional diffracting device. The reason why the experimental value is superior is as follows. The grating 53 is formed by developing the photoresist 57 without being etched so that the optical waveguide 53 is not damaged by any reactive ions. Also, because the grating 54 having a superior uniformity is formed by exposing the photoresist 57 to the 0.4416 nm wavelength light according to the interference-exposure process, the grating 54 can be formed in superior uniformity in size.

Also, a full width at half maximum (FWHM) indicating the dependence of the reflected coherent light on the wavelength is only 0.03 nm. Because the full width at half maximum of the reflected coherent light also indicates the uniformity in the shape of the grating 54, the small value of the full width at half maximum proves that the grating 54 is formed in superior uniformity.

Next, a comparison in optical characteristics between diffracting devices manufactured by conventional methods and the diffracting device 51 is described.

Figure 1:
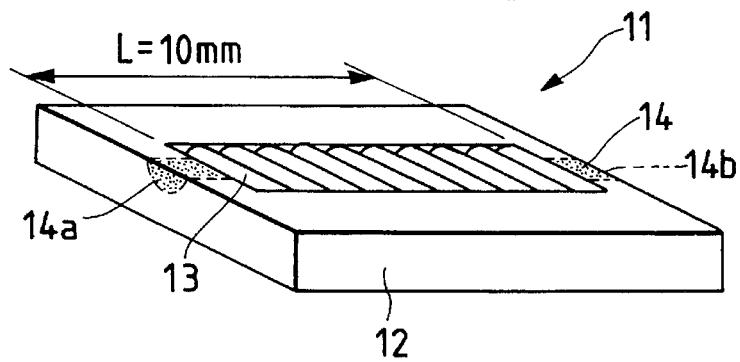
FIG. 1 is a diagonal view of a conventional diffracting device having a distributed Bragg reflector.
Figure 2A:
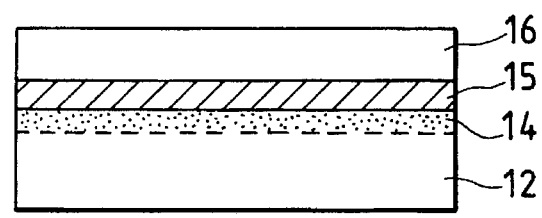
FIGS. 2A to 2D are cross-sectional views of the diffracting device shown in FIG. 1, showing a manufacturing method of the diffracting device.
Figure 2B:
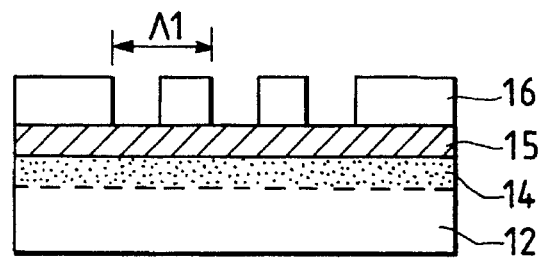
Figure 2C:
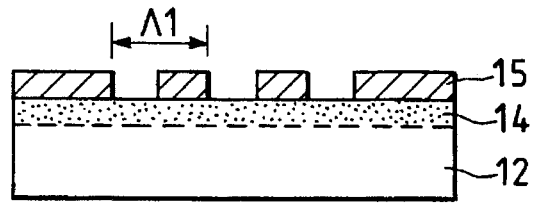
Figure 2D:
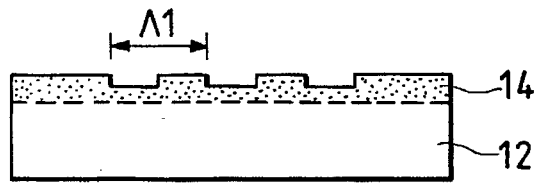
Figure 3:
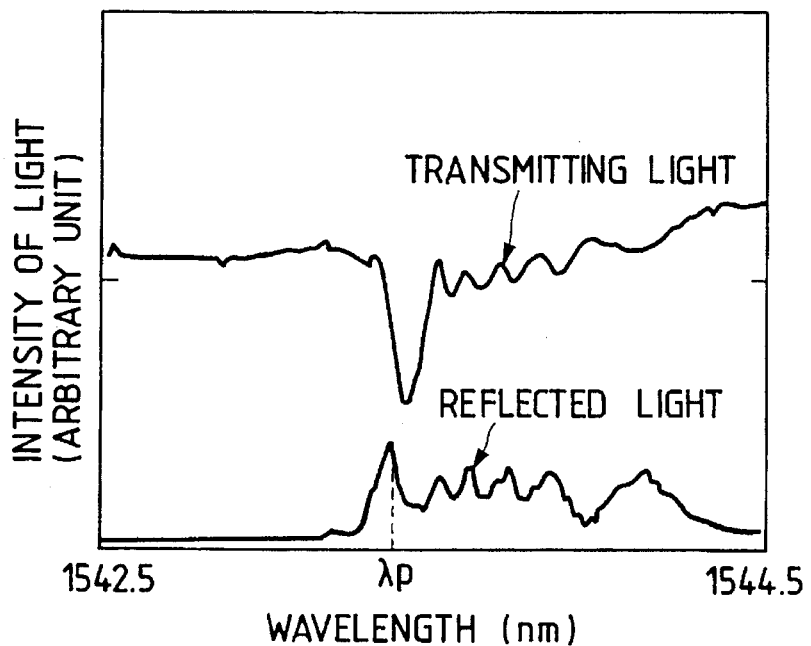
FIG. 3 graphically shows transmitting and reflecting characteristics of the diffracting device shown in FIG. 1.
Figure 4:
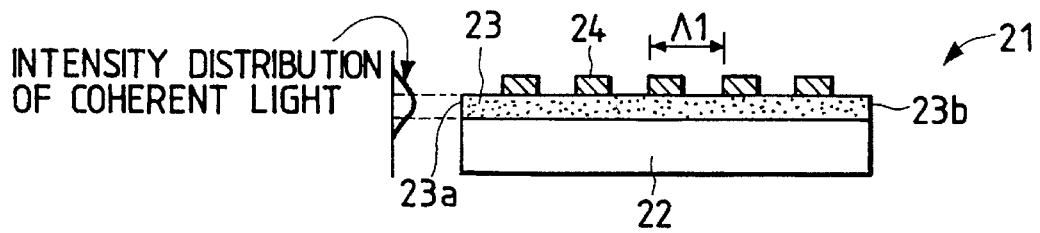
FIG. 4 is a cross-sectional view of another conventional diffracting device.
Figure 5:
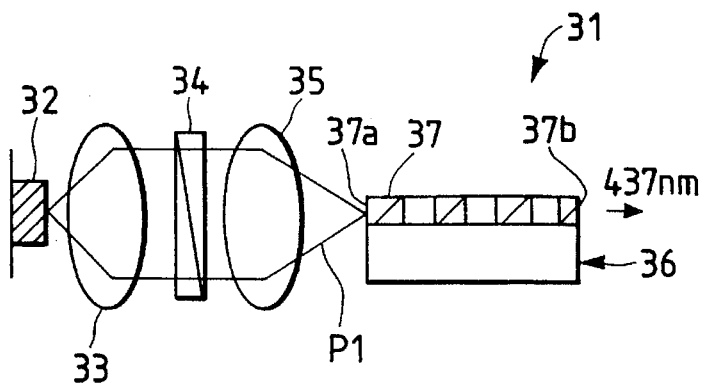
FIG. 5 is a constitutional view of a conventional shorter wavelength laser beam generating apparatus.
Figure 6:
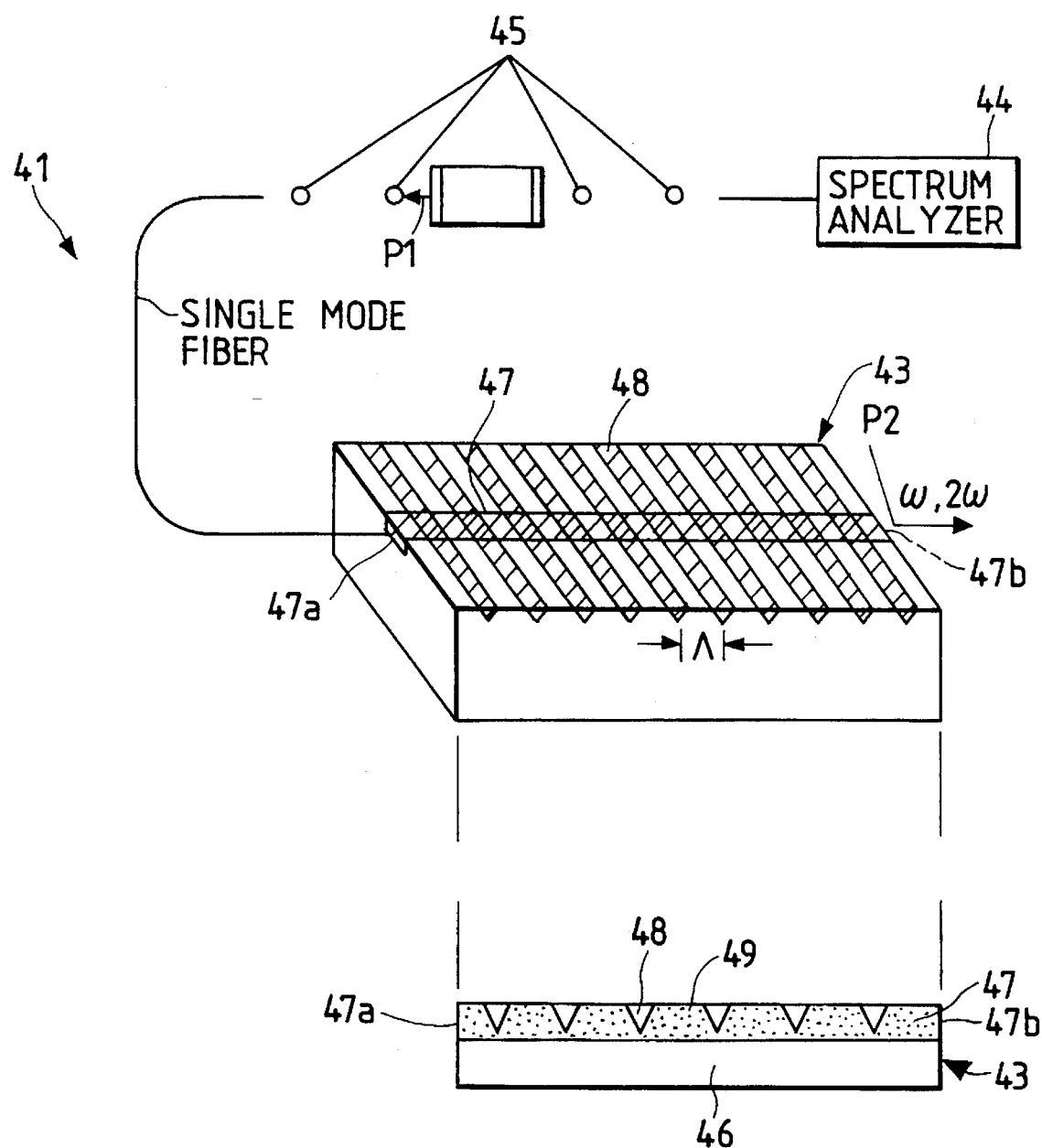
FIG. 6 is a constitutional view of another conventional shorter wavelength laser beam generating apparatus in which a conventional wavelength changing device of Shinozaki is arranged.
Figure 7:
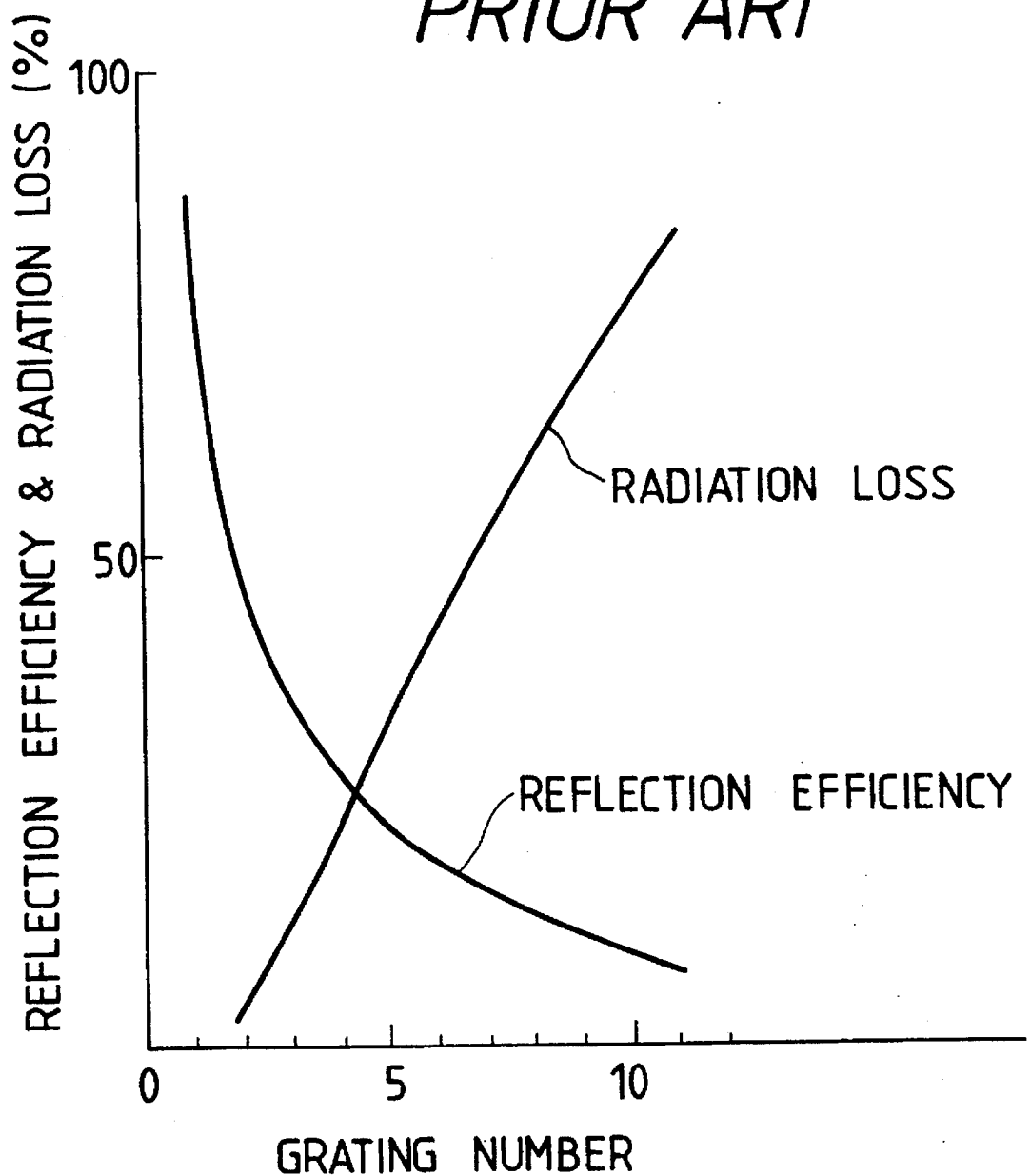
FIG. 7 graphically shows a relationship between a reflection efficiency of fundamental waves and the grating order substantially formed in the wavelength changing device shown in FIG. 6 and another relationship between a radiating loss of the fundamental waves and the grating order.

A sample 1 equivalent to the conventional diffracting device 11 shown in FIG. 1 is prepared, and a sample 2 equivalent to the conventional diffracting device 21 shown in FIG. 4 is prepared.

A manufacturing method of the sample 1 is as follows. After the Ta film 56 shown in FIG. 9A is taken away, the optical waveguide 53 is directly etched by reactive ions according to a dry etching method, and a plurality of grating elements are formed in the optical waveguide 53 to manufacture a first conventional diffracting device (sample 1). Regular intervals of the grating elements are 0.4 μm, and the depth is 0.1 μm. A manufacturing method of the sample 2 is as follows. After the Ta film 56 shown in FIG. 9A is taken away, $Ta_2O_5$ is deposited on the optical waveguide 58 and the $LiTaO_3$ substrate 52 with a sputtering method. The thickness of a $Ta_2O_5$ film deposited is 0.1 μm. Thereafter, a resist is coated on the $Ta_2O_5$ film with a thickness of 0.2 μm, and the resist is exposed to 0.4416 nm wavelength light radiated from a He—Cd laser according to an interference-exposure process to form a grating pattern in the resist. Thereafter, the resist exposed is developed and formed in the grating pattern. Thereafter, the $Ta_2O_5$ film is etched by reactive ions through the patterned resist functioning as a mask in a dry-etching apparatus, so that a plurality of grating elements formed of the $Ta_2O_5$ film etched are arranged on the optical waveguide 53. Regular intervals of the grating elements are 0.4 μm, arid the depth is 0.1 μm.

FIG. 12 shows the comparison in optical characteristics between the diffracting device 51 and the samples 1, 2.

To manufacture the sample 1, complicated processes which are performed with two superimposed masks shown in FIGS. 2A to 2D are required. Therefore, the uniformity in the shape of the grating elements is inferior. Also, because the reactive ions are injected into the optical waveguide to etch the optical waveguide, the surface of the optical waveguide becomes rough. Therefore, a guided wave loss of the coherent light transmitting through the optical waveguide is increased. As a result, a reflection efficiency (or a diffraction efficiency) of the conventional diffracting device (sample 1) is decreased to 5%, and a transmission efficiency of the conventional diffracting device (sample 1) is are decreased to 10%. Accordingly, the sample 1 is not useful for practical use.

Also, to manufacture the sample 2, the $Ta_2O_5$ film is etched by the reactive ions. Therefore, the surface of the optical waveguide is damaged by the reactive ions. As a result, a guided wave loss of the coherent light transmitting through the optical waveguide is increased, and the optical characteristics of the conventional diffracting device (sample 2) deteriorates.

In contrast, because the photoresist 57 is not etched by any reactive ion in the diffracting device 51, the optical waveguide 53 is not damaged by any reactive ion. Therefore, a scattering loss of the coherent light is lowered so that a guided wave loss of the coherent light is lowered to 1 dB/cm. Also, because the covering layer 55 is deposited to cover the grating 54 to protect the gratings 54 from the atmosphere, the grating elements 54 are not degraded. Therefore, a reflection efficiency of the diffracting device 51 can be stably maintained with high degree.

In addition, any complicated processes performed with two superimposed masks are not required to manufacture the diffracting device 51, the grating 54 can be reliably formed in the same size, and the regular intervals Λ1 of the grating elements 54 are the same.

Also, in cases where the coating of the diluted photoresist 57 is thickened, the grating 54 can be deeply formed by sufficiently exposing the photoresist 57 to the 0.4416 nm wavelength light. Therefore, a theoretical diffraction efficiency is increased, and an actual diffraction efficiency can be enhanced.

Accordingly, because the grating elements 54 made of the photoresist 57 are deeply formed with high accuracy without damaging the optical waveguide B3 in the diffracting device 51, the lowered guided wave loss and the high reflection efficiency for the coherent light transmitting through the optical waveguide 53 can be obtained in the diffracting device 51.

Also, because the refractive index of the grating 54 is sufficiently small as compared with that of the covering layer 55, the grating order can be decreased. In other words, the number of grating elements 54 arranged in a regular length can be increased by decreasing the regular intervals Λ1 of the grating elements 54. Therefore, the reflection efficiency can be increased.

In the first embodiment, the photoresist 57 made of AZ1400-17 manufactured by Shiply Ltd. is utilized as the material of the grating 54. However, the material of the grating 54 is not limited to AZ1400-17. That is, any photoresist is applicable on condition that the refractive index of the photoresist is sufficiently small as compared with that of the covering layer 55.

Also, a burning type metallic oxide film is appliable in place of the photoresist 57. Specifically, a burned $SiO_2$ film obtained by burning $SiO_2$ is useful because an etching rate of the burned $SiO_2$ film is large. That is, a deep shape of grating can be easily formed by etching the burned $SiO_2$ film through a resist functioning as a mask.

Also, the position of the grating 54 is not limited on the optical waveguide 53. That is, the grating 54 adjacent to the optical waveguide 53 is useful as the distributed Bragg reflector. For example, the grating 54 positioned under the optical waveguide 53 or the grating 54 positioned at a side of the optical waveguide 53 is useful.

Also, the covering layer 55 is made of $Ta_2O_5$ in the first embodiment because the effective refractive index of $Ta_2O_5$ is so large and because a transmitting loss of the coherent light is low in $Ta_2O_5$. However, the material of the covering layer 55 is not limited to $Ta_2O_5$. That is, a material having an effective refractive index differing from that of the grating 54 is applicable on condition that a transmitting loss for the coherent light is low. For example, $TiO_2$ and SiN can be applied in place of $Ta_2O_5$. Specifically, in cases where a material of which the effective refractive index is over 1.8 is utilized as the covering layer 55, the diffraction efficiency of the diffracting device 51 can be enhanced.

Also, the $LiTaO_3$ substrate 52 has the upper surface indicated by the (001)-plane. However, a $LiTaO_3$ substrate having an upper surface indicated by a (100)-plane or a (010) plane can be applied.

2. SECOND EMBODIMENT:

A second embodiment is described with reference to FIGS. 13A, 13B.

Figure 13A:
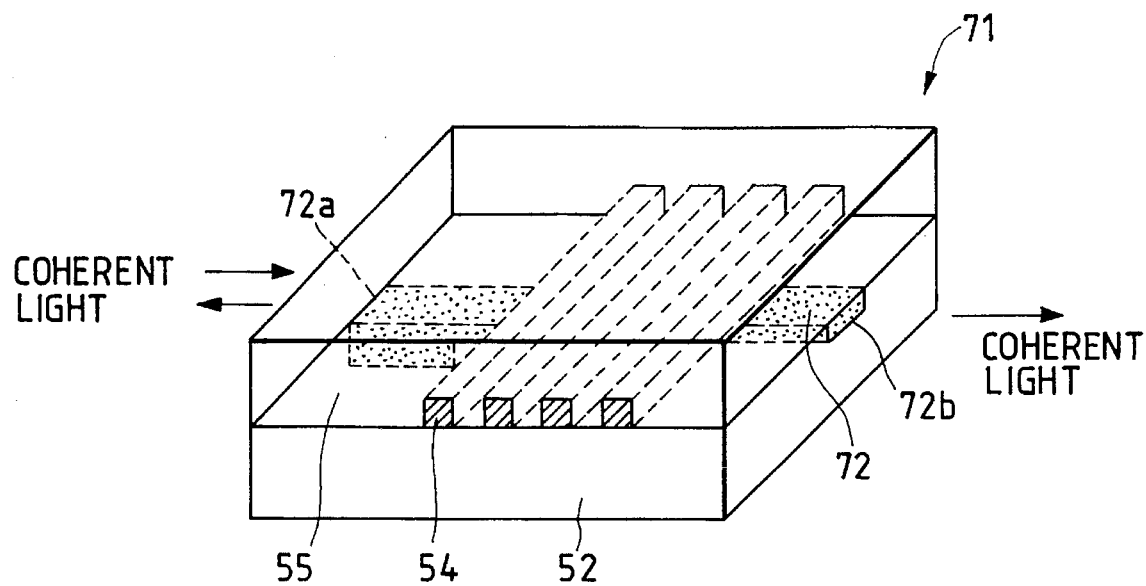
FIG. 13A is a diagonal perspective view of a diffracting device according to a second embodiment of the present invention.
Figure 13B:
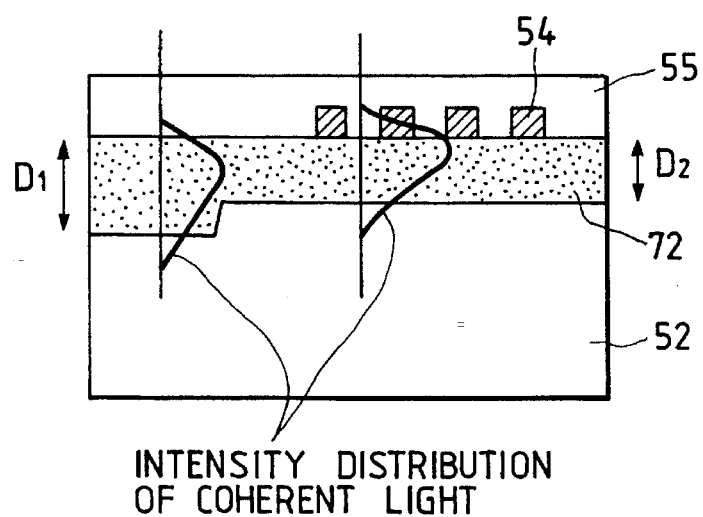
FIG. 13B is a cross-sectional view of the diffracting device shown in FIG. 13A to illustrate intensity distribution of coherent light transmitting through an optical waveguide.

FIG. 13A is a diagonal perspective view of a diffracting device according to a second embodiment of the present invention. FIG. 13B is a cross-sectional view of the diffracting device shown in FIG. 13A to illustrate intensity distribution of coherent light transmitting through an optical waveguide.

As shown in FIG. 13A, a diffracting device 71 comprises the $LiTaO_3$ substrate 52, an optical waveguide 72 extending in a central upper side of the $LiTaO_3$ substrate 52 for transmitting coherent light consisting of 860 nm wavelength fundamental waves P1 from an incident end facet 72a to an output end facet 72b, the grating elements 54 periodically arranged on the $LiTaO_3$ substrate 52 for reflecting the coherent light transmitting through the optical waveguide 72, and the covering layer 55.

The optical waveguide 72 is formed according to the proton-exchange process in the same manner as in the optical waveguide 53. Also, as shown in FIG. 13B, a depth D1 of the optical waveguide 72 positioned in the neighborhood of the incident end facet 72a (a non-reflecting region) is larger than a depth D2 of the optical waveguide 72 positioned in the neighborhood of the output end facet 72b (a reflecting region) on which the grating elements 54 are periodically arranged at the regular intervals Λ1. Therefore, the intensity distribution of the coherent light shifts towards the periodic structure consisting of the grating 54 and the covering layer 55 at the reflecting region (the depth D2) of the optical waveguide 72, as compared with that at the non-reflecting region (the depth D1) of the optical waveguide 72.

The reflection efficiency of the periodic structure is generally proportional to the overlapping degree of the distributed coherent light and the periodic structure. In the diffracting device 71, because the depth D2 of the optical waveguide 72 is narrowed at the reflecting region, the overlapping degree is increased at the reflecting region. Therefore, the reflection efficiency for the coherent light is enhanced.

The optical characteristics of the diffracting device 71 are described with reference to FIG. 12.

The depth D2 of the optical waveguide 72 is 2 μm, the width of the optical waveguide 72 is 4 μm, the regular intervals Λ1 of the grating elements 54 is 0.4 μm, and the height (or the depth) of the grating 54 is 0.2 μm, in the same manner as in the first embodiment. Also, the depth D1 of the optical waveguide 72 is 1.8 μm. In this case, the reflection efficiency is 60%, the transmission efficiency is 20%, the guided wave loss is 2 db/cm, and the full width at half maximum (FWHM) is 0.05 nm. Therefore, the reflection efficiency is enhanced as compared with in the first embodiment. In contrast, the guided wave loss is slightly increased because the optical waveguide 72 is narrowed.

In the second embodiment, the position of the grating 54 is not limited on the optical waveguide 53. That is, the grating 54 adjacent to the optical waveguide 72 is useful as the distributed Bragg reflector. In this case, a cross-sectional area of the optical waveguide 72 in the reflecting region is smaller than that in the non-reflecting region to increase the overlapping degree between the distributed coherent light and the periodic structure.

Next, a modification of the second embodiment is described with reference to FIG. 14.

Figure 14A:
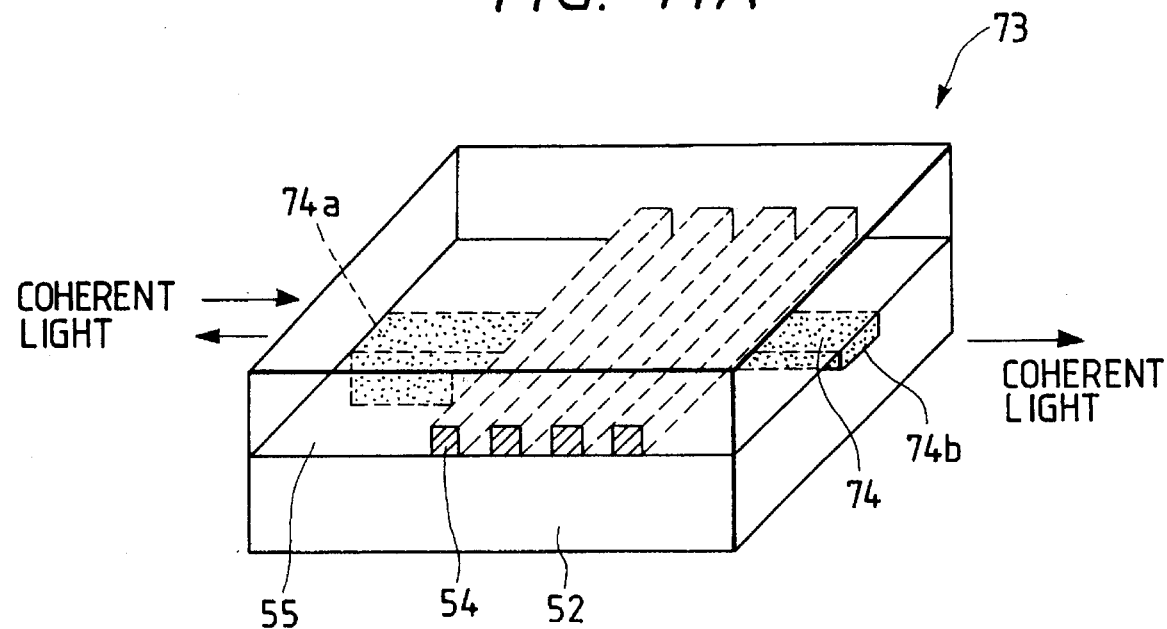
FIG. 14A is a diagonal perspective view of a diffracting device according to a modification of the second embodiment.
Figure 14B:
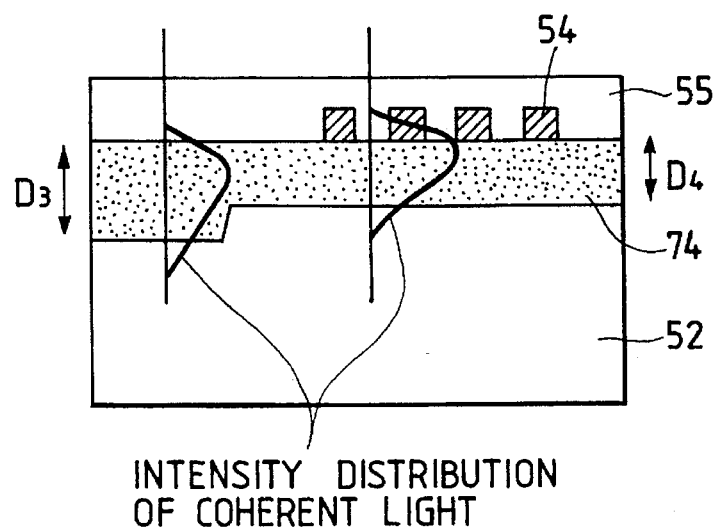
FIG. 14B is a cross-sectional view of the diffracting device shown in FIG. 14A to illustrate intensity distribution of coherent light transmitting through an optical waveguide.

FIG. 14A is a diagonal perspective view of a diffracting device according to a modification of the second embodiment. FIG. 14B is a cross-sectional view of the diffracting device shown in FIG. 14A to illustrate intensity distribution of coherent light transmitting through an optical waveguide.

As shown in FIGS. 14A, B, a diffracting device 73 comprises the LiTaO$_3$ substrate 52, an optical waveguide 74 extending in a central upper side of the LiTaO$_3$ substrate 52 for transmitting coherent light consisting of 860 nm wavelength fundamental waves P1 from an incident end facet 74a to an output end facet 74b, and the covering layer 55.

A plurality of grooves are digged on the surface of the optical waveguide 74 to form a plurality of grating elements 74c periodically arranged in a propagation direction of the coherent light. A depth D3 of the optical waveguide 74 positioned at a non-reflecting region adjacent to the incident end facet 74a is larger than a depth D4 of the optical waveguide 74 positioned at a reflecting region on which the grating elements 74c are periodically arranged. Therefore, the intensity distribution of the coherent light is shifted towards the periodic structure consisting of the grating elements 74c and the covering layer 55 at the reflecting region of the optical waveguide 74, as compared with that at the non-reflecting region of the optical waveguide 74.

Next, a manufacturing method of the diffracting device 73 is described.

The optical waveguide 74 is initially formed in the upper side of the substrate 52 in a step shape according to the proton-exchange process in the same manner as in the first embodiment. The depth D3 of the optical waveguide 74 is 2.4 μm, and the depth D4 of the optical waveguide 74 is 2.2 μm. Thereafter, a thin Ti film is deposited on the substrate 52 and the optical waveguide 74. Thereafter, a photoresist is spin coated on the Ti film. Thereafter, the photoresist is exposed to interference light according to an interference-exposure process, and the photoresist is developed to remove exposed areas of the photoresist. Therefore, a periodic grating pattern is transferred to the photoresist. Thereafter, the Ti film is periodically etched at regular intervals Λ1=0.4 μm by reactive ions generated in an atmosphere of CCl$_2$F$_2$ gas according to a reactive ion etching to transfer the periodic grating pattern of the photoresist to the Ti film. Thereafter, the patterned film is used as a mask, and the optical waveguide 74 is etched by reactive ions generated in an atmosphere of CF$_4$ according to the reactive ion etching. Therefore, the grating elements 74c are periodically formed. The height of the grating elements 74c is 0.1 μm, and the regular intervals Λ1 of the grating elements 74c is 0.4 μm. Thereafter, both end facets 74a, 74b of the optical waveguide 74 are polished. Finally, Ta$_2$O$_5$ is deposited on the optical waveguide 74 and the substrate 52 at the thickness of 0.3 μm to form the covering layer 55.

Because the refractive index of Ta$_2$O$_5$ is 2.0 which is near to that of the optical waveguide 74, a roughed surface of the optical waveguide 74 is uniformed by the deposition of Ta$_2$O$_5$. Therefore, a scattering loss of the coherent light is extremely reduced. Also, even though the thickness of the optical waveguide 74 is thinned by the ion etching, the guided wave loss of the coherent light is not increased because the depth of the optical waveguide 74 is deeper than that of the optical waveguide 72.

The optical characteristics of the diffracting device 73 are described with reference to FIG. 12.

The reflection efficiency is increased to 70%, the transmission efficiency is decreased to 5%, and the guided wave loss is maintained at 2 db/cm. is 0.05 nm, as compared with in the diffracting device 71.

The position of the grating 54 is not limited on the optical waveguide 72. That is, the grating 54 positioned at peripheries of the optical waveguide 72 is useful as the distributed Bragg reflector. For example, the grating 54 positioned under the optical waveguide 72 or the grating 54 positioned at a side of the optical waveguide 72 is useful.

3. THIRD EMBODIMENT:

A third embodiment is described with reference to FIG. 15.

Figure 15:
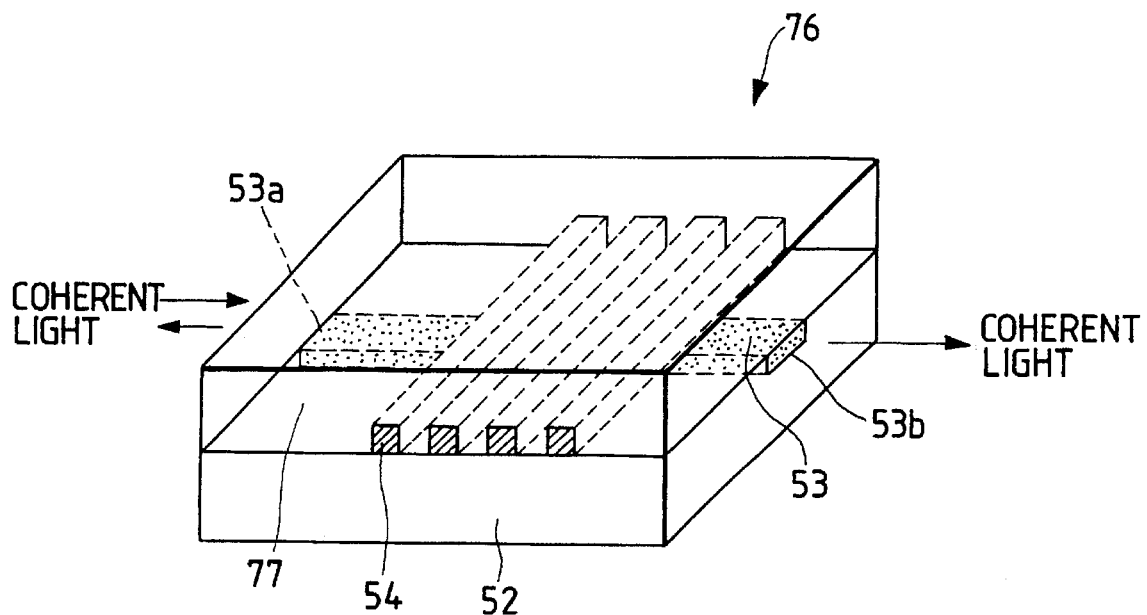
FIG. 15 is a diagonal perspective view of a wavelength changing device according to a third embodiment of the present invention.

FIG. 15 is a diagonal perspective view of a wavelength changing device according to a third embodiment of the present invention.

As shown in FIG. 15, a diffracting device 76 comprises the LiTaO$_3$ substrate 52, the optical waveguide 53, the grating 54, and a covering layer 77 covering the gratings 54 for protecting the grating 54.

The covering layer 77 is made of burning type metallic oxide such as TiO$_2$. In detail, metallic oxide such as TiO$_2$ is held in solution in a solvent. Thereafter, the metallic oxide held in solution is coated on the LiTaO$_3$ substrate 52 and the optical waveguide 53, and the metallic oxide coated is heated at a temperature of 200° to 500° C. Therefore, the solvent is vaporized, and a burned metallic oxide film is formed as the covering layer 77.

Because any vacuum system including a sputtering apparatus is not required to form the burned metallic oxide film as the covering layer 77, the diffracting device 76 can be easily manufactured.

In cases where the grating 54 is matte of burned $SiO_2$, the total length of the grating 54 in the propagation direction is 1 mm, and the periodic structure is equivalent to a first grating order (m=1), the reflection efficiency is 25 %.

4. FOURTH EMBODIMENT:

A fourth embodiment is described with reference to FIGS. 16 to 19.

Figure 16A:
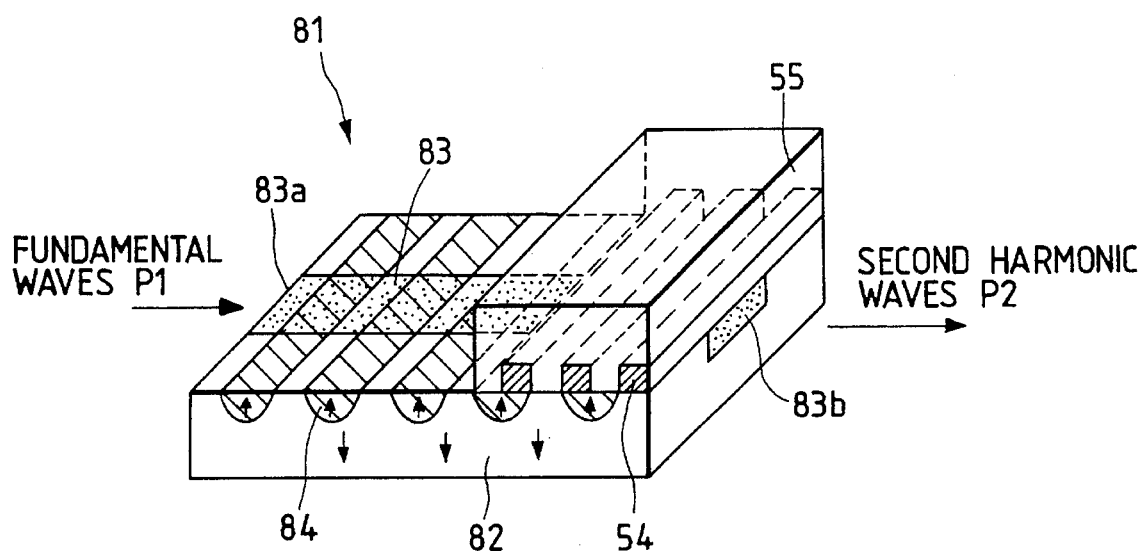
FIG. 16A is a diagonal perspective view of a wavelength changing device according to a fourth embodiment of the present invention.
Figure 16B:
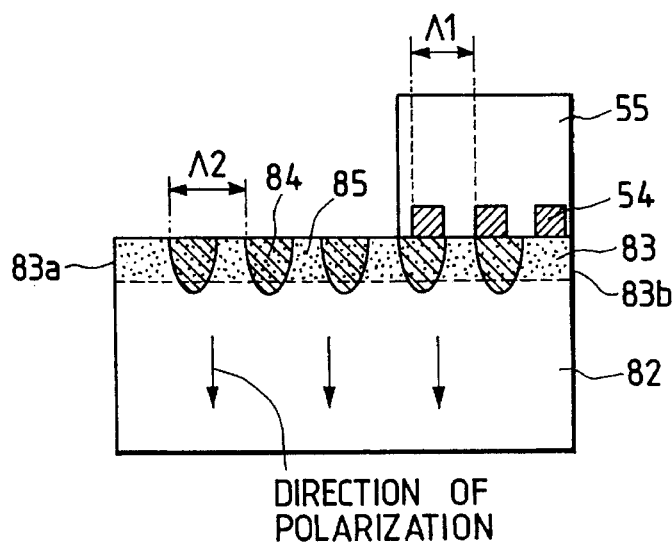
FIG. 16B is a cross-sectional view of the wavelength changing device shown in FIG. 16A.

FIG. 16A is a diagonal perspective view of a wavelength changing device according to a fourth embodiment of the present invention. FIG. 16B is a cross-sectional view of the wavelength changing device shown in FIG. 16A.

As shown in FIG. 16A, a wavelength changing device 81 comprises a substrate 82 made of non-linear optical crystal $LiTaO_3$ which is dielectrically polarized in a lower direction, an optical waveguide 83 extending in a central upper side of the substrate 82 for transmitting coherent light consisting of 860 nm wavelength fundamental waves Pi from an incident end facet 83a to an output end facet 83b, a plurality of inverted-polarization layers 84 arranged in an upper side of the substrate 82 at second regular intervals $\Lambda 2$ to cross the optical waveguide 83, the grating elements 54 periodically arranged on the optical waveguide 83 at the first regular intervals $\Lambda 1$, and the covering layer 55.

The grating elements 54 are positioned in the neighborhood of the output end facet 83b.

The substrate 82 is formed by cutting out $LiTaO_3$ crystal in a direction perpendicular to a Z-axis defined as [001]-direction in Miller indices. Therefore, the $LiTaO_3$ substrate 82 (or -Z plate) has an upper surface defined as (001)-plane in Miller indices.

The optical waveguide 83 is formed at a depth of 2 μm by exchanging a part of $Li^+$ ions of the substrate 82 for $H^+$ ions. Therefore, an effective refractive index of the optical waveguide 83 is slightly higher than that of the substrate 82 to confine large parts of the fundamental waves P1 in the optical waveguide 83. A width of the optical waveguide 83 is 4 μm.

The inverted-polarization layers 84 dielectrically polarized in an upper direction is formed by heating the surface of the substrate 82 at a temperature of about 1050° C. after the surface of the substrate 82 is shield by a patterned mask according to a lift-off process. Each of non-inverted polarization layers 85 is positioned between the inverted polarization layers 84 as shown in FIG. 16B.

Figure 17:
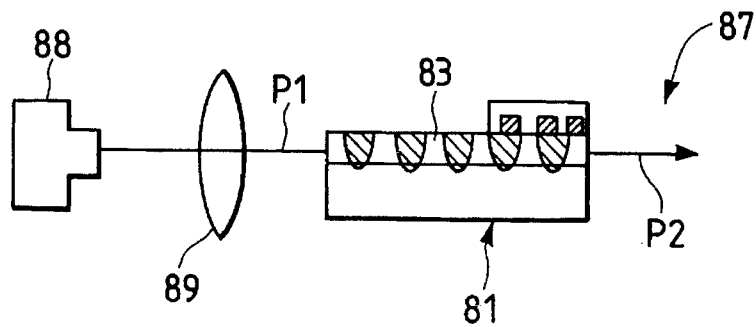
FIG. 17 is a constitutional view of an optical system for examining optical characteristics of the wavelength changing device shown in FIG. 16A.

FIG. 17 is a constitutional view of an optical system for examining optical characteristics of the wavelength changing device 81.

As shown in FIG. 17, an optical system 87 is provided with a semiconductor laser 88 for radiating fundamental waves P1 of which the wavelength is variable, a converging system 89 for converging the fundamental waves P1, and the wavelength changing device 81.

In the above configuration, fundamental waves P1 radiated from the semiconductor laser 88 are converged at the incident end facet 83a of the optical waveguide 83 by the converging system 89, and the fundamental waves P1 transmits through alternate rows of the inverted-polarization and non-inverted polarization layers 84, 85. At this time, the fundamental waves P1 are changed to second harmonic waves P2 of which a wavelength $\lambda_h$ is half of a wavelength $\lambda_f$ of the fundamental waves P1 in the inverted-polarization layer 84. Thereafter, the phase of the second harmonic waves P2 is inverted while transmitting through the inverted-polarization layer 84. Thereafter, the second harmonic waves P2 transmit through the non-inverted polarization layer 85. In this case, because the polarization direction of the non-inverted polarization layer 85 is opposite to the inverted-polarization layer 84, the second harmonic waves P2 transmitting through the non-inverted polarization layer 85 are amplified without attenuating. Therefore, a part of the fundamental waves P1 are changed to the second harmonic waves P2, and the second harmonic waves P2 are amplified in the optical waveguide 83 on condition that the quasi-phase condition indicated by the equation $\Lambda 2=\lambda_f/\{2*(N2\omega-N\omega)\}$ is satisfied there the symbol $N2\omega$ is a refractive index of the optical waveguide 83 for the second harmonic waves P2 and the symbol $N\omega$ is a refractive index of the optical waveguide 83 for the fundamental waves P1. In cases where the wavelength $\lambda_f$ of the fundamental waves P1 is 860 nm, the quasi-phase condition is satisfied. Thereafter, the second harmonic waves P2 are radiated from the output end facet 83b of the optical waveguide 83. Accordingly, when the pumping power of the fundamental waves P1 radiated from the semiconductor laser 88 is 70 mW to couple the fundamental waves P1 to the optical waveguide 83 at a power of 42 mW (or a coupling efficiency is 60%), the intensity of the second harmonic waves P2 radiated from the wavelength changing device 81 is 3 mW.

In contrast, the fundamental waves P1 not changed to the second harmonic waves P2 are reflected in the periodic structure consisting of the grating 54 and the covering layer 55 in the same manner as in the first embodiment. That is, in cases where the wavelength $\lambda_f$ of the fundamental waves P1 is 860 nm, the periodic structure functions as the distributed Bragg reflector because the DBR condition $\Lambda 1=m\lambda_f/2N$ (m=2) is satisfied. Thereafter, the fundamental waves P1 reflected is radiated from the incident end facet 83a and is fed back to the semiconductor laser 88. Therefore, the wavelength $\lambda_f$ of the fundamental waves P1 is fixed to 860 nm even though an ambient temperature or an injecting current to the semiconductor laser 88 fluctuates. Also, even though the fundamental waves P1 reflected at the incident end facet 83a of the optical waveguide 83 is fed back to the semiconductor laser 88, the wavelength $\lambda_f$ of the fundamental waves P1 is fixed to 860 nm. Accordingly, the intensity of the second harmonic waves P2 obtained in the wavelength changing device 81 can be stabilized regardless of the fluctuation of the ambient temperature or the injecting current to the semiconductor laser 88.

The stabilization of the intensity of the second harmonic waves P2 is measured with the optical system 87.

Figure 18:
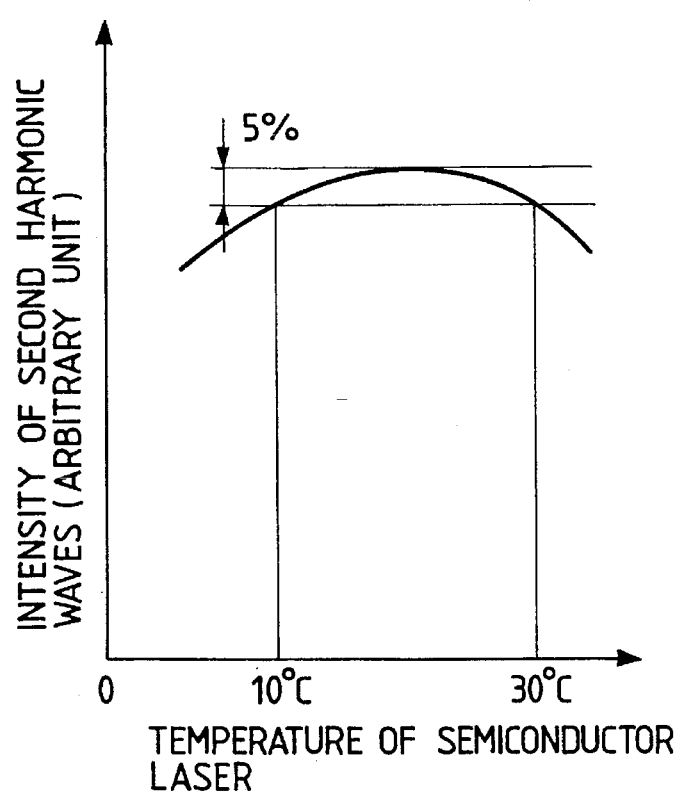
FIGS. 18, 19 graphically show the relation between the intensity of second harmonic waves P2 and a temperature of a semiconductor laser shown in FIG. 17, depending on the ambient temperature.

FIG. 18 graphically shows the relation between the intensity of the second harmonic waves P2 and a temperature of the semiconductor laser 88 depending on the ambient temperature.

As shown in FIG. 18, even though a temperature of the semiconductor laser 88 is changed in a range from 10° to 30° C., the fluctuation of the intensity of the second harmonic waves P2 is restrained within 5% of a maximum intensity.

Accordingly, because the grating elements 54 are uniformly formed without any damage caused by reactive ions to reflect the fundamental waves P1 not changed to the second harmonic waves P2 at high reflection efficiency and at low guided wave loss in the periodic structure consisting of the grating 54 and the cover layer 55, the second harmonic waves P2 can be stably obtained in the wavelength changing device 81 regardless of the fluctuation of the ambient temperature or the injecting current to the semiconductor laser 88.

Also, because the satisfaction of the quasi-phase condition $\Lambda 2=\lambda_f/\{2*(N2\omega-N\omega)\}$ is achieved regardless of the satisfaction of the DBR condition $\Lambda 1=m\lambda_f/2N$, the wavelength $\lambda_f$ of the fundamental waves P1 can be arbitrarily selected. In other words, the wavelength $\lambda_h(=\lambda_f/2)$ of the second harmonic waves P2 can be arbitrarily selected.

Next, a modification of the fourth embodiment is described.

The depth of the optical waveguide 83 is shallowed to 1.8 μm to increase the overlapping of the fundamental waves P1 and the periodic structure consisting of the grating 54 and the cover layer 55. In this case, as is described in the second embodiment, the reflection efficient (or the diffraction efficient) in the wavelength changing device 81 is enhanced.

Figure 19:
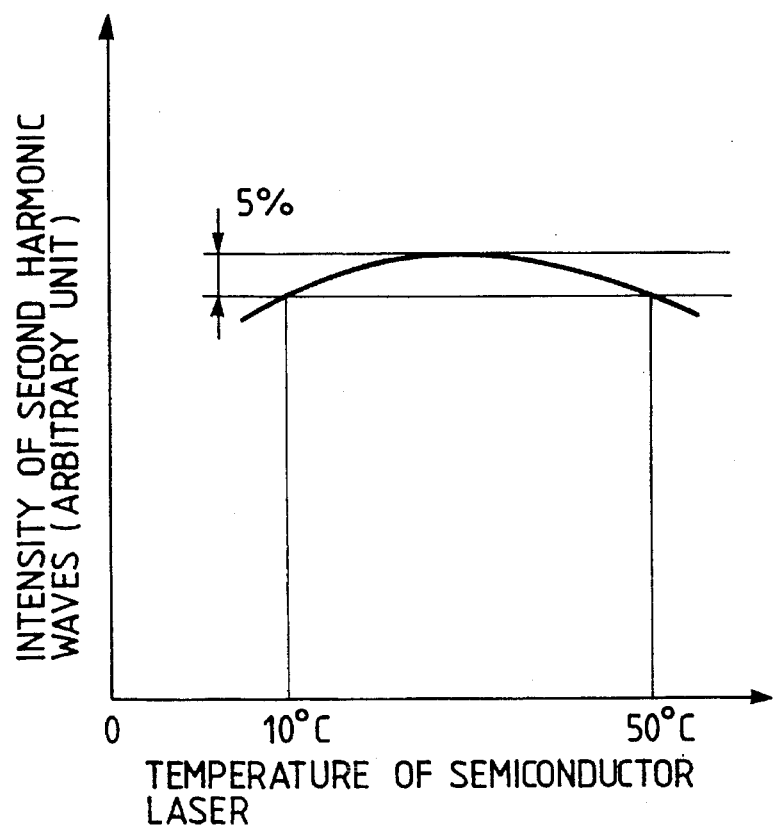

The stabilization of the intensity of the second harmonic waves P2 measured with the optical system 87 is shown in FIG. 19. As shown in FIG. 19, even though a temperature of the semiconductor laser 88 is changed in a wide range from 10° to 50° C., the fluctuation of the intensity of the second harmonic waves P2 is restrained within 5% of a maximum intensity.

Accordingly, because the intensity of the 860 nm wavelength fundamental waves P1 fed back to the semiconductor laser 88 is increased, the wavelength of the fundamental waves P1 radiated from the semiconductor laser 88 can be reliably fixed even though the temperature of the semiconductor laser 88 fluctuates in a wide range from 10° to 50° C. As a result, the range in which the second harmonic waves P2 is stably obtained in the wavelength changing device 81 can be widened. In contrast, the intensity of the second harmonic waves P2 is slightly decreased.

In the fourth embodiment, the substrate 82 is made of pure LiTaO₃ material. However, the material of the substrate 82 is not limited to the pure LiTaO₃ material. That is, it is applicable that LiTaO₃ material doped with MgO, Nb, Nd, or the like be utilized to make the substrate 82. Also, it is applicable that LiNbO₃ material be utilized to make the substrate 82. In addition, because KTiOPO₄ is a highly non-linear optical crystal material, it is preferred that KTiOPO₄ be utilized to make the substrate 82. In this case, because a refractive index of KTiOPO₄ is a small value of about 1.7, the fundamental waves P1 can be reflected at high efficiency by the periodic structure consisting of the grating 54 and the cover layer 55.

Also, the optical waveguide 83 is formed according to the proton-exchange process. However, it is applicable that the optical waveguide 83 be formed by diffusing Ti or Nb into the substrate 82. Also, it is applicable that the optical waveguide 83 be formed by injecting ions such as Ti, Nb or the like into the substrate 82.

5. FIFTH EMBODIMENT:

A fifth embodiment is described with reference to FIGS. 20 to 21.

Figure 20A:
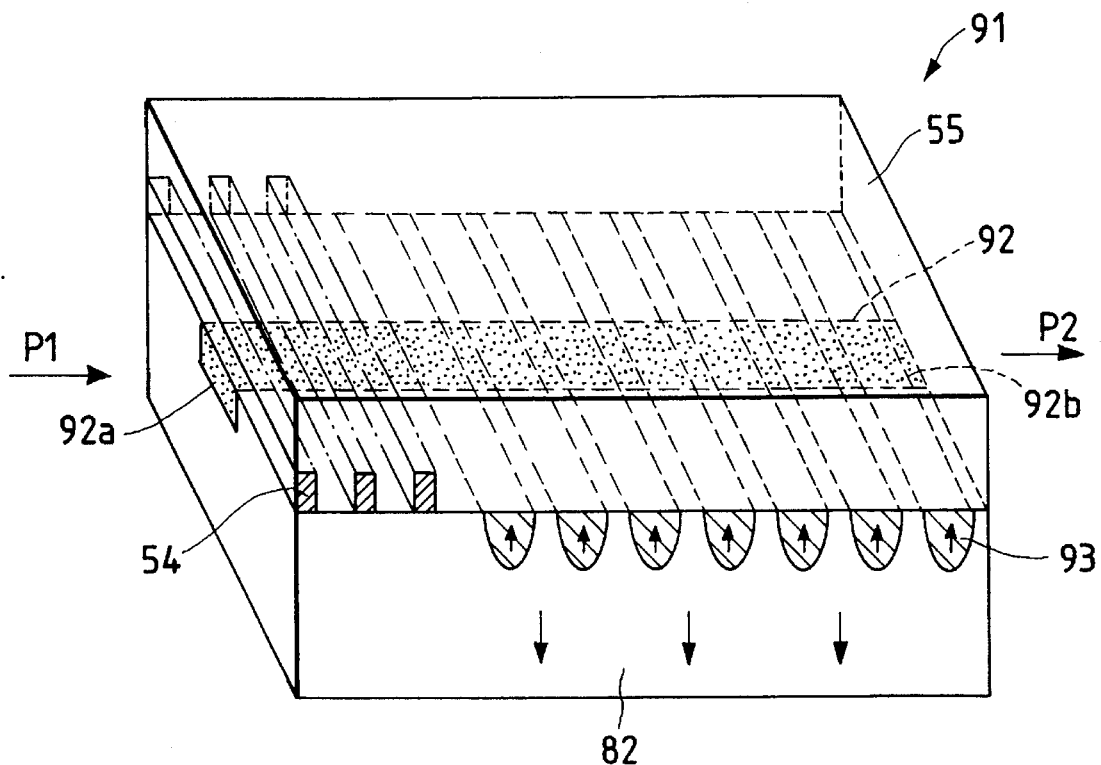
FIG. 20A is a diagonal perspective view of a wavelength changing device according to a fifth embodiment of the present invention.
Figure 20B:
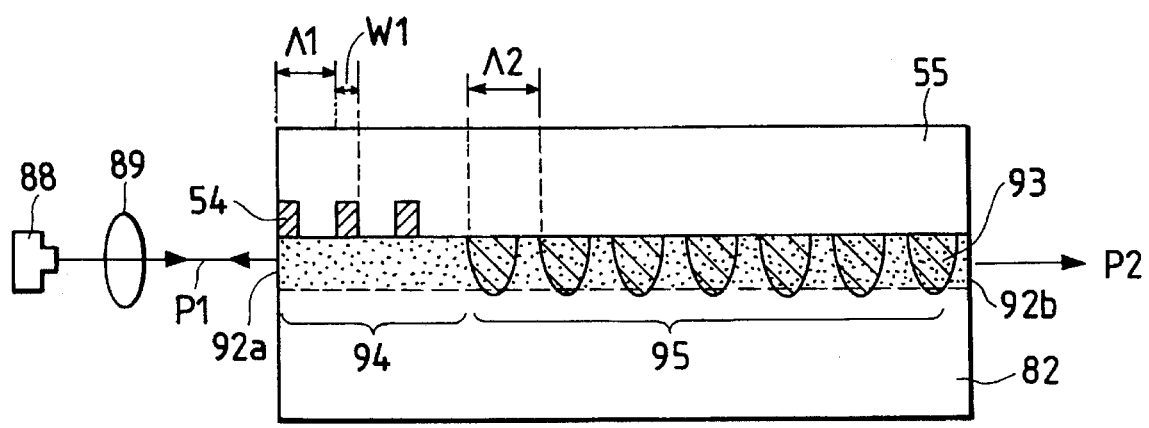
FIG. 20B is a cross-sectional view of the wavelength changing device shown in FIG. 20A.

FIG. 20A is a diagonal perspective view of a wavelength changing device according to a fifth embodiment of the present invention. FIG. 20B is a cross-sectional view of the wavelength changing device shown in FIG. 20A.

As shown in FIG. 20A, a wavelength changing device 91 comprises the LiTaO₃ substrate 82, an optical waveguide 92 extending in a central upper side of the substrate 82 for transmitting coherent light consisting of 860 nm wavelength fundamental waves P1 from an incident end facet 92a to an output end facet 92b, a plurality of inverted-polarization layers 93 arranged in an upper side of the substrate 82 at second regular intervals $\Lambda 2$ to cross the optical waveguide 92, the grating elements 54 periodically arranged on the optical waveguide 92 which is positioned in the neighborhood of the incident end facet 92a (called a wave reflecting region 94), and the covering layer 55.

The optical waveguide 92 is formed at a depth of 2 μm by exchanging a part of Li⁺ ions of the substrate 82 for H⁺ ions. Therefore, an effective refractive index of the optical waveguide 92 is slightly higher than that of the substrate 82 to confine large parts of the fundamental waves P1 in the optical waveguide 92. A width of the optical waveguide 92 is 4 μm.

The inverted-polarization layers 98 dielectrically polarized in an upper direction is formed in the same manner as the inverted-polarization layers 84. The inverted-polarization layers 93 is not arranged in the neighborhood of the incident end facet 92a but arranged in the neighborhood of the output end facet 92b (called a wavelength changing region 95). Each of non-inverted polarization layers 96 is positioned between the inverted polarization layers 93 as shown in FIG. 20B.

A total length of a series of grating elements 54 in a propagation direction of the fundamental waves P1 is 1 mm, and the periodic structure of the grating 54 and the covering layer 55 is formed in a first grating order of the DBR periodic structure. That is, $\Lambda 1=\lambda_f/(2N)$ iS satisfied. Here the symbol $\Lambda 1$ (=0.2 μm) is regular intervals of the grating elements 54, the wavelength $\lambda_f$ of the fundamental waves is 860 nm, and the symbol N (=2.15) is an effective refractive index of the optical waveguide 92.

In the above configuration, fundamental waves P1 radiated from the semiconductor laser 88 shown in FIG. 17 are converged at the incident end facet 92a of the optical waveguide 92 and transmits through the wave reflecting region 94. In this case, a first radiation mode for the fundamental waves P1 is generated in the wave reflecting region 94. Therefore, the fundamental waves P1 are reflected by the periodic structure consisting of the grating 54 and the covering layer 55 without changing the fundamental waves P1 to second harmonic waves P2. Thereafter, the fundamental waves P1 not reflected are changed to the second harmonic waves P2 in the wavelength changing region 95. At this time, because no distributed Bragg reflector is provided in the wavelength changing region 95, any radiation mode for the fundamental waves P1 is not generated. Therefore, the fundamental waves P1 are not reflected any more. Thereafter, the second harmonic waves P2 is radiated from the output end facet 92b of the optical waveguide 92.

The first radiation mode for the fundamental waves P1 generated in the wave reflecting region 94 is equivalent to a second radiation mode for second harmonic waves P2 because the wavelength $\lambda_h$ of the second harmonic waves P2 is half of that of the fundamental waves P1. Therefore, in cases where the second harmonic waves P2 exist, the second harmonic waves P2 couple to a first radiation mode for the second harmonic waves P2. Therefore, the second harmonic waves P2 are led into the substrate 82 and the outside so that a radiation loss of the second harmonic waves P2 is increased. However, because the second harmonic waves P2 are not generated in the wave reflecting region 94, any second harmonic wave P2 is not lost.

Accordingly, because the wave reflecting region 94 is arranged in the front of the wavelength changing region 95, the second harmonic waves P2 do not transmit through the wave reflecting region 94. Therefore, the second harmonic waves P2 can be obtained at high efficiency in the wavelength changing device 81.

Also, though the grating elements 54 made of the photoresist material 57 function as an absorber, the second harmonic waves P2 are not absorbed by the grating 54 because the wave reflecting region 94 is arranged in the front of the wavelength changing region 95.

Also, because the satisfaction of the quasi-phase condition $\Lambda2=\lambda_f/\{2*(N2\omega-N\omega)\}$ is achieved regardless of the satisfaction of the DBR condition $\Lambda1=m\lambda_f/2N$, the wavelength $\lambda_f$ of the fundamental waves P1 can be arbitrarily selected. In other words, the wavelength $\lambda_h$ of the second harmonic waves P2 can be arbitrarily selected.

The influence of the positional relation between the regions 94, 95 on optical characteristics of a wavelength changing device is shown in FIG. 21.

As shown in FIG. 21, in cases where the wave reflecting region 94 is arranged in the rear of the wavelength changing region 95, a radiation loss of the second harmonic waves P2 is increased to 50% so that the intensity off the second harmonic waves P2 radiated from the output end facet 92b is decreased to 3 mW. In contrast, in cases where the wave reflecting region 94 is arranged in the front of the wavelength changing region 95 according to the fifth embodiment, no radiation loss of the second harmonic waves P2 is obtained so that the intensity of the second harmonic waves P2 radiated from the output end facet 92b is increased to 5 mW.

Also, when the pumping power of the fundamental waves P1 radiated from the semiconductor laser 88 is 60 mW to couple the fundamental waves P1 to the optical waveguide 92 at a power of 40 mW (or a coupling efficiency is 66%), a reflection efficiency for the fundamental waves Pi is 15% so that the wavelength of the fundamental waves P1 is completely fixed to 860 nm.

Next, a modification of the fifth embodiment is described.

The depth of the optical waveguide 92 is shallowed to 1.8 µm to increase the overlapping of the fundamental waves P1 and the periodic structure consisting of the grating 54 and the cover layer 55. In this case, as is described in the second embodiment, the reflection efficiency (or the diffraction efficiency) in the wavelength changing device 81 is enhanced to 25%. Also, the stabilization of the intensity of the second harmonic waves P2 is restrained within 3% of a maximum intensity even though a temperature of the semiconductor laser 88 is changed in a wide range from 10° to 50° C., Accordingly, the second harmonic waves P2 can be stably obtained at high efficiency.

6. SIXTH EMBODIMENT:

A sixth embodiment is described with reference to FIGS. 22 to 23.

Figure 22:
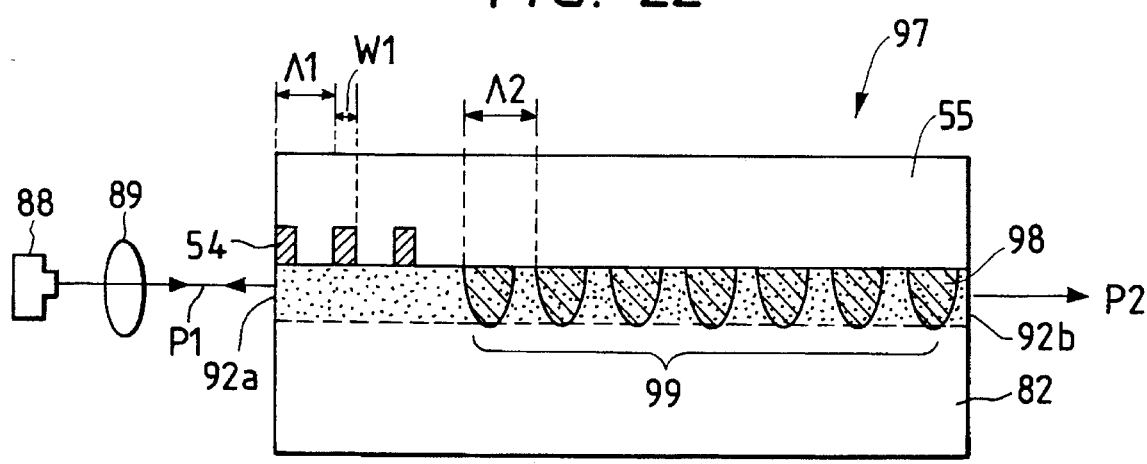
FIG. 22 is a cross-sectional view of a wavelength changing device according to a sixth embodiment.

FIG. 22 is a cross-sectional view of a wavelength changing device according to a sixth embodiment.

As shown in FIG. 22, a wavelength changing device 97 comprises the LiTaO$_3$ substrate 82, the optical waveguide 92 having a depth of 2 µm, a plurality of inverted-polarization layers 98 arranged in an upper side of the substrate 82 at second regular intervals $\Lambda2$, the grating elements 54 periodically arranged on the optical waveguide 92 which is positioned in the neighborhood of the incident end facet 92a, and the covering layer 55.

The inverted-polarization Layers 98 dielectrically polarized in au upper direction is formed in the same manner as the inverted-polarization layers 84. The inverted-polarization layers 98 is not arranged in the neighborhood of the incident end facet 92a but arranged in the neighborhood of the output end facet 92b (called a wavelength changing region 99).

A total length of a series of grating elements 54 in a propagation direction of the fundamental waves P1 is 1 mm, and the periodic structure of the grating 54 and the covering layer 55 is formed in a second grating order of the DBR periodic structure. That is, the DBR condition $\Lambda1=2*\lambda_f/(2N)$ is satisfied. Here the symbol $\Lambda1$ (=0.4 µm) is first regular intervals of the grating elements 54, the wavelength $\lambda_f$ of the fundamental waves is 860 nm, and the symbol N (=2.15) is an effective refractive index of the optical waveguide 92. In this case, a ratio of a width W1 of the grating 54 to the regular intervals $\Lambda1$ of the grating elements 54 is set to 0.23. The ratio W1/$\Lambda1$=0.23 is determined according to following reason.

Figure 23:
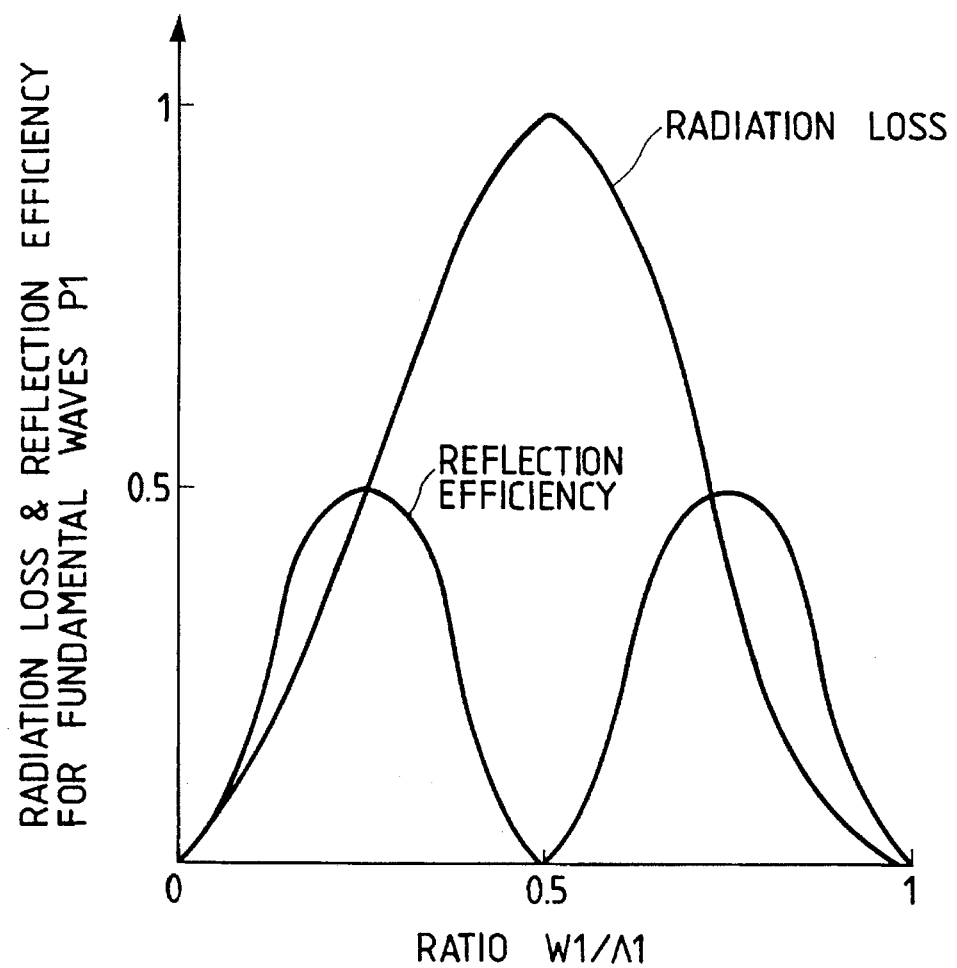
FIG. 23 graphically shows relation between a ratio $W1/\Lambda1$ and a transmission loss for fundamental waves and relation between a ratio $W1/\Lambda1$ and a reflection efficiency for fundamental waves.

A relation between the ratio W1/$\Lambda1$ and the radiation loss of the fundamental waves P1 and another relation between the ratio W1/$\Lambda1$ and the reflection efficiency for the fundamental waves P1 are shown in FIG. 23.

Though the reflection efficiency for the fundamental waves P1 is maximized at a first ratio W1/$\Lambda1$=0.25 and a second ratio W1/$\Lambda1$=0.75, the radiation loss of the fundamental waves P1 is large in the range from the first ratio W1/$\Lambda1$=0.25 to the second ratio W1/$\Lambda1$=0.75. Therefore, in cases where the first ratio W1/$\Lambda1$=0.25 is adopted, the radiation loss of the fundamental waves P1 to be changed to the second harmonic waves P2 becomes large so that the intensity of the second harmonic waves P2 is considerably decreased. Therefore, the ratio W1/$\Lambda1$=0.23 is adopted to keep the intensity of the fundamental waves P1 reflected at over a minimum value and to keep the intensity of the fundamental waves P1 changed to the second harmonic waves P2 at over a minimum value.

In the above configuration, 860 nm wavelength fundamental waves P1 radiated from the semiconductor laser 88 shown in FIG. 17 are radiated to the optical waveguide 92. Therefore, first parts of the fundamental waves P1 are fed back to the semiconductor 88, second pares of the fundamental waves P1 are changed to second harmonic waves, and remaining parts of the fundamental waves P1 are lost, in the same manner as in the fifth embodiment.

Optical characteristics of the wavelength changing device 97 are as follows. When the pumping power of the fundamental waves P1 radiated from the semiconductor laser 88 is 70 mW to couple the fundamental waves P1 to the optical waveguide 92 at a power of 42 mW (or a coupling efficiency is 60%), a reflection efficiency for the fundamental waves P1 is 20%, and a radiation loss of the fundamental waves P1 is 5%. Also, the intensity of the harmonic waves P2 is 3 mW.

Accordingly, even though the periodic structure of the grating 54 and the covering layer 55 is formed in the second grating order, the fundamental waves P1 can be reflected at high efficiency, and the second harmonic waves P2 can be obtained at high efficiency.

Also, because the periodic structure formed in the second grating order is easily manufactured as compared with that formed in the first grating order, the wavelength changing device 97 can be easily manufactured.

Also, because the satisfaction of the quasi-phase condition $\Lambda2=\lambda_f/\{2*(N2\omega-N\omega)\}$ is achieved regardless of the satisfaction of the DBR condition $\Lambda1=m\lambda_f/2N$, the wavelength $\lambda_f$ of the fundamental waves P1 can be arbitrarily selected. In other words, the wavelength $\lambda_h$ of the second harmonic waves P2 can be arbitrarily selected.

The ratio W1/$\Lambda1$ of the periodic structure is not limited to 0.23. That is, it is applicable that the ratio W1/$\Lambda1$ of the periodic structure range from 0.05 to 0.24. Also, it is applicable that the ratio W1/$\Lambda1$ of the periodic structure range from 0.76 to 0.95.

Because shorter wavelength laser light is stably obtained by changing the fundamental waves P1 to the harmonic waves P2 in the wavelength changing device 97, a shorter wavelength laser beam generating apparatus in which a shorter wavelength laser beam is generated at high power can be manufactured in a small size. Therefore, the apparatus can be utilized as a laser beam source of a photo disk and a laser printer. That is, a storage capacity of the photo disk can be greatly increased, and a small sized photo disk apparatus can be manufactured.

7. SEVENTH EMBODIMENT:

A seventh embodiment is described with reference to FIGS. 24 to 27.

Figure 24A:
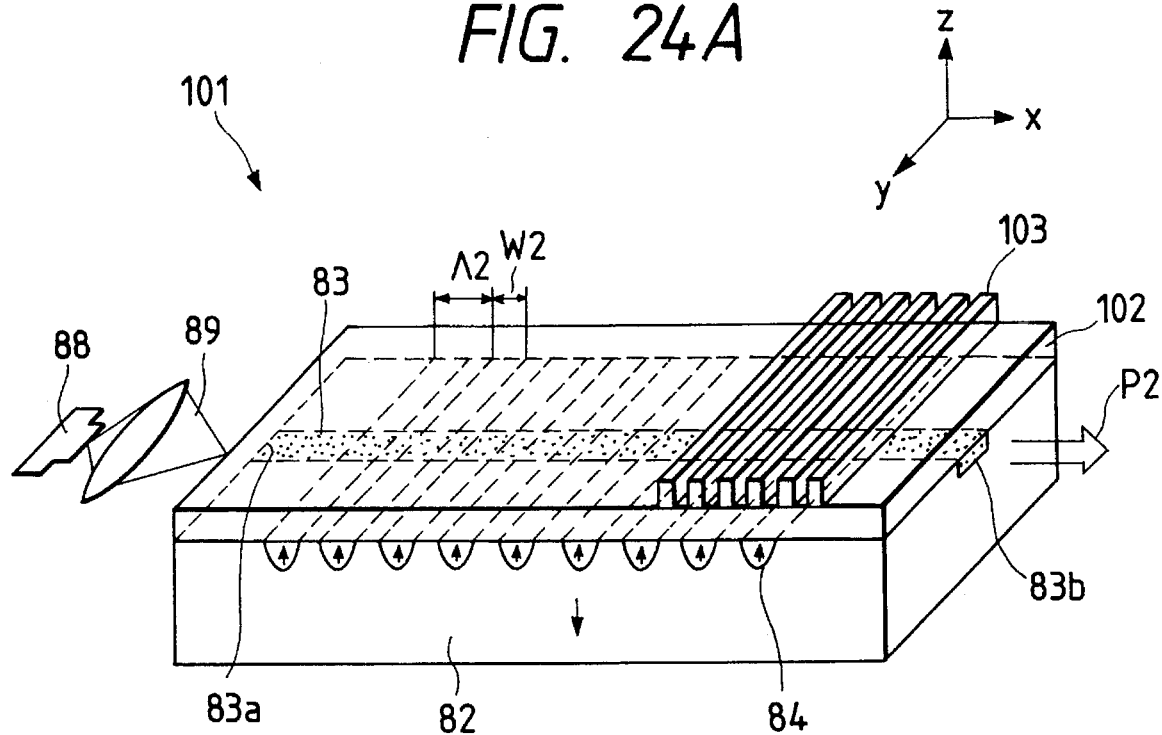
FIG. 24A is a diagonal perspective view of a wavelength changing device according to a seventh embodiment of the present invention.
Figure 24B:
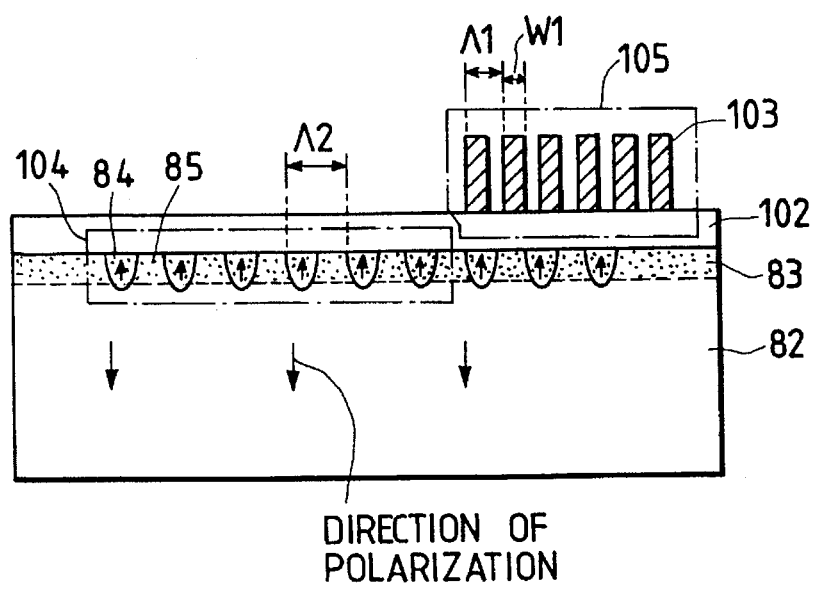
FIG. 24B is a cross-sectional view of the wavelength changing device shown in FIG. 24A.

FIG. 24A is a diagonal perspective view of a wavelength changing device according to a seventh embodiment of the present invention. FIG. 24B is a cross-sectional view of the wavelength changing device shown in FIG. 24A.

As shown in FIGS. 24A, 24B, a wavelength changing device 101 comprises the substrate 82, the optical waveguide 83, the inverted-polarization layers 84 periodically arranged at the second regular intervals Λ2, a dielectric passivation film 102 deposited on the substrate 82 and the optical waveguide 83 for protecting the optical waveguide 83, and a plurality of grating elements 103 periodically arranged on the dielectric passivation film 102 at the first regular intervals Λ1.

Tile depth of the optical waveguide 83 is 2 μm, and the width of the optical waveguide 83 is 4 μm. Also, the second regular intervals Λ2 of the inverted-polarization layers 84 are about 3.6 μm. Therefore, when the wavelength $\lambda_f$ of the fundamental waves P1 is 860 nm, the quasi-phase matching condition $\Lambda 2=\lambda_f/\{2*(N2\omega-N\omega)\}$ is satisfied. Here the symbol N2ω is a refractive index of the optical waveguide 83 for the second harmonic waves P2, and the symbol Nω is a refractive index of the optical waveguide 83 for the fundamental waves P1.

The dielectric passivation film 102 is made of $SiO_2$, and the thickness D1 of the film 102 is 0.06 μm. A refractive index of the dielectric passivation film 102 is 0.5.

The grating elements 103 are made of $Ta_2O_5$, and the size of the grating 103 is the same as that of the gratings 54 shown in FIG. 16A. Also, the first regular intervals Λ1 of the grating elements 103 are set to 1.98 μm, and a total length of a series of grating elements 103 is 5 mm in a propagation direction of the fundamental waves P1. In addition, the grating elements 103 are not arranged in the neighborhood of the incident end facet 83a (called a wavelength changing region 104) but arranged in the neighborhood of the output end facet 83b (called a wave reflecting region 105).

The inverted-polarization layers 84 are arranged in not only the wavelength changing region 104 but also the wave reflecting region 105, and a total length of a series of layers 84 is 15 mm in the propagation direction of the fundamental waves P1.

In the above configuration, 860 nm wavelength fundamental waves P1 radiated from the semiconductor laser 88 are radiated to the incident end facet 83a of the optical waveguide 83. Thereafter, a part of the fundamental waves P1 are changed to 430 nm wavelength second funndamental waves P2 in the wavelength changing region 104. Therefore, the fundamental waves P1 not changed and the second harmonic waves P2 transmit through the optical waveguide 83 of the wave reflecting region 105. In the wave reflecting region 105, the fundamental waves P1 are not only changed to the second harmonic waves P2 but also selectively reflected by the grating 103. In contrast, the second harmonic waves P2 are radiated from the output end facet 83b of the optical waveguide 83 without being reflected by the grating 103. The reason that the fundamental waves P1 are selectively reflected by the grating 103 is described with reference to FIG. 25.

Figure 25:
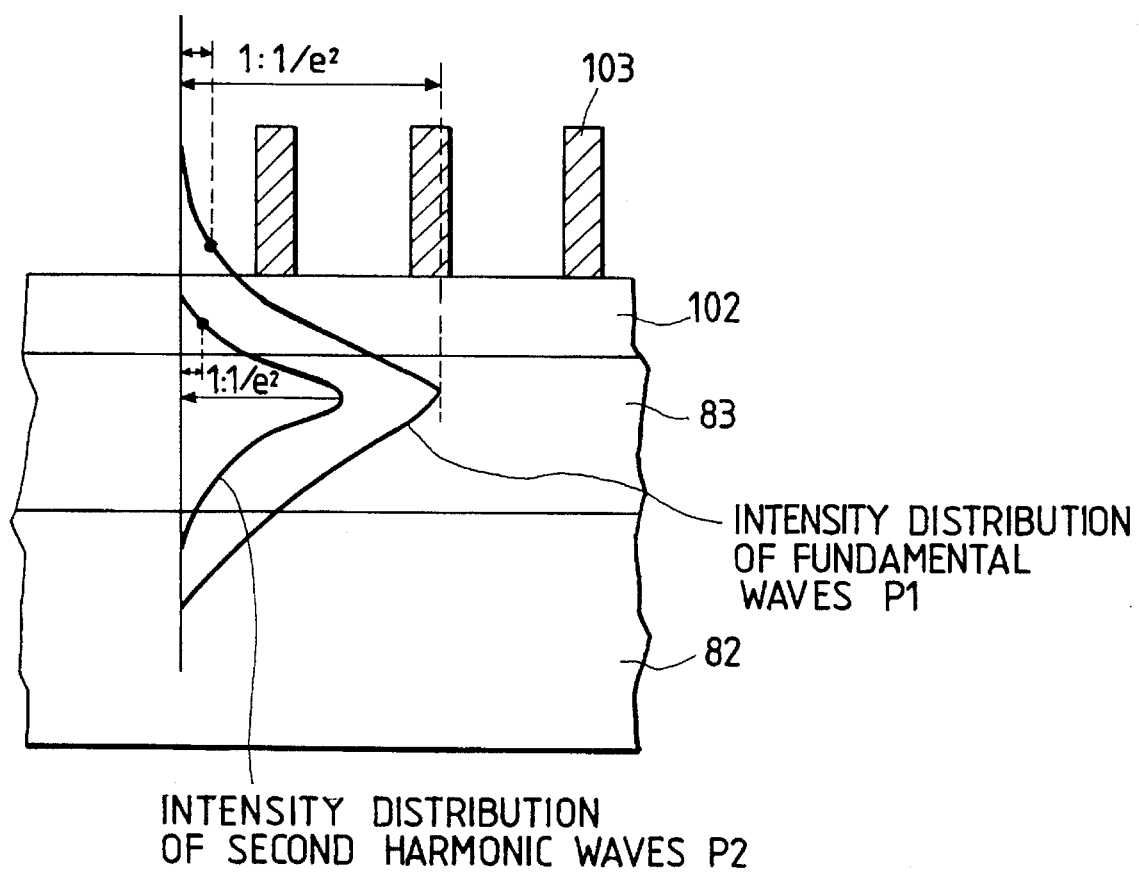
FIG. 25 is an enlarged cross-sectional view of a wave reflecting region in the wavelength changing device shown in FIG. 24A, intensity distributions of fundamental waves P1 and second fundamental waves P2 being explanatorily shown.

FIG. 25 is an enlarged cross-sectional view of the wave reflecting region 105 in the wavelength changing device 101 shown in FIG. 24A, intensity distributions of the fundamental waves P1 and the second fundamental waves P2 being explanatorily shown.

The intensity distribution in a depth direction of coherent light transmitting through the optical waveguide 83 generally depends on the wavelength of the coherent light. As shown in FIG. 25, an intensity distribution of the fundamental waves P1 spreads out to the dielectric passivation film 102 more than that of the harmonic waves P2. In detail, the intensity of the fundamental waves P1 is reduced to $1/e^2$ of a maximum intensity of the waves P1 at a distance of 0.1 μm from an upper surface of the optical waveguide 83, and the intensity of the second harmonic waves P2 is reduced to $1/e^2$ of a maximum intensity of the waves P2 at a distance of 0.04 μm from an upper surface of the optical waveguide 83. Therefore, because the dielectric passivation film 102 having the thickness D1=0.06 μm is arranged on the optical waveguide 83, the intensity distribution of the second harmonic waves P2 does not substantially spread out to the grating 103. That is, the second harmonic waves P2 are not reflected by the grating 103. In contrast, because the intensity distribution of the fundamentals waves P1 spreads out to the grating 103, the fundamental waves P1 are selectively reflected by the grating 103.

Thereafter, the fundamental waves P1 reflected by the grating 103 are fed back to the semiconductor laser 88 in cases where the DBR condition $\Lambda 1=m\lambda_f/2N$ is satisfied. Here a refractive index N of the optical waveguide 88 is 2.17. Relation between the wavelength $\lambda_f$ of the fundamental waves P1 and the regular intervals Λ1 of the grating elements 103 is shown in FIG. 26.

Figure 26:
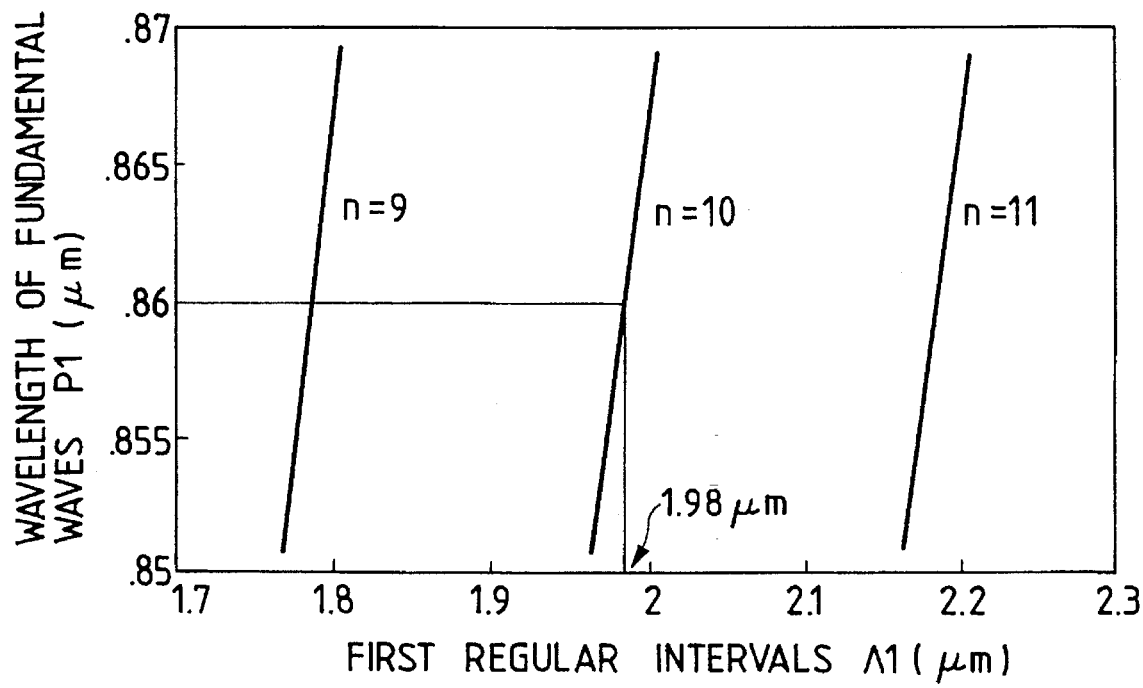
FIG. 26 graphically shows relation between the wavelength of fundamental waves P1 and regular intervals $\Lambda1$ of the grating elements in the wavelength changing device shown in FIG. 24A.

As shown in FIG. 26, the 860 nm wavelength fundamental waves P1 are reflected by the grating 103 functioning as the distributed Bragg reflector at the grating order m=10 because the first regular intervals Λ1 of the grating elements 103 is 1.98 μm. Accordingly, even though the grating elements 103 are arranged in the rear of the wavelength changing region 104, the second harmonic waves P2 are not reflected by the grating 103 because the dielectric passivation film 102 is arranged between a series of gratings 103 and the optical waveguide 83. Therefore, the position of the grating 103 is not limited to the front of the wavelength changing region 104 so that the wavelength changing device 101 can be arbitrarily manufactured. Also, the second fundamental waves P2 can be obtained at high efficiency.

Also, because the fundamental waves P1 are changed to the second harmonic waves P2 in the wave reflecting region 105, the second fundamental waves P2 can be moreover obtained at high efficiency.

Also, because the satisfaction of the quasi-phase condition $\Lambda 2=\lambda_f/\{2*(N2\omega-N\omega)\}$ is achieved regardless of the satisfaction of the DBR condition $\Lambda 1=m\lambda_f/2N$, the wavelength $\lambda_f$ of the fundamental waves P1 can be arbitrarily selected. In other words, the wavelength $\lambda_h$ of the second harmonic waves P2 can be arbitrarily selected.

Optical characteristics of the wavelength changing device 101 are as follows. When the pumping power off the fundamental waves P1 radiated from the semiconductor laser 88 is 200 mW to couple the fundamental waves P1 to the optical waveguide 83 at a power of 120 mW (or a coupling efficiency is 60%), the intensity of the harmonic waves P2 is 7 mW.

Relation between the output power of the harmonic waves P2 and the thickness D1 of the dielectric passivation film 102 is described with reference to FIG. 27.

Figure 27:
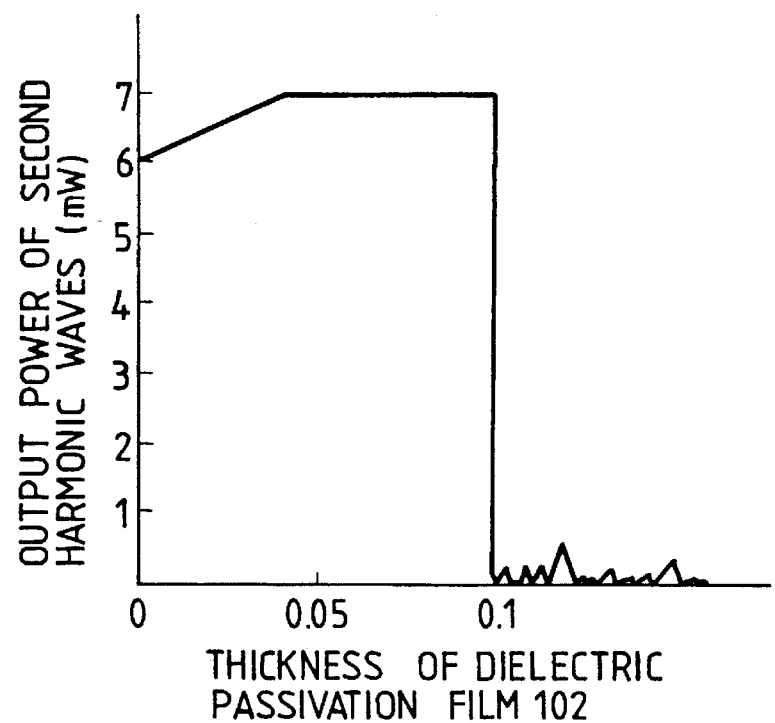
FIG. 27 graphically shows relation between the intensity of harmonic waves P2 and the thickness D1 of a dielectric passivation film in the wavelength changing device shown in FIG. 24A.

As shown in FIG. 27, in cases where the thickness D1 of the dielectric passivation film 102 is increased to over 0.1 μm, the wavelength $\lambda_f$ of the fundamental waves P1 radiated from the semiconductor laser 88 is not fixed because the fundamental waves P1 are not reflected by the grating 103. As a result, the second fundamental waves P2 cannot be stably obtained. Also, in cases where the thickness D1 of the dielectric passivation film 102 is decreased to less than 0.04 μm, the second harmonic waves P2 are scattered by the gratings 103. Therefore, as the thickness D1 of the dielectric passivation film 102 is decreased, the output power of the second harmonic waves P2 is decreased.

Accordingly, in cases where the thickness D1 of the dielectric passivation film 102 ranges from 0.04 to 1.0 μm, the output power of the second harmonic waves P2 is equal to a maximum value of 7 mW. In general, the range of the thickness D1 is inversely proportional to a refractive index n of the dielectric passivation film 102. Therefore, in cases where a product of the reflective index n and the thickness D1 ranges from 0.06 to 0.15 (0.06<nD1 (μm)<0.15), the output power of the second harmonic waves P2 is maximized.

In the seventh embodiment, the dielectric passivation film 102 is made of $SiO_2$. However, the material of the dielectric passivation film 102 is not limited. That is, any dielectric material can be utilized to make the dielectric passivation film 102 on condition that coherent light transmitting through the dielectric material is not substantially absorbed nor scattered.

Also, the substrate 82 is made of pure $LiTaO_3$ material. However, the material of the substrate 82 is not limited to the pure $LiTaO_3$ material. That is, it is applicable that $LiTaO_3$ material doped with MgO, Nb, Nd, or the like be utilized to make the substrate 82. Also, it is applicable that $LiNbO_3$ material or $LiTa_{(1-x)}Nb_xO_3$ ($0 \leq x \leq 1$) be utilized to make the substrate 82. In addition, because $KTiOPO_4$ is a highly non-linear optical crystal material, it is preferred that $KTiOPO_4$ be utilized to make the substrate 82. In this case, because a refractive index of $KTiOPO_4$ is a small value of about 1.7, the fundamental waves P1 can be reflected at high efficiency by the grating 103.

8. EIGHTH EMBODIMENT:

An eighth embodiment is described with reference to FIGS. 28 to 29.

Figure 28:
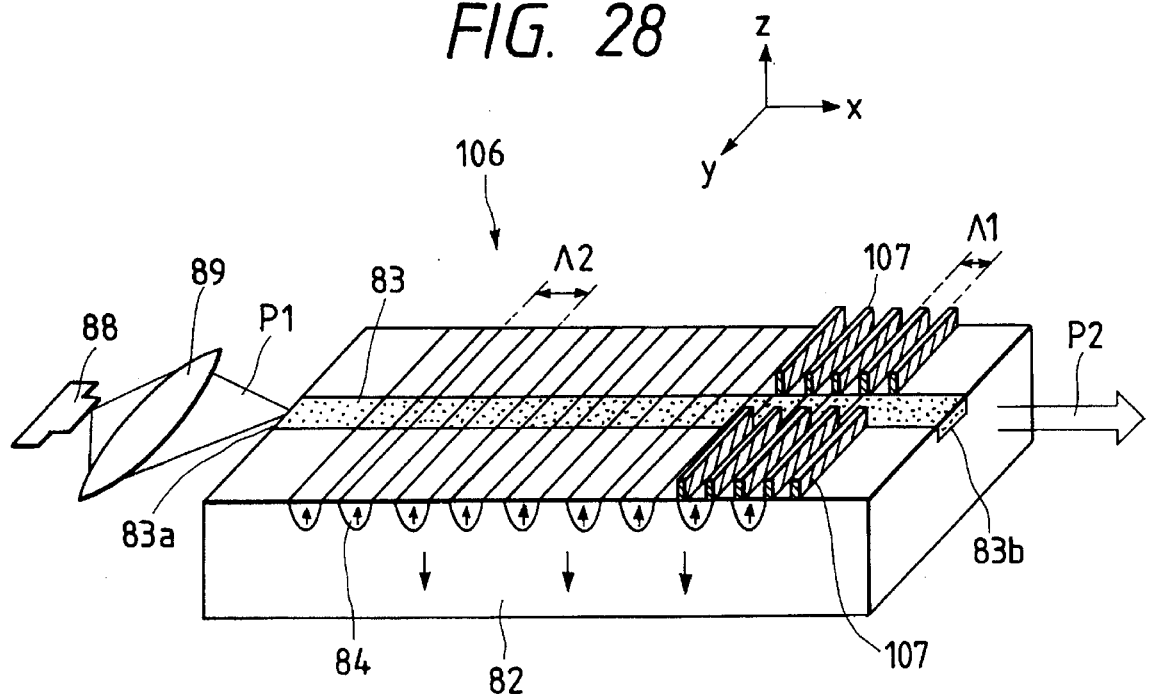
FIG. 28 is a diagonal view of a wavelength changing device according to an eighth embodiment of the present invention.

FIG. 28 is a diagonal perspective view of a wavelength changing device according to an eighth embodiment of the present invention.

As shown in FIG. 28, a wavelength changing device 106 comprises the substrate 82, the optical waveguide 83, the inverted-polarization layers 84 periodically arranged at the second regular intervals Λ2, and a grating 107 compound of a series of grating elements periodically arranged on both sides of the optical waveguide 107 at the first regular intervals Λ1.

The depth of the optical waveguide 83 is 2 μm, and the width of the optical waveguide 83 is 4 μm. Also, the second regular intervals Λ2 of the inverted-polarization layers 84 are about 3.6 μm. Therefore, when the wavelength $\lambda_f$ of the fundamental waves P1 is 860 nm, the quasi-phase matching condition $\Lambda 2=\lambda_f/\{2*(N2\omega-N\omega)\}$ is satisfied.

The grating elements 107 are made of $Ta_2O_5$, and the height of the grating elements 107 is 0.1 μm. The grating 107 are not arranged just on the optical waveguide 83 but arranged on the substrate 82 which is positioned on the both sides of the optical waveguide 83. Also, the first regular intervals Λ1 of the grating elements 106 are set to 1.98 μm, and a total length of a series of grating elements 106 is 5 mm in a propagation direction of the fundamental waves P1. In addition, the grating elements 106 are not arranged in the neighborhood of the incident end facet 83a but arranged in the neighborhood of the output end facet 83b. The DBR condition $\Lambda 1=m\lambda_f/(2N)$ (m=10) is satisfied.

The inverted-polarization layers 84 are arranged in not only the neighborhood of the incident end facet 83a but also the neighborhood of the output end facet 83b, and a total length of a series of layers 84 is 15 mm in the propagation direction of the fundamental waves P1.

In the above configuration, 860 nm wavelength fundamental waves P1 radiated from the semiconductor laser 88 are radiated to the incident end facet 83a of the optical waveguide 83. Thereafter, a part of the fundamental waves P1 are changed to 430 nm wavelength second fundamental waves P2 in the neighborhood of the incident end facet 83a. Therefore, the fundamental waves P1 not changed and the second harmonic waves P2 transmit through the optical waveguide 83 to the neighborhood of the output end facet 83b. In the neighborhood of the output end facet 83b, the fundamental waves P1 are not only changed to the second harmonic waves P2 but also selectively reflected by the grating 107. In contrast, the second harmonic waves P2 are radiated from the output end facet 83b of the optical waveguide 88 without being reflected by the grating 107. The reason that the fundamental waves P1 are selectively reflected by the grating 107 is described with reference to FIG. 29.

Figure 29:
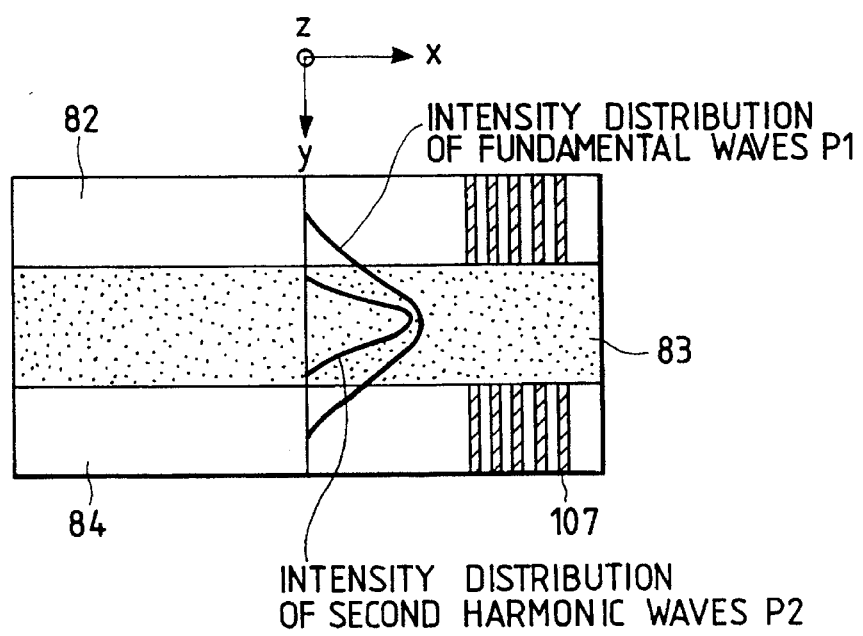
FIG. 29 is an enlarged plan view of an optical waveguide of the wavelength changing device shown in FIG. 28, intensity distributions of fundamental waves P1 and second fundamental waves P2 being explanatorily shown.

FIG. 29 is an enlarged plan view of the optical waveguide 83 of the wavelength changing device 106 shown in FIG. 28, intensity distributions of the fundamental waves P1 and the second fundamental waves P2 being explanatorily shown.

The intensity distribution in a width direction (a Y-direction) of coherent light transmitting through the optical waveguide 83 generally depends on the wavelength of the coherent light. As shown in FIG. 29, an intensity distribution of the fundamental waves P1 spreads outside the optical waveguide 83. In contrast, an intensity distribution of the second harmonic waves P2 spreads within the optical waveguide 83. In detail, the width of the intensity distribution of the fundamental waves P1 is 4.3 μm so that the fundamental waves P1 are reflected by the grating 107. In contrast, the width of the intensity distribution of the second harmonic waves P2 is 3.9 μm so that the second harmonic waves P2 are not reflected by the grating 107. Therefore, the fundamental waves P1 are selectively reflected by the grating 107.

Accordingly, even though the grating elements 107 are arranged in the rear of the wavelength changing region 104, the second harmonic waves P2 are not reflected by the grating 107 because the grating elements 107 are not arranged just on the optical waveguide 83 but arranged on both sides of the optical waveguide 83. Therefore, the position of the grating 107 is not limited to the front of the wavelength changing region 104 so that the wavelength changing device 106 can be arbitrarily manufactured. Also, the second fundamental waves P2 can be obtained at high efficiency.

Also, because the fundamental waves P1 are changed to the second harmonic waves P2 in the neighborhood of the output end facet 83b, the second fundamental waves P2 can be moreover obtained at high efficiency.

Also, even though any dielectric film is not arranged between the optical waveguide 83 and a series of grating elements 107, the second harmonic waves P2 can be prevented from being scattered.

Also, because the satisfaction of the quasi-phase condition $\Lambda 2=\lambda_f/\{2*(N2\omega-N\omega)\}$ is achieved regardless of the satisfaction of the DBR condition $\Lambda 1 = m\lambda_f/2N$, the wavelength $\lambda_f$ of the fundamental waves P1 can be arbitrarily selected. In other words, the wavelength $\lambda_h$ of the second harmonic waves P2 can be arbitrarily selected.

9. NINTH EMBODIMENT:

A ninth embodiment is described with reference to FIGS. 30 to 33.

Figure 30:
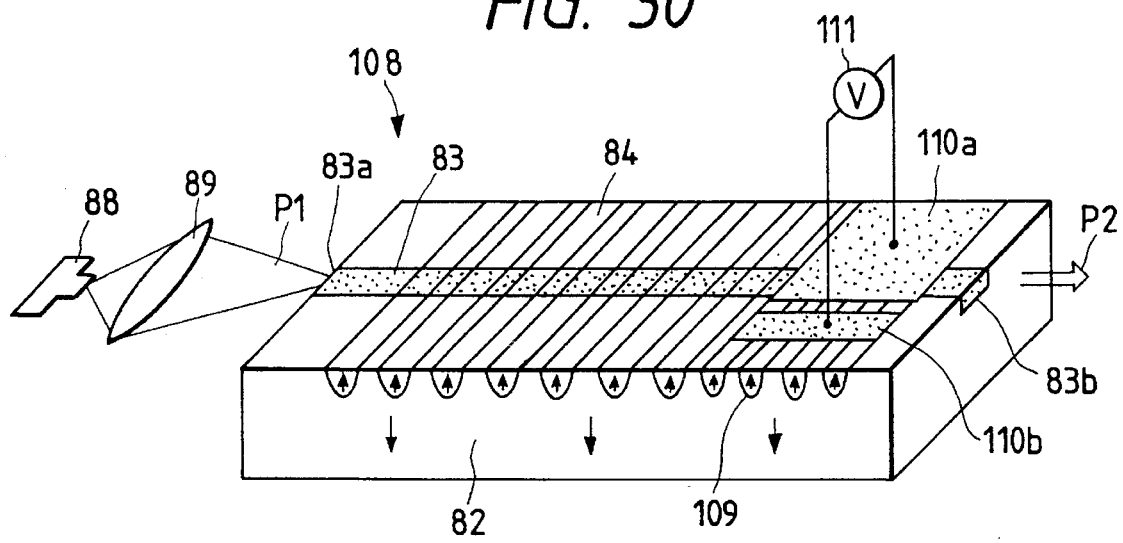
FIG. 30 is a diagonal view of a wavelength changing device according to a ninth embodiment of the present invention.

FIG. 30 is a diagonal perspective view of a wavelength changing device according to a ninth embodiment of the present invention.

As shown in FIG. 30, a wavelength changing device 108 comprises the substrate 82, the optical waveguide 83, the inverted-polarization layers 84 periodically arranged at the second regular intervals $\Lambda 2$ in the neighborhood of the incident end facet 83a, a plurality of inverted-polarization layers 109 periodically arranged at the first regular intervals $\Lambda 1$ in the upper side of the substrate 82 which is positioned in the neighborhood of the output end facet 83b, a first electrode 110a and a second electrode 110b arranged on the inverted-polarization layers 109 for applying electric field to the inverted-polarization layers 109, and an electric source 111 for applying a positive electric potential to the first electrode 110a and applying a negative electric potential to the second electrode 110b.

The depth of the optical waveguide 83 is 2 μm, and the width of the optical waveguide 83 is 4 μm. Also, the second regular intervals $\Lambda 2$ of the inverted-polarization layers 84 are about 3.6 μm. Therefore, when the wavelength $\lambda_f$ of the fundamenal waves P1 is 860 nm, the quasi-phase matching condition $\Lambda 2 = \lambda_f/\{2*(N2\omega - N\omega)\}$ is satisfied.

The inverted-polarization layers 109 are formed to cross the optical waveguide 83 according to the proton exchange process in the same manner as in the inverted-polarization layers 84. A width W1 of each inverted-polarization layer 109 is set to 1.7 μm. The regular intervals $\Lambda 1$ of the inverted-polarization layers 109 is 1.98 μm, and a total length of a series of layers 109 is 5 mm in a propagation direction of the fundamental waves P1. Also, a total length of a series of layers 84 is 10 mm in the propagation direction.

Tile first electrode 110a is arranged just on the optical waveguide 83 and both sides of the optical waveguide 83. Therefore, as shown in FIG. 29, even though fundamentals waves P1 transmitting through the optical waveguide 83 spread out to the substrate 82, all of the fundamental waves P1 transmit under the first electrode 110a. In contrast, any fundamental wave P1 does not transmit under the second electrode 110b. Therefore, in cases where a positive electric potential is applied to the first electrode 110a, electric field directed to a lower direction penetrates through the inverted-polarization layers 109 and non-inverted polarization layers 112 arranged between the layers 109. As a result, the refractive index of the inverted and non-inverted polarization layers 109, 112 is changed by an electro-optic effect.

The electro-optic effect is described in detail with reference to FIGS. 31(a), 31(b).

Figure 31A:
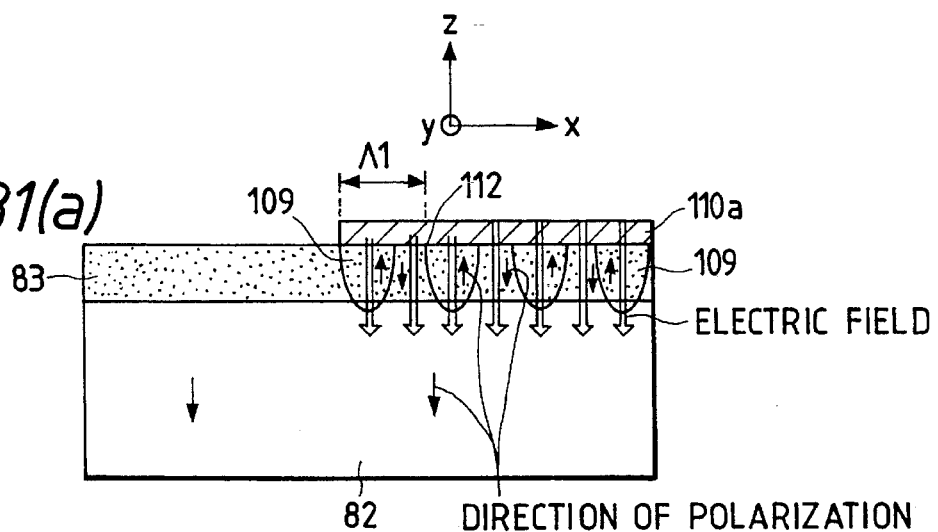
FIG. 31(a) is an enlarged cross-sectional view of an optical waveguide covered by a first electrode in a wavelength changing device shown in FIG. 30, explanatorily showing electric field induced in inverted and non-inverted polarization layers.
Figure 31B:
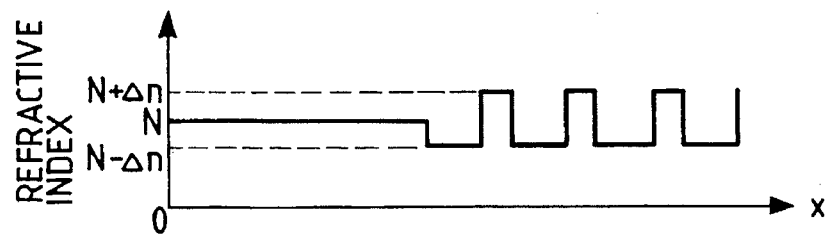
FIG. 31(b) graphically shows variation of a refractive index of the inverted and non-inverted polarization layers shown in FIG. 31(a)

FIG. 31(a) is an enlarged cross-sectional view of the optical waveguide 83 covered by the first electrode 110a in the wavelength changing device 108 shown in FIG. 30, explanatorily showing electric field induced in the inverted and non-inverted polarization layers 109, 112, and FIG. 31(b) graphically shows variation of the refractive index of the inverted and non-inverted polarization layers 109, 112.

The electro-optic effect is defined as a phenomenon in which the refractive index of a crystal material is changed by electric field in dependence on an electro-optic constant. Because the inverted and non-inverted polarization layers 109, 112 are made of non-linear optical crystal $LiNbO_3$ having an upper surface defined as (001)-plane in the Miller indices, the electro-optic constant in the Z-axis direction ([001] direction in the Miller devices) is large. Also, the increase or decrease of the refractive index in the inverted-polarization layers 109 is the reverse of that in the non-inverted polarization layers 112 because the polarization directions of the layers 109, 112 are opposite to each other. Therefore, as shown in FIGS. 31(a), 31(b), in cases where the refractive index of the non-inverted polarization layers 112 varies by a value $\Delta n$, the refractive index of the inverted-polarization layers 109 varies by a value $-\Delta n$. As a result, a diffraction grating (or a distributed Bragg reflector) caused by a periodic distribution of the refitactive index is formed by a periodic structure consisting of the inverted and non-inverted polarization layers 109, 112.

In the above configuration, 860 nm wavelength fundamental waves P1 radiated from the semiconductor laser 88 are converged at the incident end facet 83a of the optical waveguide 85. Thereafter, a part of the fundamental waves P1 are changed to 430 nm wavelength second fundamental waves P2 by alternate rows of the inverted and non-inverted polarization layers 84, 85 in the neighborhood of the incident end facet 83a. Therefore, the fundamental waves P1 not changed and the second harmonic waves P2 transmit through the optical waveguide 83 to the neighborhood of the output end facet 83b. In the neighborhood off the output end facet 83b, the fundamental waves P1 are selectively reflected by the inverted and non-inverted polarization layers 109, 112 because the periodic structure of the inverted and non-inverted polarization layers 109, 112 functions as the distributed Bragg reflector. In contrast, the second harmonic waves P2 are radiated from the output end facet 83b of the optical waveguide 83 without being reflected by the layers 109, 112.

When an electric potential of 50 V is applied to the first electrode 110a, the variation value an of the refractive index becomes about $10^{-4}$. The variation value an is proportional to the electric potential applied to the first electrode 110a. Also, when an electric potential more than 10 V is applied to the first electrode 110a, a reflection efficiency becomes about 10% so that the wavelength $\lambda_f$ of the fundamental waves P1 radiated from the semiconductor laser 88 can be stably fixed. For example, when the electric potential V1 applied to the first electrode 110a is 10 V, the wavelength $\lambda_f$ of the fundamental waves P1 reflected in the periodic structure is 860 nm. Therefore, when the electric potential is periodically applied to the first electrode 110a, the output power of the second harmonic waves P2 is periodically changed. A maximum output power of the second harmonic waves P2 is 4 mW, and a quenching ratio for the second harmonic waves P2 is −30 dB.

Next, the control of the wavelength $\lambda_f$ in the fundamental waves P1 reflected in the periodic structure of the inverted and non-inverted polarization layers 109, 112 is described.

When an electric potential V1 is applied to the first electrode 110a, the refractive index of the inverted-polarization layers 109 varies by the value $-\Delta n(V1)$ depending on the value V1, and the refractive index of the non-inverted polarization layers 112 varies by the value $\Delta n(V1)$. Therefore, an averaged variation $\Delta N$ of the refractive index in the periodic structure becomes $\Delta N(V1) = \{\Delta n*(\Lambda 1 - W1) - \Delta n*W1\}/\Lambda$. When the electric potential V1(t) applied to the first electrode 110a changes with time t, the averaged variation $\Delta N(V1)$ also changes with the time t. Because the DBR condition is indicated by the equation $\Lambda 1 = m\lambda_f/(2N)$, the wavelength of the fundamental waves P1 reflected in the periodic structure is formulated by an equation $\lambda_f = 2*\Lambda 1(N+$ ΔN)/m when the electric potential V1(t) is applied to the first electrode 110a. Here the symbol N denotes the effective refractive index of the optical waveguide 83 on condition that no electric potential is applied to the first electrode 110a. Therefore, when a modulated electric potential V1(t) is applied to the first electrode 110a, the wavelength $\lambda_f$ of the fundamental waves P1 reflected in the periodic structure is controlled. In this case, because the QPM condition is satisfied when the wavelength $\lambda_f$ of the fundamental waves P1 is equal to 860 nm, the output power of the second harmonic waves P2 is modulated.

Figure 32:
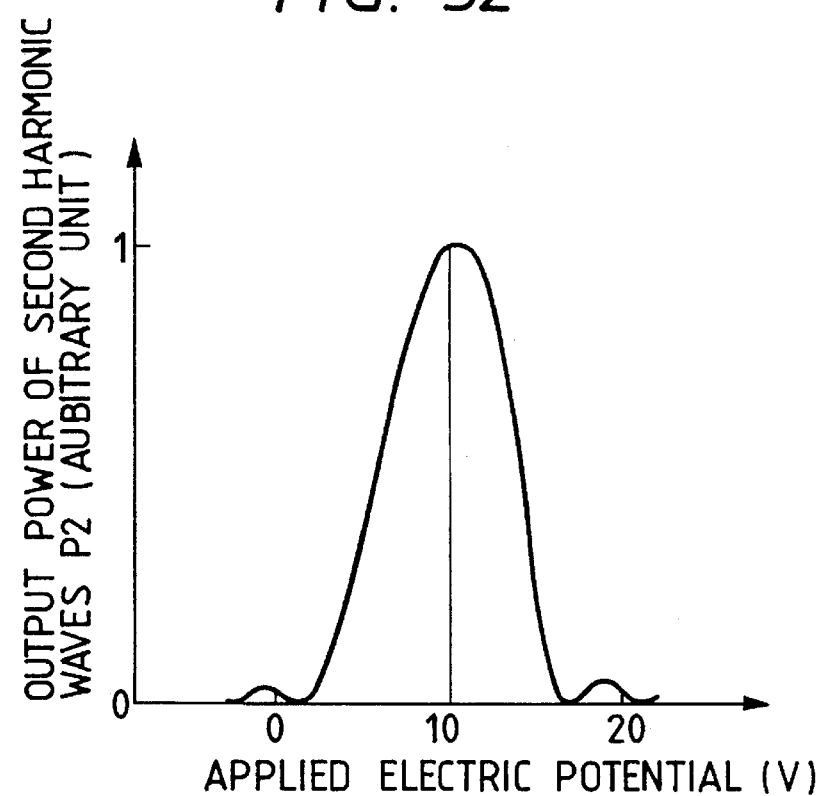
FIG. 32 graphically shows relation between applied electric potential and intensity of second fundamental waves output from an optical waveguide shown in FIG. 30.

Optical characteristics of the wavelength changing device 108 are described. When a pumping power of the fundamental waves P1 radiated from the semiconductor laser 88 is 100 mW to couple the fundamental waves P1 to the optical waveguide 83 at a power of 50 mW (or a coupling efficiency is 50%), the output power of the harmonic waves P2 is modulated when the electric potential V1 applied to the first electrode 110a is modulated in the range from 0 to 20 V, as shown in FIG. 32.

Figure 33:
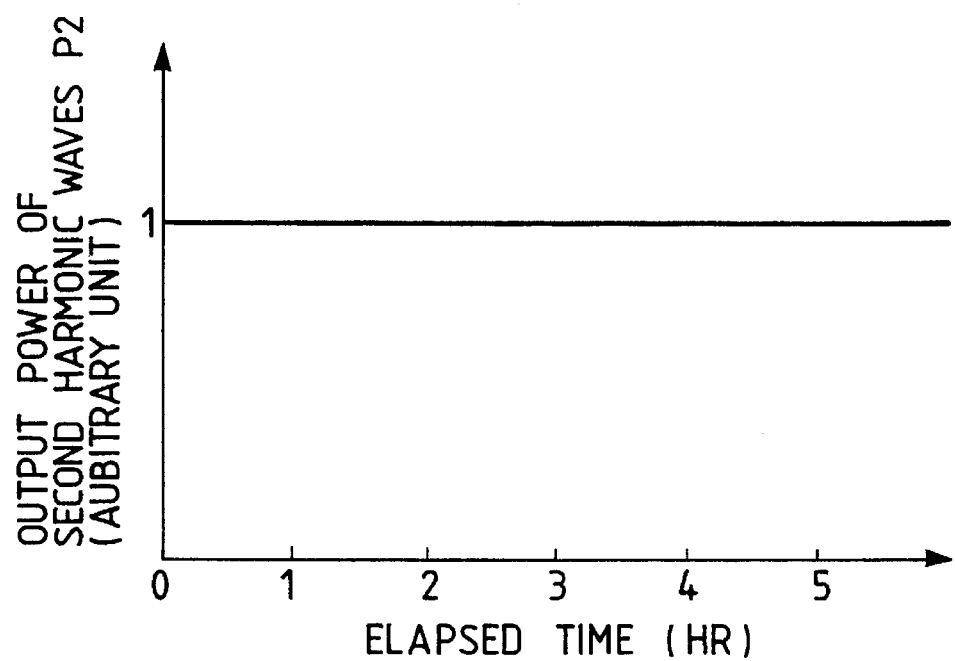
FIG. 33 graphically shows intensity of second fundamental waves output from an optical waveguide shown in FIG. 30, showing stabilization of the intensity of second fundamental waves.

Also, when the electric potential V1 applied to the first electrode 110a is adjusted to keep the intensity of the second harmonic waves P2 at a maximum value, the output power of the second harmonic waves P2 can be stabilized for a long time, as shown in FIG. 33.

Accordingly, even though any grating is not arranged on the optical waveguide 83 nor on any side of the optical waveguide 83, a diffraction grating function as the distributed Bragg reflector can be arranged in the optical waveguide 83. In addition, because the DBR condition $\Lambda 1 = m\lambda_f/2N$ can be arbitrarily changed, the second harmonic waves p2 can be modulated.

In the ninth embodiment, the ratio of the width W1 to the regular intervals Λ1 is not equal to 0.5 to change the averaged variation ΔN. However, in cases where the depth of the inverted-polarization layers 109 is smaller than that of the optical waveguide 83, the wavelength $\lambda_f$ of the fundamental waves P1 reflected in the periodic structure can be controlled even though the ratio W1/Λ1 is equal to 0.5. That is, the intensity of the harmonic waves P2 can be modulated.

10. TENTH EMBODIMENT:

A tenth embodiment is described with reference to FIG. 34.

When a driving current supplied to a semiconductor laser or an ambient temperature varies, a refractive index of material of the semiconductor laser also varies. As a result, a wavelength of coherent light consisting of fundamental waves P1 radiated from the semiconductor laser generally changes. For example, a first driving current supplied to the semiconductor laser to read information stored in an optical disk greatly differs from a second driving current supplied to the semiconductor laser to write information in the optical disk. Therefore, a focal point of an objective lens utilized to converge the coherent light at the optical disk conventionally changes each time a reading operation and a writing operation is exchanged to each other. To avoid adverse influence of the change in the focal point, it is required to adjust the focal point.

In the present invention, because the coherent light radiated from the semiconductor laser is fed back to the semiconductor laser by the function of the diffracting device 51, 71, 73, or 76 or the wavelength changing device 81, 91, 97, 101, 106, or 108, the wavelength of the coherent light radiated from the semiconductor laser is fixed. Therefore, even though the driving current or the ambient temperature varies, the focal point does not change. Therefore, the exchange between the reading operation and the writing operation can be quickly performed without any adjustment of the focal point. Accordingly, lens material having a large wavelength dispersion coefficient can be utilized in a laser beam generating apparatus. Also, a lens having a large numerical aperture (NA) can be utilized.

Figure 34:
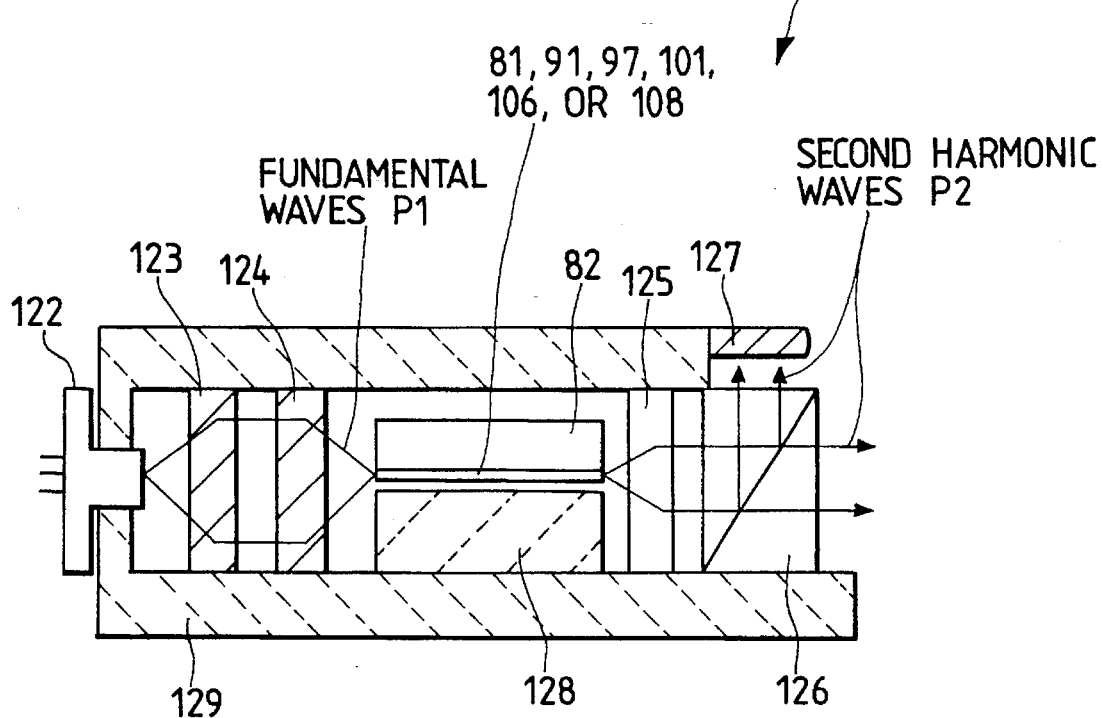
FIG. 34 is a constitutional view of a shorter wavelength laser beam generating apparatus according to a tenth embodiment of the present invention.

FIG. 34 is a constitutional view of a shorter wavelength laser beam generating apparatus according to a tenth embodiment of the present invention.

As shown in FIG. 34, a shorter wavelength laser beam generating apparatus 121 comprises a semiconductor laser 122 for radiating fundamental waves P1 having 0.8 μm wavelength band, a collimator lens 123 for collimating the fundamental waves P1, a focus lens 124 for focusing the fundamental wave P1 collimated, a wavelength changing device 81, 91, 97, 101, 106, or 108 for changing the fundamental waves P1 to second harmonic waves P2, a collimator lens 125 for collimating the second harmonic waves P2, a beam splitter 126 for splitting a beam of second harmonic waves P2 in two beams, a detector 127 for detecting a wavelength $\lambda_h$ of the second harmonic waves P2 splitted by the beam splitter 126, a plate type of heat insulator 128 made of quartz for thermally insulating the wavelength changing device 81, 91, 97, 101, 106, or 108 from the ambient air, and a box type of housing 129 for mounting the semiconductor laser 122, the converging optical system 123, 124, 125, and 126, the wavelength changing device, the detector 127, and the heat insulator 128.

In the above configuration, fundamental waves P1 transmitting through the lenses 123, 124 are converged at the optical waveguide 83, or 92 of the wavelength changing device. Thereafter, 860 nm wavelength fundamental waves P1 selectively reflected by the wavelength changing device are fed back to the semiconductor laser 122. Therefore, the wavelength $\lambda_f$ of the fundamental waves P2 radiated from the semiconductor laser 122 is fixed to 860 nm, and the wavelength $\lambda_h$ of second harmonic waves P2 changed in the optical waveguide 83, or 92 is set to 430 nm. Thereafter, the second harmonic waves P2 are collimated by the collimator 125 and are splitted by the beam splitter 126. One of beams of waves P2 is output, and another beam transmits to the detector 127 to detect the wavelength $\lambda_h$ of the second harmonic waves P2.

Accordingly, because the wavelength $\lambda_f$ of the fundamental waves P1 radiated from the semiconductor laser 122 is fixed to 860 nm, the wavelength $\lambda_f$ of the fundamental waves P1 can be prevented from fluctuating even though an ambient temperature of the semiconductor laser 122 or a driving current supplied to the semiconductor laser 122 fluctuates. Therefore, the output power of the second harmonic waves P2 can be stabilized, and noises included in the second harmonic waves P2 can be reduced. The second harmonic waves P2 is output at a high value of 2 mW.

Also, because all parts of the shorter wavelength laser beam generating apparatus 121 are packed in the housing 129, the apparatus 121 can be manufactured in a small size.

Therefore, the apparatus 121 can be useful to greatly increase the storage capacity of an optical disk and to manufacture the optical disk in a small size.

11. ELEVENTH EMBODIMENT:

An eleventh embodiment is described with reference FIGS. 35 to 36.

Figure 35:
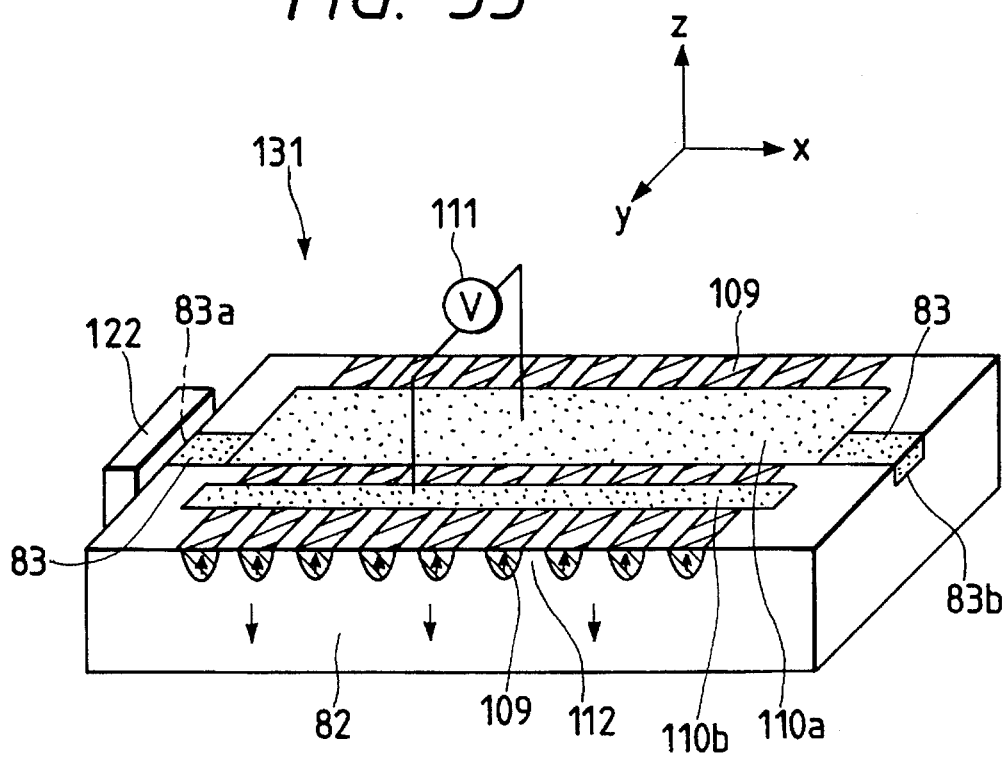
FIG. 35 is a diagonal view of a shorter wavelength laser beam generating apparatus according no a eleventh embodiment of the present invention.
Figure 36:
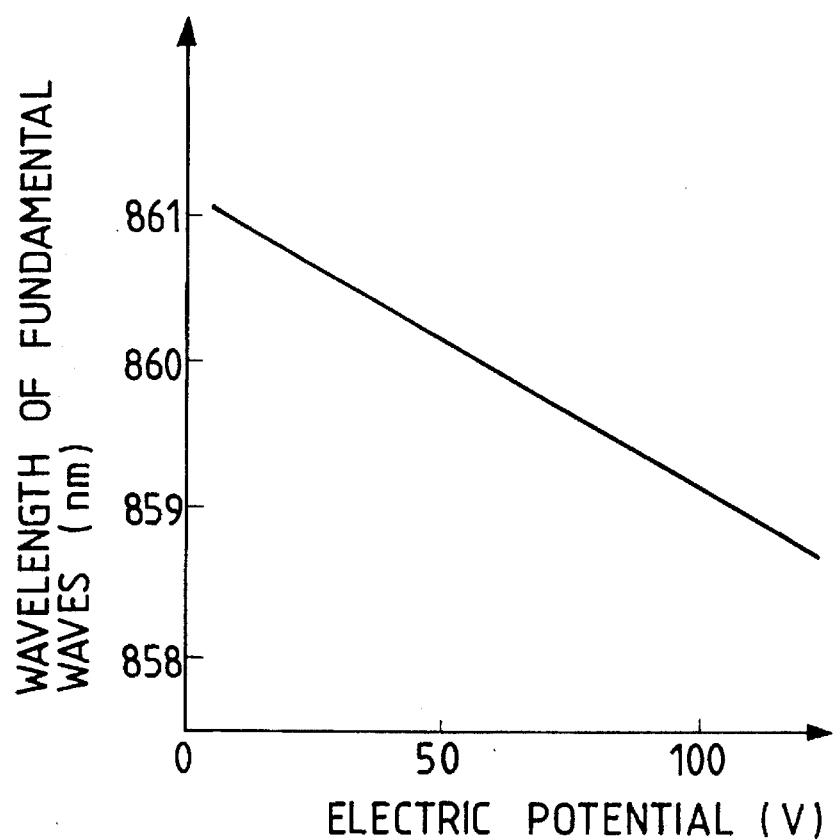
FIG. 36 graphically shows relation between wavelength of fundamental waves and electric potential applied to a first electrode shown in FIG. 35.

FIG. 35 is a diagonal view of a shorter wavelength laser beam generating apparatus according to a eleventh embodiment of the present invention.

As shown in FIG. 35, a shorter wavelength laser beam generating apparatus 131 comprises the semiconductor laser 122 and a wavelength changing device 132. The device 132 comprises the substrate 82, the optical waveguide 83, the inverted-polarization layers 109 periodically arranged at the first regular intervals Λ1, the first electrode 110a, the second electrode 110b, and the electric source 111.

The depth of the optical waveguide 83 is 2 μm, and the width of the optical waveguide 83 is 4 μm.

A width W1 of each inverted-polarization layer 109 is set to 1.7 μm. The regular intervals Λ1 of the inverted-polarization layers 109 is 1.98 μm, and a total length of a series of layers 109 is 5 mm in a propagation direction of the fundamental waves P1.

In the above configuration, when an electric potential is applied to the first electrode 110a, a periodic distribution of the refractive index is formed by a periodic structure consisting of the inverted and non-inverted polarization layers 109, 112 according to the electro-optic effect, in the same manner as in the ninth embodiment. Therefore, a diffraction grating is formed by the periodic distribution and functions as the distributed Bragg reflector on condition that the DBR condition is satisfied.

Therefore, when the electric potential V1(t) applied to the first electrode 110a is modulated, the wavelength $\lambda_f$ of the fundamental waves P1 reflected by the periodic structure is controlled because the averaged variation $\Delta N(V1) = \{\Delta n*(\Lambda 1 - W1) - \Delta n*W1\}/\Lambda$ of the refractive index in the periodic structure is increased or decreased. Therefore, the wavelength $\lambda_f$ of the fundamental waves P1 radiated from the semiconductor laser 122 is controlled, as shown in FIG. 36.

Accordingly, because the wavelength $\lambda_f$ of the fundamental waves P1 radiated from the semiconductor laser 122 is fixed depending on the periodic structure, the output power of the second harmonic waves P2 can be stabilized, and noise included in the second harmonic waves P2 can be reduced.

In the eleventh embodiment, the ratio of the width W1 to the regular intervals Λ1 is not equal to 0.5 to change the averaged variation ΔN. However, in cases where the depth of the inverted-polarization layers 109 is smaller than that of the optical waveguide 83, the wavelength $\lambda_f$ of the fundamental waves P1 reflected in the periodic structure call be controlled even though the ratio W1/Λ1 is equal to 0.5. That is, the intensity of the harmonic waves P2 can be modulated.

12. TWELFTH EMBODIMENT:

A twelfth embodiment is described with reference to FIGS. 37 to 39.

Figure 37:
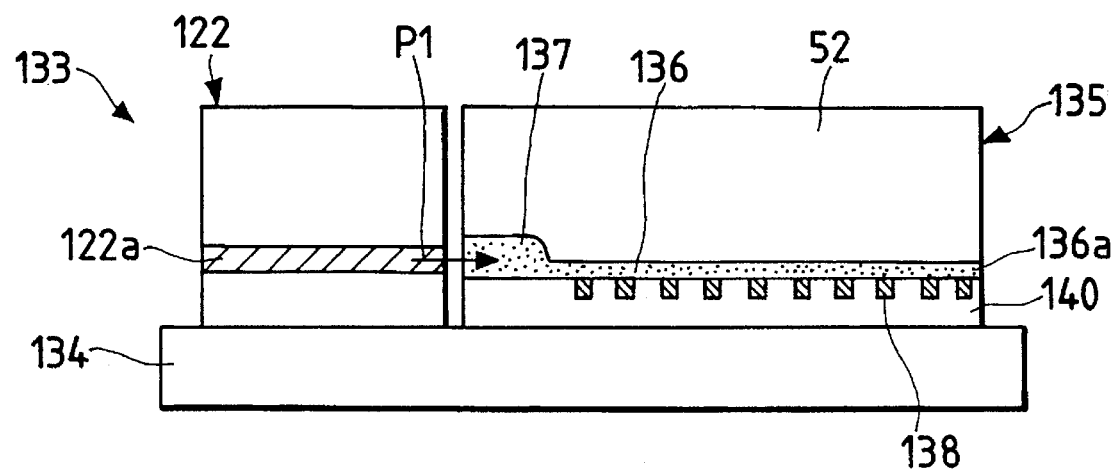
FIG. 37 is a cross-sectional view of a laser beam generating apparatus according to a twelfth embodiment of the present invention.

FIG. 37 is a cross-sectional view of a laser beam generating apparatus according to a twelfth embodiment of the present invention.

As shown in FIG. 37, a laser beam generating apparatus 133 comprises a Si sub-mount 134 having a length of 4 mm, the semiconductor laser 122 having an active layer 122a which is mounted on the sub-mount 134, and a diffracting device 135 mounted upside down on the sub-mount 134. The diffracting device 135 comprises the LiTaO₃ substrate 52, an optical waveguide 136 having an incident taper region 137 which is arranged in an upper side of the substrate 52, a grating 138 composed of a series of grating elements periodically arranged at regular intervals Λ1 on the optical waveguide 136, and a passivation film 140 for covering the grating 138. The active layer 122a is positioned at the same height on the sub-mount 134 as that of the incident taper region 137, and the semiconductor laser 122 is arranged closed to the incident taper region 137. Therefore, coherent light radiated from the active layer 122a of the semiconductor laser 122 is coupled to the incident taper region 137 of the optical waveguide 136 at a short time without transmitting through any lens.

The gratings 138 is made of Ta₂O₅, and the regular intervals Λ1 of the grating elements 138 are 1.9 μm to satisfy the DBR condition $\Lambda 1 = m*\lambda_c/(2N)$. Here the grating number m is 10, the wavelength $\lambda_c$ of the coherent light is 840 nm, and the refractive index N of the optical waveguide 144 is 2.2.

In the above configuration, a part of the coherent light coupled to the incident taper region 137 is reflected by the grating 138 and is fed back to the active layer 122a of the semiconductor laser 122. In contrast, a remaining part of the coherent light is output from an output end facet 136a of the optical waveguide 136. The wavelength $\lambda_c$(=840 nm) of the coherent light reflected by the grating 138 is determined to satisfy the DBR condition $\Lambda 1 = 10*\lambda_c/(2N)$ which depends on the regular interval Λ1 (=1.9 μm) of the grating elements 138 and the effective refractive index N(=2.2) of the optical waveguide 136. Therefore, the wavelength $\lambda_c$ of the coherent light radiated from the semiconductor laser 122 is fixed.

Next, a manufacturing method of the diffracting device 135 and the laser beam generating apparatus 133 is described with reference to FIGS. 38A to 38C.

Figure 38A:
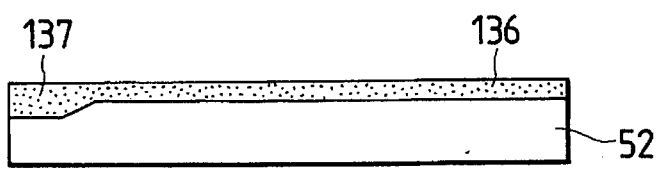
FIGS. 38A to 38C are cross-sectional views showing a manufacturing method of the diffracting device shown in FIG. 37.
Figure 38B:
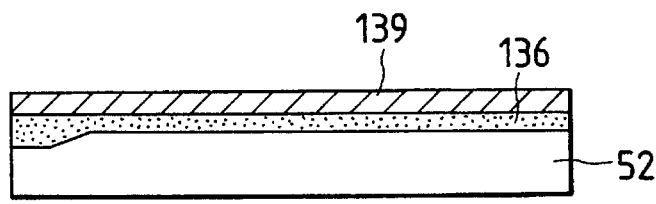
Figure 38C:
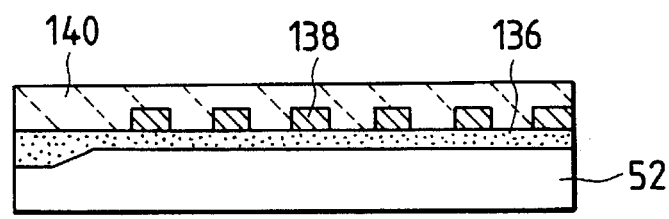

FIGS. 38A to 38C are cross-sectional views showing a manufacturing method of the diffracting device 135 shown FIG. 37.

The optical waveguide 136 is manufactured by immersing the substrate 52 in a pyrophosphoric acid (H₄P₂O₇) solution according to the proton-exchange process. Therefore, the coherent light can be efficiently confined in the optical waveguide 136. Also, even though the optical waveguide 136 is optically damaged, a transmission loss of the coherent light can remain lowered.

As shown in FIG. 9A, Ta is deposited on the entire surface of the substrate 52 at a thickness of 20 nm according to a sputtering process. Thereafter, a Ta film deposited is patterned to form a slit shaped opening according to a photolithography process and a dry etching process. Thereafter, to form the incident taper region 137, one side of the substrate 52 is immersed in a pyrophosphoric acid (H₄P₂O₇) solution for thirty minutes at a temperature of 260° C. to exchange a part of Li⁺ ions of the LiTaO₃ substrate 52 for H⁺ ions, according to a proton-exchange process. Therefore, a proton-exchange layer laving a thickness of 1.2 μm is formed in an upper side of the substrate 52 positioned just under the slit shaped opening. Thereafter, the substrate 52 is thermally processed for twenty minutes at a temperature of 420° C., so that the incident taper region 137 having a thickness of 5 μm is formed. Thereafter, to form the optical waveguide 136, the other side of the substrate 52 is immersed in the pyrophosphoric acid (H₄P₂O₇) solution for twelve minutes at a temperature of 260° C. to exchange a part of Li⁺ ions of the LiTaO₃ substrate 52 for H⁺ ions, according to the proton-exchange process. Therefore, another proton-exchange layer having a thickness of 0.5 μm is formed in another upper side of the substrate 52 positioned just under the slit shaped opening. Thereafter, the substrate 52 is thermally processed for one minute at a temperature of 420° C., so that the optical waveguide having a thickness of 1.9 μm is formed.

Thereafter, as shown in FIG. 38B, Ta₂O₅ is coated over both the substrate 52 and the optical waveguide 136 to form a Ta₂O₅ film 139 having a thickness of 30 nm. Thereafter, as shown in FIG. 38C, the Ta₂O₅ film 139 is etched in a periodic pattern according to a photolithography process and a dry etching process to form the grating 138. The regular intervals Λ1 of the grating elements 138 are 1.9 μm, so that the grating number becomes m=10. Thereafter, SiO₂ is deposited on the grating 138 according to a sputtering process to form the passivation film 140 having a thickness of 2 μm. The height of the incident taper region 137 and the height of the active layer 122a becomes the same as each other by adjusting the thickness of the passivation film 140. Thereafter, both sides of the optical waveguide 136 are polished. The length of the optical waveguide 136 is 3 mm.

Thereafter, the semiconductor laser 122 is bonded upside down to the sub-mount 134. Thereafter, the diffracting device 135 is mounted on the sub-mount 134 while attaching the passivation film 140 to the sub-mount 134, and the diffracting device 135 is strictly positioned and bonded to the sub-mount 134 while the semiconductor laser 122 radiates the coherent light so as to maximize the intensity of the coherent light radiated to the incident taper region 137 of the optical waveguide 136. As a result, the device 133 is completely manufactured.

Accordingly, because any optical system such as a converging lens or a collimator lens is not utilized, the device 133 can be manufactured in a small size.

Next, optical characteristics of the laser beam generating apparatus 133 is described.

The reflection efficiency of the grating 138 is only 10%. Though the reflection efficiency is not high, the value 10% is enough to stably fix the wavelength of the coherent light radiated from the semiconductor laser 122 because the semiconductor laser 122 is arranged closed to the diffracting device 135. Also, even though the intensity of the coherent light radiated from the semiconductor laser 122 is modulated, the wavelength of the coherent light radiated from the semiconductor laser 122 is stably fixed because the coherent light radiated from the semiconductor laser 122 is reflected and fed back to the semiconductor laser 122 at a short time.

Figure 39:
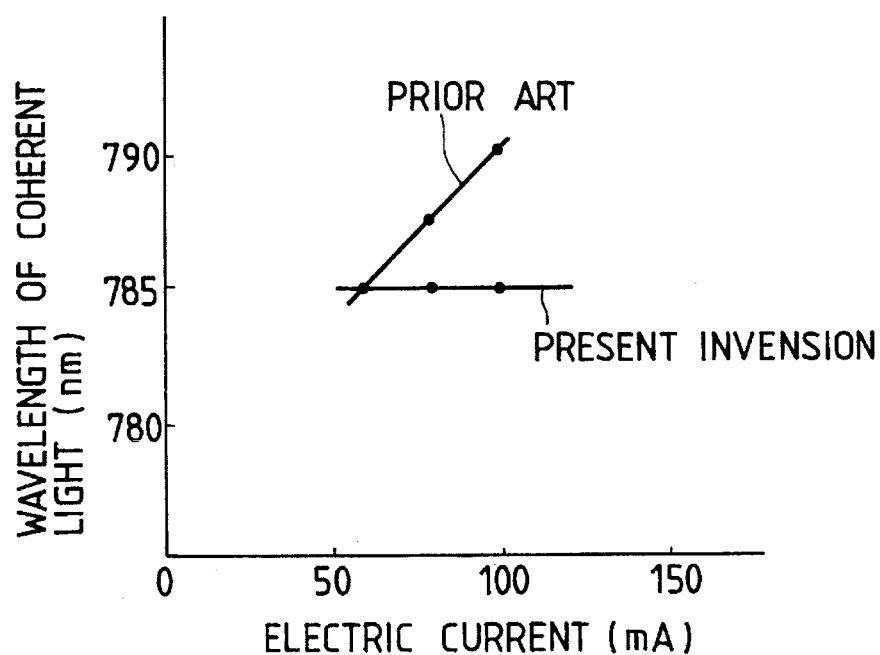
FIG. 39 graphically shows relation between driving current supplied to a semiconductor laser and wavelength $\lambda_c$ of coherent light radiated from the semiconductor laser shown in FIG. 37.

FIG. 39 graphically shows relation between a driving current supplied to the semiconductor laser 122 and the wavelength $\lambda_c$ of the coherent light radiated from the semiconductor laser 122.

As shown in FIG. 39, the wavelength $\lambda_c$ of the coherent light conventionally varies by 5 nm when the driving current changes by 50 mA. However, no variation of the wavelength $\lambda_c$ of the coherent light is observed in the device 133 according to the present invention.

Accordingly, because the wavelength $\lambda_c$ of the coherent light is stably fixed, the coherent light obtained in the device 133 can be useful.

In the twelfth embodiment, the grating 138 made of $Ta_2O_5$ is formed by etching the $Ta_2O_5$ film 139 according to the photolithography process and the dry etching process. However, the material of the grating 138 is not limited to $Ta_2O_5$. Also, the manufacturing method of the grating 138 is not limited to the dry etching process. For example, the grating 54 shown in FIG. 8A is appliable.

13. THIRTEENTH EMBODIMENT:

A thirteenth embodiment is described with reference to FIGS. 40, 41.

Figure 40:
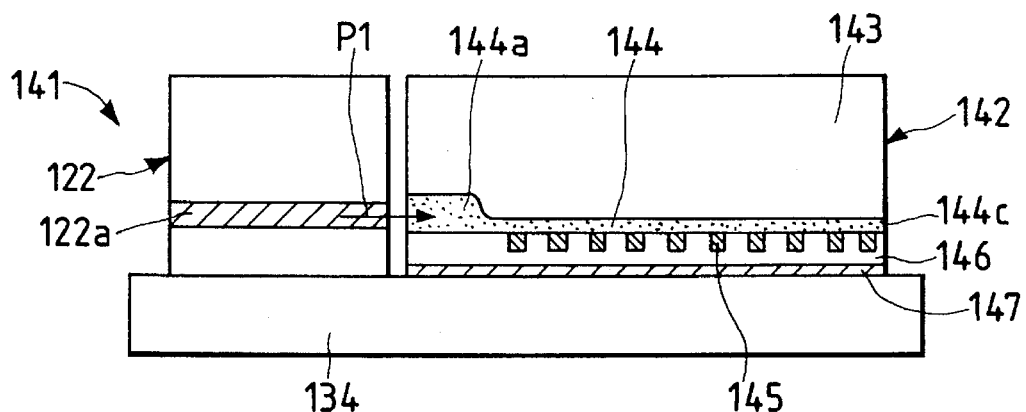
FIG. 40 is a constitutional view of a laser beam generating apparatus according to a thirteenth embodiment of the present invention.

FIG. 40 is a constitutional view of a laser beam generating apparatus according to a thirteenth embodiment of the present invention.

As shown in FIG. 40, a laser beam generating apparatus 141 comprises the Si sub-mount 134, the semiconductor laser 122, and a diffracting device 142 mounted upside down on the sub-mount 134.

Figure 41A:
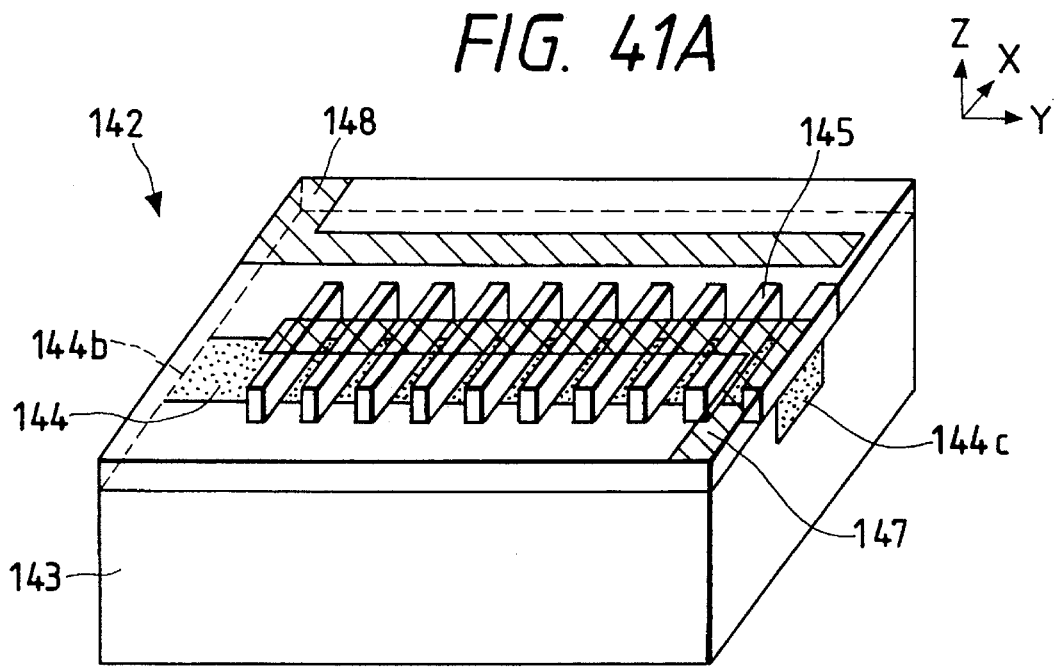
FIG. 41A is a diagonal perspective view of a diffracting device shown in FIG. 40.
Figure 41B:
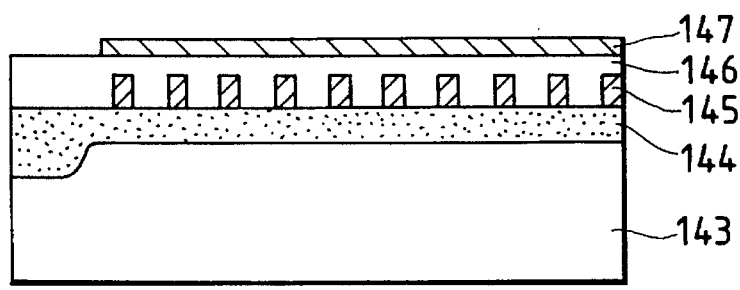
FIG. 41B is a cross-sectional view of the diffracting device shown in FIG. 41A.

FIG. 41A is a diagonal perspective view of the diffracting device 142 shown in FIG. 40. FIG. 41B is a cross-sectional view of the diffracting device 142 shown in FIG. 41A.

As shown in FIGS. 41A, 41B, the diffracting device 142 comprises a $LiNbO_3$ substrate 143, an optical waveguide 144 having an incident taper region 144a which is arranged in an upper side of the substrate 143, a grating 145 composed of a series of grating elements periodically arranged at regular intervals Λ1 on the optical waveguide 144, a dielectric passivation film 146 for protecting and insulating the optical waveguide 144 and the grating 145 from the outside, a first electrode 147 arranged just over the optical waveguide 144 through the grating 145 and the dielectric passivation film 146 for inducing electric field which penetrates through the optical waveguide 144, and a second electrode 148 arranged over the substrate 143 through the dielectric passivation film 146.

The substrate 143 is formed by cutting out $LiNbO_3$ crystal in a direction perpendicular to a Z-axis defined as [001]-direction in Miller indices. Therefore, the $LiNbO_3$ substrate 143 (or +Z plate) has an upper surface defined as (001)-plane in Miller indices.

The optical waveguide 144 is formed at a length off 10 mm by exchanging a part of $Li^+$ ions of the substrate 143 for $H^+$ ions. Therefore, an effective refractive index of the optical waveguide 144 is slightly higher than that of the substrate 143 to confine large parts of coherent light in the optical waveguide 144. Also, because the electro-optic effect on $LiNbO_3$ is very large, the refractive index of the optical waveguide 144 greatly changes by inducing electric field in the optical waveguide 144. A thickness of the optical waveguide 144 is set close to a cut-off thickness which is equivalent to a minimum thickness required to transmit coherent light through the optical waveguide 144. Therefore, in cases where no electric field penetrates through the optical waveguide 144, the coherent light can transmit through the optical waveguide 144. In contrast, in cases where electric field penetrates through the optical waveguide 144 to decrease the refractive index of the optical waveguide 144, the coherent light cannot transmit through the optical waveguide 144. That is, the coherent light is cut off in the optical waveguide 144.

The grating 145 is made of $Ta_2O_5$, and the regular intervals Λ1 of the gratings 145 are 0.19 μm to satisfy the DBR condition $\Lambda 1 = m * \lambda_c / (2N)$. Here the wavelength $\lambda_c$ of the coherent light is 840 nm and the refractive index N of the optical waveguide 144 is 2.2. Therefore, the grating number m becomes equal to 1, so that the coherent light transmits through the optical waveguide 144 in a single mode.

The dielectric passivation film 146 is made of $SiO_2$, and the film 146 prevents the first electrode 147 made of metal from being directly in contact with the optical waveguide 144. Therefore, the transmission loss of the optical waveguide 144 for the coherent light is greatly decreased.

The first electrode 147 has a width of 4 μm and a thickness of 200 nm, and a positive electric potential is applied to the first electrode 147 to decrease the refractive index of the optical waveguide 144. The second electrode 148 is grounded. Also, the distance between the electrodes 146, 147 is 5 μm.

The height of the active layer 122a is the same as that of the incident taper region 144a, and the semiconductor laser 122 is arranged closed to the incident taper region 144a. Therefore, coherent light radiated from the active layer 122a of the semiconductor laser 122 is coupled to the incicient taper region 144a of the optical waveguide 144 at a short time without transmitting though any lens.

In the above configuration, in cases where no electric potential is applied to the first electrode 147, the coherent light coupled to an incident end facet 144b transmits through the optical waveguide 144 in a single mode, and a part of the coherent light is reflected by the grating 145 to be fed back to the active layer 122a of the semiconductor laser 122. Also, a remaining part of the coherent light is output from an output end facet 144c of the optical waveguide 144. Therefore, the wavelength $\lambda_c$ of the coherent light radiated from the semiconductor laser 122 is fixed.

In contrast, in cases where a positive electric potential is applied to the first electrode 147, electric field is induced in the optical waveguide 144 to decrease the refractive index of the optical waveguide 144. Therefore, the coherent light coupled to the incident taper region 144b is cut off and transmits to the substrate 134 because the coherent light is coupled to a first radiation mode. As a result, no coherent light is output from the output end facet 144c of the optical waveguide 144.

For example, when the electric potential V1 applied to the first electrode 147 is 10 V, the intensity of the electric field becomes $2 \times 10^6$ V/m so that the refractive index of the optical waveguide 144 decreases by $10^{-4}$. Therefore, the coherent light is cut off. Also, when a pulsated electric potential having a peak voltage 10 V is repeatedly applied to the first electrode 147 at a cycle of 2 ns (a frequency of 500 MHz), the intensity of the coherent light output from the optical waveguide 144 is modulated at a frequency of 500 MHz, and the wavelength $\lambda_c$ of the coherent light is stably fixed to 840 nm.

Accordingly, the coherent light modulated and fixed at a prescribed wavelength can be reliably obtained.

In the thirteenth embodiment, the substrate 134 is made of LiNbO$_3$ because the electro-optic effect on LiNbO$_3$ is very large. However, the material of the substrate 134 is not limited to LiNbO$_3$. For example, a ferroelectric substance such as LiTaO$_3$ can be appliable.

Also, the grating 145 made of Ta$_2$O$_5$ is formed by etching the Ta$_2$O$_5$ film 139 according to the photolithography process and the dry etching process. However, the material of the grating 145 is not limited to Ta$_2$O$_5$. Also, the manufacturing method of the grating 145 is not limited to the dry etching process. For example, the grating 54 shown in FIG. 8A is appliable.

14. FOURTEENTH EMBODIMENT:

A fourteenth embodiment is described with reference to FIG. 42.

Figure 42:
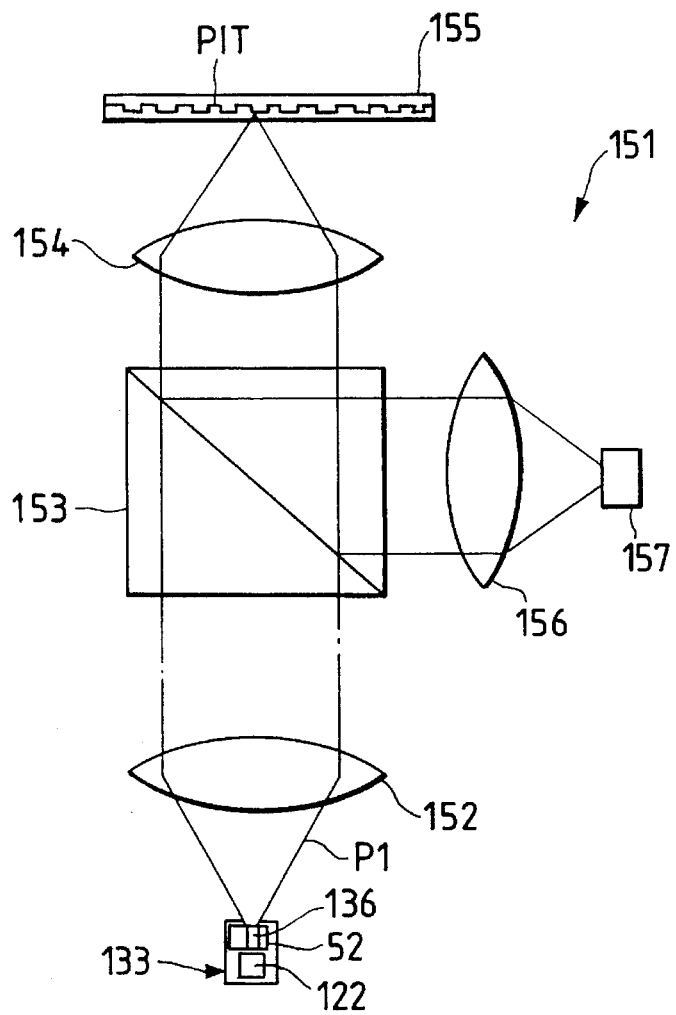
FIG. 42 is a constitutional view of an optical information processing apparatus according to a fourteenth embodiment of the present invention.

FIG. 42 is a constitutional view of an optical information processing apparatus according to a fourteenth embodiment of the present invention.

As shown in FIG. 42, an optical information processing apparatus 151 comprises the laser beam generating apparatus 133 of 6 mm square, a collimator lens 152 for collimating coherent light radiated from the device 133, a beam splitter 153 for splitting a beam of coherent light collimated by the lens 152 in two beams, an objective lens 154 for converging the coherent light splitted by the lens 152 at an optical disk 155 in which information is stored, a converging lens 156 for converging the coherent light which is reflected by the optical disk 155 and is splitted by the beam splitter 153, and a Si detector 157 for detecting the intensity of the coherent light converged by the converging lens 156.

The objective lens 154 is made of SF8 (manufactured by HOYA glass LTD. In Japan) having a refractive index of 1.68, and a numerical aperture NA of the lens 154 is 0.6.

In the above configuration, coherent light P1 radiated from the semiconductor laser 122 transmits through the optical waveguide 136 at a transverse magnetic (TM$_{oo}$) mode equivalent to a lowest-order mode. Thereafter, the coherent light P1 radiated from the device 133 is radiated to the optical disk 155 to form a converging spot of 1.1 μm in diameter after the coherent light P1 transmits through the collimator lens 152, the beam splitter 153, and the objective lens 154. Thereafter, reflected coherent light is detected by the detector 157 after the reflected coherent light transmits through the objective lens 154, the beam splitter 153, and the converging lens 156.

Because the wavelength of the coherent light is stably fixed in the device 133, a beam of coherent light can be stably radiated to a desired pit of the optical disk 155. Therefore, even though information is stored in the optical disk 155 with high density, the information can be read with high accuracy. For example, a relative intensity of noise (RIN) to an information signal is −140 dB/Hz.

In the fourteenth embodiment, the objective lens 154 is made of SF8. However, the material of the objective lens 154 is not limited to SF8. For example, even though SF6 having high refractive index and high dispersion coefficient is applied as the material of the objective lens 154, the information can be still read with high accuracy because the wavelength of the coherent light is stably fixed in the device 133.

Also, the apparatus 151 can be applied to write information in the optical disk 155.

15. FIFTEENTH EMBODIMENT:

A fifteenth embodiment is described with reference to FIGS. 43, 44.

Figure 43:
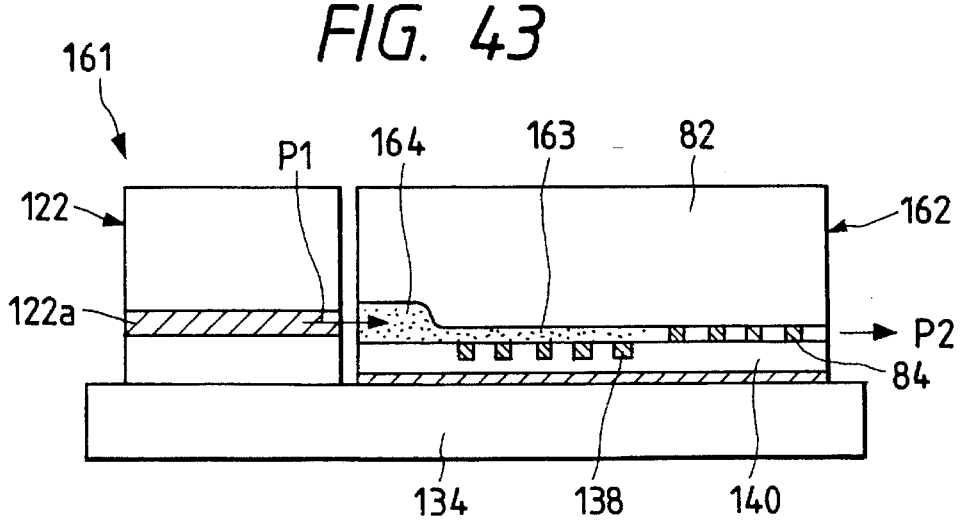
FIG. 43 is a constitutional view of a shorter wavelength laser beam generating apparatus according to a fifteenth embodiment of the present invention.

FIG. 43 is a cross-sectional view of a shorter wavelength laser beam generating apparatus according to a fifteenth embodiment of the present invention.

As shown in FIG. 43, a shorter wavelength laser beam generating apparatus 161 comprises the Si sub-mount 134 of 10 mm square, the semiconductor laser 122, and a wavelength changing device 162 mounted upside down on the sub-mount 134. The wavelength changing device 162 comprises the LiTaO$_3$ substrate 82, an optical waveguide 163 having an incident taper region 164 which is arranged in an upper side of the substrate 82, a plurality of gratings 138 periodically arranged at grating intervals Λ1 on the optical waveguide 163, the inverted-polarization layers 84 periodically arranged at matching intervals Λ2 in the upper side of the substrate 82 to cross the optical waveguide 163, and the passivation film 140 for covering the grating. The height of the active layer 122a is the same as that of the incident taper region 164, and the semiconductor laser 122 is arranged closed to the incident taper region 164. Therefore, coherent light radiated from the active layer 122a of the semiconductor laser 122 is coupled to the incident taper region 164 of the optical waveguide 163 at a short time without transmitting though any lens.

The optical waveguide 163 including the incident taper region 164 is manufactured in the same manner as the optical waveguide 136.

Figure 44:
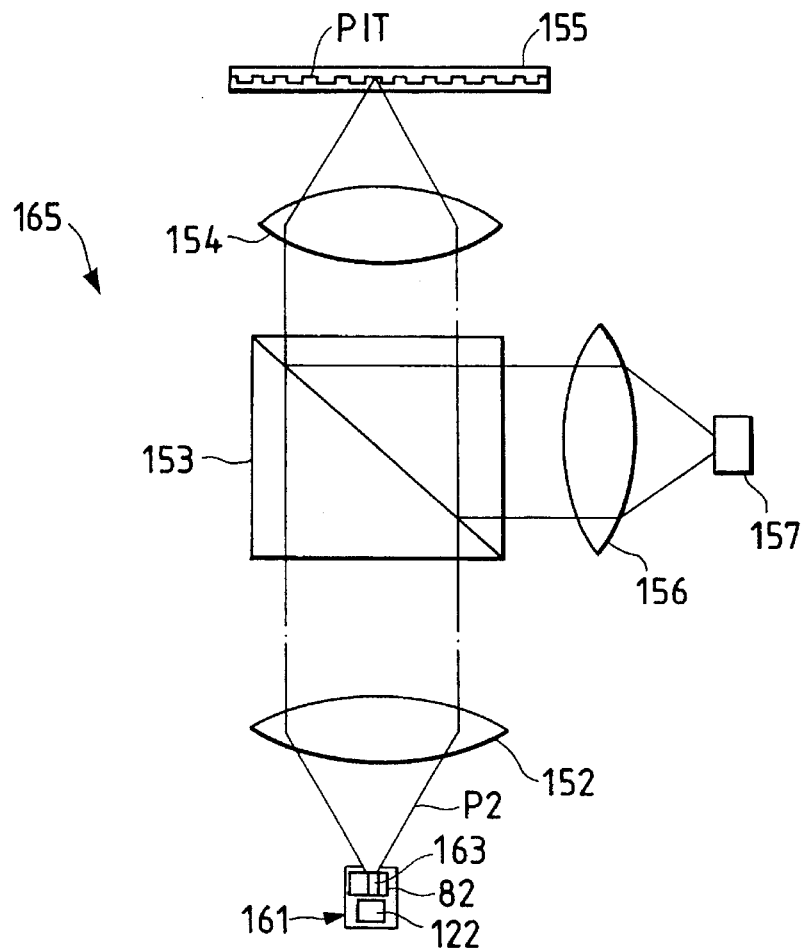
FIG. 44 is a constitutional view of an optical information processing apparatus according to the fifteenth embodiment of the present invention.

FIG. 44 is a constitutional view of an optical information processing apparatus according to a fifteenth embodiment of the present invention.

As shown in FIG. 44, an optical information processing apparatus 165 comprises the shorter wavelength laser beam generating apparatus 161 of 10 mm square, the collimator lens 152, the beam splitter 153, the objective lens 154, the converging lens 156, and the Si detector 157.

In the above configuration, a second harmonic wave P2 is radiated to a desired pit in the optical disk 155 to form a converging spot of 0.6 μm in diameter. The diameter of 0.6 μm is smaller than a conventional diameter 0.78 μm obtained in a conventional apparatus. Therefore, information stored with higher density more than that in the apparatus 151 can be read or written. Also, a relative intensity of noise (RIN) to an information signal is −145 dB/Hz. Therefore, the information signal can be clearly obtained.

16. SIXTEENTH EMBODIMENT:

A sixteenth embodiment is described with reference to FIG. 45.

Figure 45:
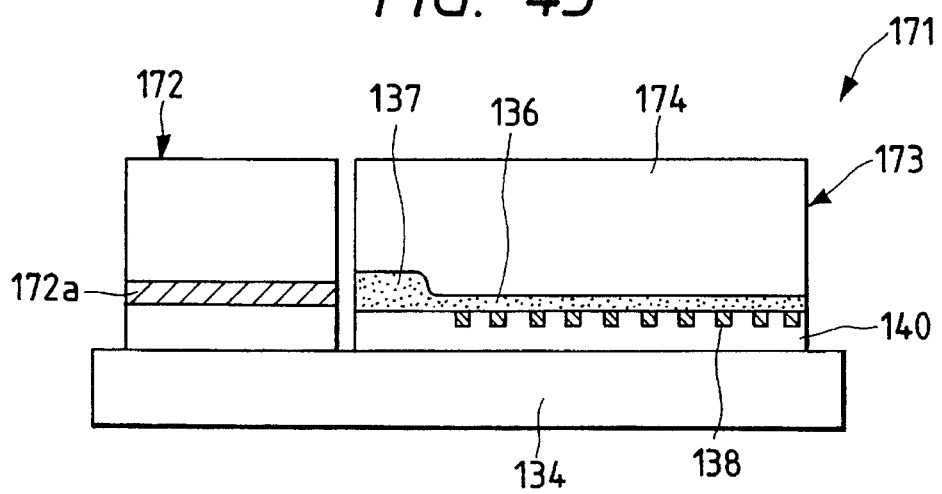
FIG. 45 is a constitutional view of a laser beam generating apparatus according to a sixteenth embodiment of the present invention.

FIG. 45 is a cross-sectional view of a laser beam generating apparatus according to a sixteenth embodiment of the present invention.

As shown in FIG. 45, a laser beam generating apparatus 171 comprises the Si sub-mount 134 of 6 mm square, a semiconductor laser 172 having an active layer 172a for radiating coherent light having a wavelength of 1.552 μm, and a diffracting device 173 mounted upside down on the sub-mount 134. The diffracting device 173 comprises a substrate 174 made of glass, the optical waveguide 136, the grating 138, and the passivation film 140 for covering the grating 138. The height of the active layer 172a is the same as that of the incident taper region 137. and the semiconductor laser 172 is arranged closed to the incident taper region 137. Therefore, coherent light radiated from the active layer 172a of the semiconductor laser 172 is coupled to the incident taper region 137 of the optical waveguide 136 at a short time without transmitting though any lens.

In the above configuration, coherent light having a wavelength of 1.552 μm is stably obtained in a temperature range from 0° to 50° C. Therefore, even though an ambient temperature fluctuates, the coherent light having the wavelength of 1.552 μm can be stably obtained.

In the laser beam generating apparatus 133, 141, 161, and 171, no lens is utilized to radiate light to the optical waveguide 136, 144, or 163. However, it is appliable that a lens is arranged between the semiconductor laser 122 or 172 and the device 135, 142, 162, or 173. Also, the material of the sub-mount 134 is not limited to Si. For example, material having high thermal conductivity such as Cu or C is useful for the sub-mount 184.

Also, the substrates 52, 82, 143, and 174 are respectively made of LiTaO₃ or LiNbO₃. However, ferromagnetic material such as KNbO₃ and KTiOPO₄ and organic material such as MNA are appliable.

17. SEVENTEENTH EMBODIMENT:

A seventeenth embodiment is described with reference to FIGS. 46, 47.

Figure 46:
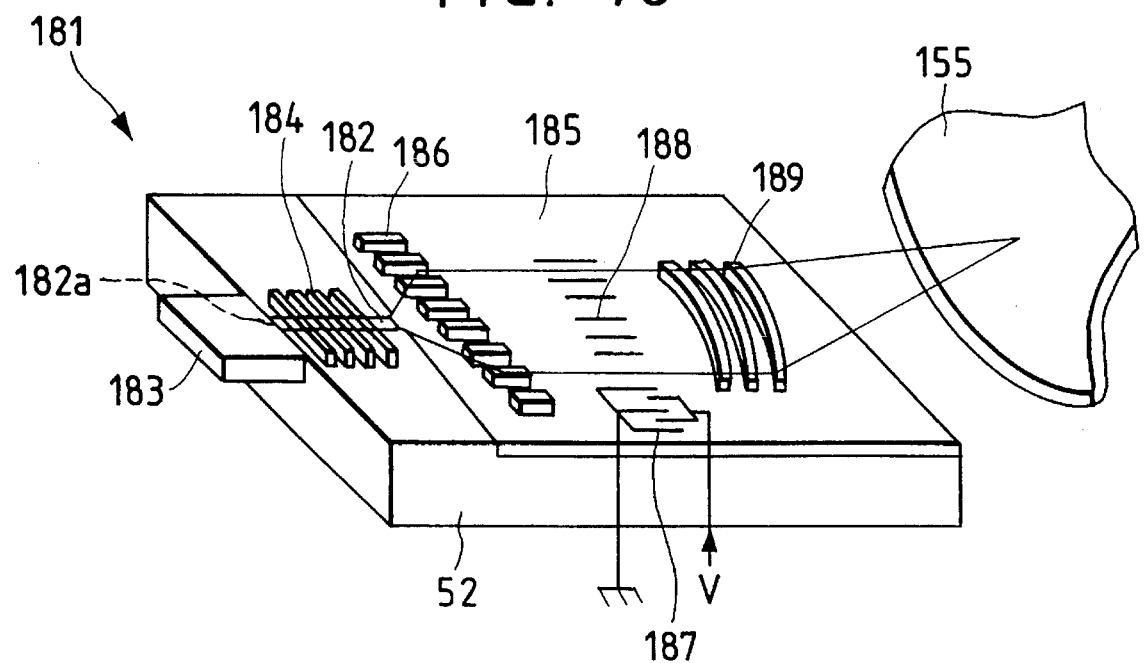
FIG. 46 is a diagonal view of an integrated optical circuit according to the seventeenth embodiment of the present invention.

FIG. 46 is a diagonal view of an integrated optical circuit according to a seventeenth embodiment of the present invention.

As shown in FIG. 46, an integrated optical circuit 181 comprises the substrate 52, a three-dimensional optical waveguide 182 arranged in an upper side of the substrate 52 for confining coherent light transmitting from an incident end facet 182a to an output end facet 182b in longitudinal and lateral directions, a semiconductor laser 183 attached closely to the incident end facet 182a for radiating the coherent light, a plurality of Ta₂O₅ grating elements 184 periodically arranged on the LiTaO₃ substrate 52 at regular intervals Λ1 of 1.9 μm for reflecting the coherent light transmitting through the optical waveguide 182, a slab optical waveguide 185 arranged on the substrate 52 for transmitting the coherent light radiated from the output end facet 182b, a grating lens 186 arranged on the slab optical waveguide 185 for collimating the coherent light radiated from the output end facet 182b, an optical deflecting device 187 arranged on the slab optical waveguide 185 for radiating elastic waves 188 into the slab optical waveguide 185 to deflect the coherent light collimated by the grating lens, and a grating coupler 189 arranged on the slab optical waveguide 185 for converging the coherent light deflected by the optical deflecting device 187 at the optical disk 155.

The optical waveguide 182 is formed by exchanging a part of Li⁺ ions of the substrate 52 for H⁺ ions, and the optical waveguide 182 has a thickness of 1.9 μm and a length of 3 mm. Therefore, an effective refractive index of the optical waveguide 182 is slightly higher than that of the substrate 52 to confine light in the optical waveguide 182.

The grating lens 186 is formed by a series of grating elements arranged in a direction vertical to a propagation direction of the coherent light. The optical deflecting device 187 is formed by a pair of comb electrodes. One of the comb electrodes is connected to an electric source, and another comb electrode is grounded. Therefore, when an electric potential is applied to one comb electrode, elastic waves are periodically radiated to the slab optical waveguide 185. The grating coupler 189 is formed by a plurality of arch-grating elements concentrically arranged.

In the above configuration, coherent light radiated from the semiconductor laser 183 is directly coupled to the optical waveguide 182. Thereafter, a part of the coherent light is reflected by the grating 184 and is fed back to the semiconductor laser 183. Therefore, the semiconductor laser 183 radiates the coherent light of which the wavelength $\lambda_c (= 2*N*\Lambda 1/m, m=10)$ is fixed to a particular value determined by the regular intervals Λ1 of the grating elements 184 and the effective refractive index N of the optical waveguide 182. In contrast, remaining part of the coherent light is radiated from the output end facet 182b to the slab optical waveguide 185. Thereafter, the coherent light is collimated by the grating lens 186 and is deflected by the elastic waves radiated from the optical deflecting device 187. Thereafter, the coherent light is converged at the optical disk 155 by the grating coupler 189.

Accordingly, the coherent light of which the wavelength is fixed can be converged at a point.

Also, even though the grating lens 186 and the grating coupler 189 are made of Ta₂O₅ which has a large wavelength dispersion coefficient, the coherent light can be focused at a focal point because the wavelength of the coherent light is reliably fixed.

Also, because the three-dimensional optical waveguide 182 is arranged, the coherent light reflected by the grating 184 can be smoothly fed back to the semiconductor laser 183.

Next, a manufacturing method of the integrated optical circuit 181 is described.

The LiTaO₃ substrate 52 is immersed in a pyrophosphoric acid (H₄P₂O₇) solution to form the optical waveguide 182 and the slab optical waveguide 185 according to a proton-exchange process. Thereafter, Ta₂O₅ is deposited on the entire surface of the optical waveguide 182, the slab optical waveguide 185, and the substrate 52 to form a Ta₂O₅ film. Thereafter, the Ta₂O₅ film is patterned according to an electron beam lithography and a dry etching. Therefore, the grating 184, the grating lens 186, and the grating coupler 189 are simultaneously formed. Thereafter, metal material is deposited on the slab optical waveguide 185, and the metal material is patterned to form optical deflecting device 187. Thereafter, the semiconductor laser 183 is attached to the substrate 52.

Accordingly, because an integrated circuit consisting of the grating 182, the grating lens 186, the optical deflecting device 187, and the grating coupler 189 are compactly arranged on the slab optical waveguide 185 and the substrate 52, the integrated optical circuit 181 can be manufactured in a small size.

Next, optical characteristics of the integrated optical circuit 181 is described.

The reflection efficiency of the grating 184 is only 10%. Though the reflection efficiency is not high, the value 10% is enough to stably fix the wavelength of the coherent light radiated from the semiconductor laser 183 because the semiconductor laser 183 is arranged closed to the optical waveguide 182.

Figure 47:
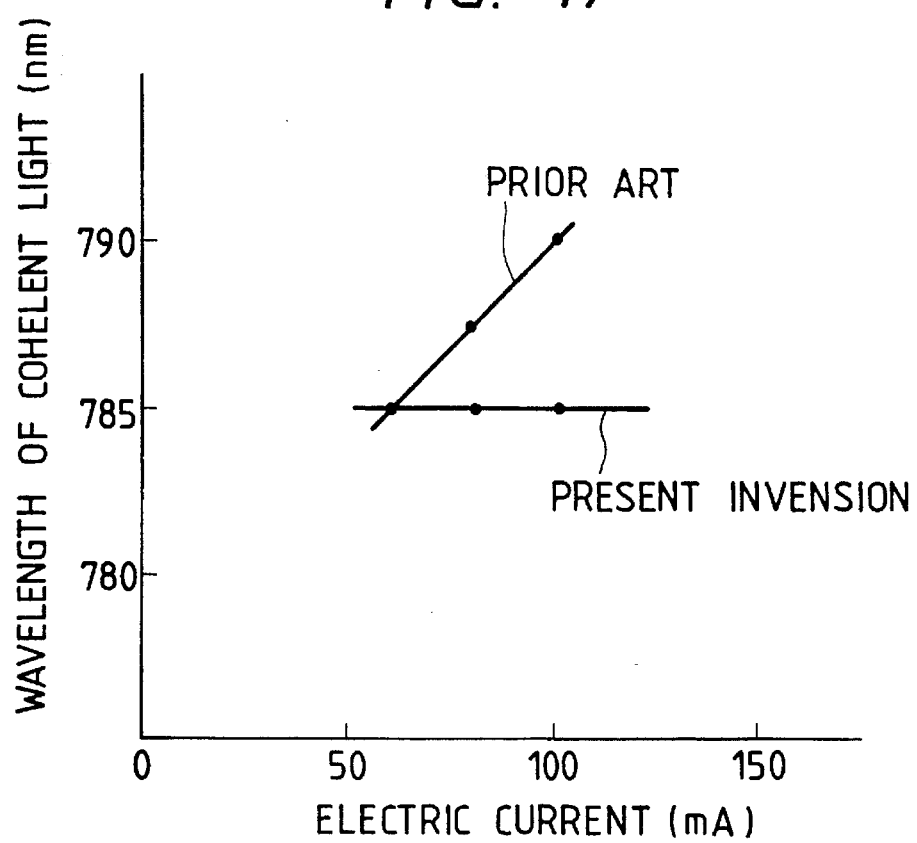
FIG. 47 graphically shows relation between driving current supplied to a semiconductor laser and wavelength $\lambda_c$ of coherent light radiated from the semiconductor laser shown in FIG. 46.

FIG. 47 graphically shows relation between a driving current supplied to the semiconductor laser 183 and the wavelength $\lambda_c$ of the coherent light radiated from the semiconductor laser 183.

As shown in FIG. 47, the wavelength $\lambda_c$ of the coherent light conventionally varies by 5 nm when the driving current changes by 50 mA. However, no variation of the wavelength $\lambda_c$ of the coherent light is observed in the circuit 181 according to the present invention.

Accordingly, because the wavelength $\lambda_c$ of the coherent light is stably fixed, the coherent light obtained in the circuit 181 can be useful.

18. EIGHTEENTH EMBODIMENT:

An eighteenth embodiment is described with reference to FIG. 48.

Figure 48:
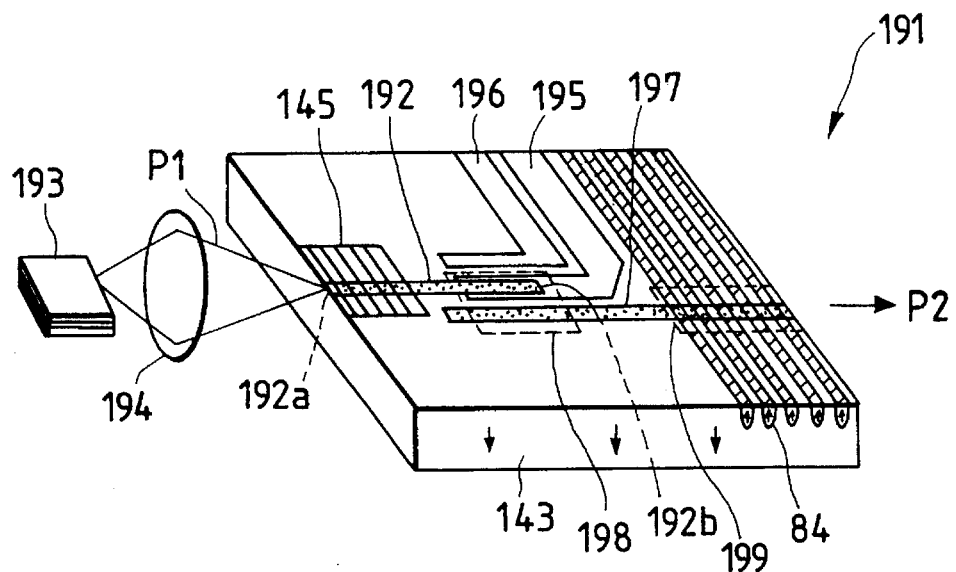
FIG. 48 is a diagonal view of an integrated optical circuit according to an eighteenth embodiment of the present invention.

FIG. 48 is a diagonal view of an integrated optical circuit according to an eighteenth embodiment of the present invention.

As shown in FIG. 48, an integrated optical circuit 191 comprises the LiNbO$_3$ substrate 143, a first three-dimensional optical waveguide 192 arranged in an upper side of the substrate 143 for confining coherent light transmitting from an incident end facet 192a to an output end facet 192b in longitudinal and lateral directions, the Ta$_2$O$_5$ grating elements 145 arranged at grating intervals $\Lambda 1$ in the neighborhood of the incident end facet 192a, a semiconductor laser 193 for radiating 840 nm wavelength fundamental waves P1, a converging lens 194 for converging the fundamental waves P1 at the incident end facet 192a of the first optical waveguide 192, a first electrode 195 arranged on the first optical waveguide 192 which is positioned in the neighborhood of the output end facet 192b, a second electrode 196 arranged on the substrate 143, a second three-dimensional optical waveguide 197 arranged in parallel closely to the first optical waveguide 192 for transmitting the fundamental waves P1 transferred from the first optical waveguide 192, and the inverted-polarization layers 84 arranged at matching intervals $\Lambda 2$ to cross the second optical waveguide 197.

A region in which the first optical waveguide 192 covered by the first electrode 195 and the second optical waveguide 197 are parallel closely to each other is called a light modulating region 198, and another region in which the second optical waveguide 197 and the inverted-polarization layers 84 cross each other is called a wavelength changing region 199.

An allowed wavelength width $\Delta\lambda$ for the fundamental waves P1 is 0.3 nm to change the fundamental waves P1 to second harmonic waves P2 in the wavelength changing region 199.

The regular intervals $\Lambda 1$ of the grating elements 145 are set to 0.19 µm to satisfy the DBR condition $\Lambda 1=m*\lambda_f/(2N)$. Here the wavelength $\lambda_f$ of the fundamental waves P1 is 840 nm and the refractive index N of the optical waveguide 192 is 2.2. Therefore, the grating number m becomes equal to 1, so that the fundamental waves transmits through the optical waveguides 192, 197 in a single mode.

The optical waveguide 192 is formed by exchanging a part of Li$^{30}$ ions of the substrate 143 for H$^+$ ions. Therefore, an effective refractive index of the optical waveguide 192 is slightly higher than that of the substrate 143 to confine light in the optical waveguide 192. Also, because the electro-optic effect on LiNbO$_3$ is very large, the refractive index of the optical waveguide 192 greatly changes by inducing electric field in the optical waveguide 192.

The first electrode 195 has a width of 4 µm and a thickness of 200 nm, and a positive electric potential is applied to the first electrode 195 to decrease the refractive index of the first optical waveguide 192 in the light modulating region 198. The second electrode 196 is grounded. Also, the distance between the electrodes 195, 196 is 5 µm.

In the above configuration, fundamental waves P1 radiated from the semiconductor laser 193 transmit through the first optical waveguide 192, and a part of the fundamental waves P1 are reflected by the grating 145 and are fed back to the semiconductor laser 193. Therefore, the wavelength $\lambda_f$ of the fundamental waves P1 radiated from the semiconductor laser 193 is fixed to 840 nm, and the fluctuation of the wavelength $\lambda_f$ ranges within the allowed wavelength width $\Delta\lambda$=0.3 nm.

Thereafter, in cases where no electric potential is applied to the first electrode 195, a remaining part of the fundamental waves P1 are transferred to the second optical waveguide 197 in the light modulating region 198 because both optical waveguides 192, 197 are coupled according to an electromagnetic coupling. Thereafter, the fundamental waves P1 transferred are changed to second harmonic waves P2 in the wavelength changing region 199. Therefore, the second harmonic waves P2 are output.

In contrast, in cases where a positive electric potential is applied to the first electrode 195, the refractive index of the first optical waveguide 192 in the light modulating region 198 is decreased. Therefore, the remaining part of the fundamental waves P1 transmit to the substrate 143 because the fundamental waves P1 are coupled to a radiation mode. As a result, no harmonic wave P2 is output.

For example, when the electric potential V1 applied to the first electrode 195 is 10 V, the intensity of the electric field becomes 2×10$^6$ V/m so that time refractive index of the first optical waveguide 192 decreases by 10$^{-4}$. Therefore, the fundamental waves P1 are not transferred to the second optical waveguide 197. Also, when a pulsated electric potential having a peak voltage 10 V is repeatedly applied to the first electrode 192 at a cycle of 2 ns (a frequency of 500 MHz), the intensity of the second harmonic waves P2 output from the second optical waveguide 197 is modulated at a frequency of 500 MHz, and the wavelength $\lambda_h$ of the second harmonic waves P2 is stably fixed to 420 nm.

Accordingly, the second harmonic waves P2 modulated can be reliably obtained.

Also, even though an ambient temperature or a driving current applied to the semiconductor laser 193 fluctuates, the wavelength of the second harmonic waves P2 can be stably maintained Also, because a light reflecting region consisting of the grating 145, the light modulating region 198, and the wavelength changing region 197 are compactly arranged on the substrate 143, the integrated optical circuit 191 can be efficiently manufactured in a small size.

In the eighteenth embodiment, the substrate 143 is made of LiNbO$_3$ because the electro-optic effect on LiNbO$_3$ is very large. However, material of the substrate 143 is not limited to LiNbO$_3$. For example, a ferroelectric substance such as LiTaO$_3$ can be appliable.

Also, the grating 145 made of Ta$_2$O$_5$ is formed by etching a Ta$_2$O$_5$ film according to a photolithography process and a dry etching process. However, the material of the grating 145 is not limited to Ta$_2$O$_5$. Also, the manufacturing method of the grating 145 is not limited to the dry etching process. For example, the grating 54 shown in FIG. 8A is appliable.

19. NINETEENTH EMBODIMENT:

A nineteenth embodiment is described with reference to FIG. 49.

Figure 49:
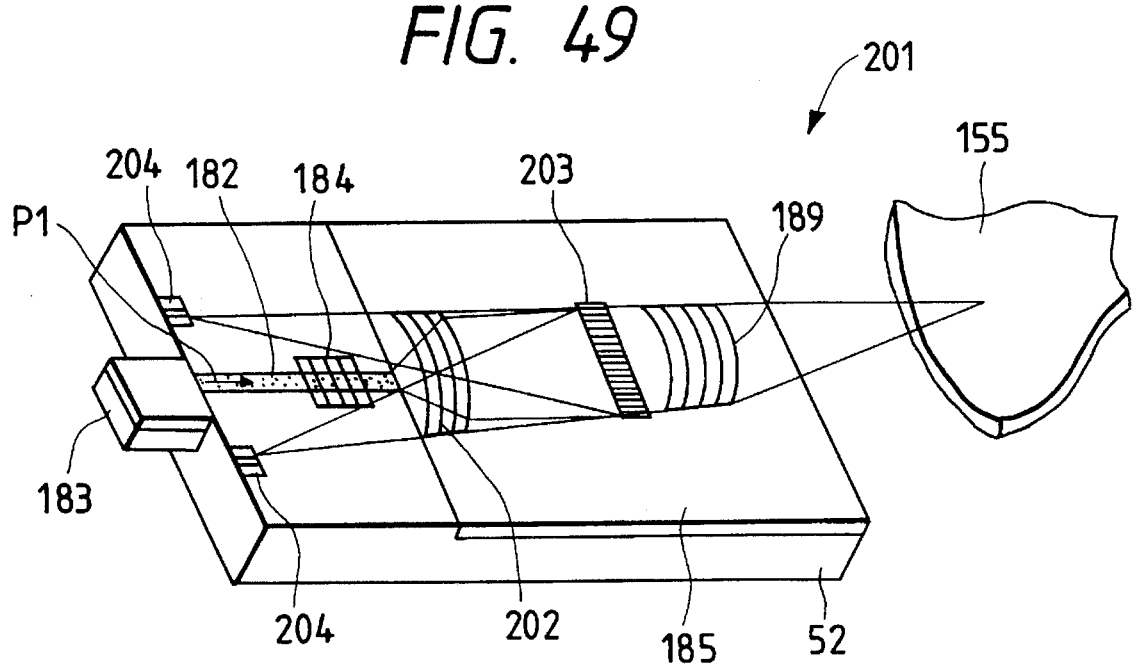
FIG. 49 is a diagonal view of an integrated optical circuit according to a nineteenth embodiment of the present invention.

FIG. 49 is a diagonal view of an integrated optical circuit according to a nineteenth embodiment of the present invention.

As shown in FIG. 49, an integrated optical circuit 201 comprises the LiTaO$_3$ substrate 52 of 10 mm square, the three-dimensional optical waveguide 182, the semiconductor laser 183, the Ta$_2$O$_5$ grating 184, the slab optical waveguide 185, a grating lens 202 arranged on the slab optical waveguide 185 for collimating coherent light P1 radiated from the output end facet 182b, a grating beam splitter 203 for passing the coherent light P1 collimated and splitting the coherent light P1 reflected in two, the grating coupler 189 for converging the coherent light P1 passing through the splitter 203 at the optical disk 155, and a pair of Si detectors 204 for detecting the intensity of the coherent light P1 splitted by the splitter 203.

The grating lens 202 and the grating beam splitter 203 are respectively formed by a plurality of Ta$_2$O$_5$ arch-grating elements regularly arranged. The grating beam splitter 203 is formed by a series of Ta$_2$O$_5$ grating elements arranged in a direction vertical to a propagation direction of the coherent light.

In the above configuration, coherent light P1 radiated from the semiconductor laser 183 is directly coupled to the optical waveguide 182 and transmits through the optical waveguide 182 at a transverse magnetic (TM$_{oo}$) mode equivalent to a lowest-order mode. Thereafter, a part of the coherent light P1 is reflected by the grating 184 and is fed back to the semiconductor laser 183. Therefore, the semiconductor laser 183 radiates the coherent light P1 of which the wavelength is fixed to a particular value determined by the regular intervals Λ1 of the grating elements 184 and the refractive index N of the optical waveguide 182. In contrast, remaining part of the coherent light P1 is radiated from the output end facet 182a to the slab optical waveguide 185. Thereafter, the coherent light P1 is collimated by the grating lens 202 and passes through the grating beam splitter 203. Thereafter, the coherent light P1 is converged at the optical disk 155 by the grating coupler 189 to form a converging spot of 1.1 μm in diameter and is reflected by the optical disk 155. Thereafter, the reflected light passes through the coupler 189 and is splitted in two beams by the splitter 203. Each of the beams is converged by the grating lens 202 and is detected by the Si detector 204.

A relative intensity of noise (RIN) to an information signal is −140 dB/Hz. Therefore, the information signal can be clearly obtained.

The information reading or writing operation is stably performed in a temperature range from 0° to 50° C. even though an ambient temperature or a driving current applied to the semiconductor laser 183 fluctuates.

In the nineteenth embodiment, two grating lenses 189, 202 are utilized to converge the coherent light P1. However, it is appliable that a single lens be utilized. Also, it is appliable that a wavelength changing region consisting of the inverted-polarization layers 84 be arranged.

Also, the substrates 52, 143 are respectively made of LiTaO$_3$ or LiNbO$_3$ in the seventeenth to nineteenth embodiment. However, ferromagnetic material such as KNbO$_3$ and KTiOPO$_4$ and organic material such as MNA are appliable.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A diffracting device comprising:

a substrate;

an optical waveguide arranged in the substrate for transmitting coherent light from an incident side to an output side;

a grating composed of a series of parallel grating elements which are periodically arranged adjacent to the optical waveguide at regular intervals in a propagation direction of the coherent light transmitting through the optical waveguide, the grating elements being made of a soft material which has high workability, and a first refractive index of the grating being equal to N1; and a covering layer arranged between the grating elements for covering the grating, a second refractive index of the covering layer being equal to N2 which differs from the first refractive index N1 of the grating to form a refractive change in a periodic structure consisting of the covering layer and the grating, and a part of the coherent light being reflected in the periodic structure to diffract the coherent light;

wherein a ratio of a width of each of the grating elements in the propagation direction of the coherent light to the regular intervals Λ of the grating elements is in a first range from 0.05 to 0.24 or in a second range from 0.76 to 0.95 on condition that an equation Λ=m*λ/(2N), m=2 where the symbol λ is a wavelength of the coherent light and the symbol N is an effective refractive index of the optical waveguide.

2. A diffracting device, comprising:

a substrate made of a non-linear crystal, the substrate being polarized in a first direction:

an optical waveguide arranged in the substrate for transmitting coherent light radiated from a light source from an incident side to an output side, the optical waveguide extending in a propagation direction perpendicular to the first direction;

a plurality of inverted polarization layers periodically arranged in the substrate at regular grating intervals in the propagation direction to cross the optical waveguide, a polarization direction of the inverted polarization layers being opposite to the first direction of the substrate, and the regular grating intervals being equal to a half-wave length of the coherent light or a wavelength of the coherent light to reflect the incident light without changing a wavelength of the coherent light;

an electrode arranged on the optical waveguide, in which alternate rows of the inverted polarization layers and the substrate are arranged, for inducing an electric field which penetrates through the inverted polarization layers and the substrate to change a first refractive index of the inverted polarization layers and to change a second refractive index of the substrate, increase or decrease of the first refractive index being opposite to that of the second refractive index to produce a diffraction grating formed by periodic change of the first and second refractive indexes in the alternate rows, an average refractive index of the diffraction grating being constant regardless of a degree of the change of the first and second refractive indexes, and a part of the coherent light being reflected in the diffracting grating toward the light source through the incident side of the optical waveguide; and an electric source for applying a constant electric potential to the electrode.

3. A diffracting device according to claim 2 in which a width Wa of the inverted polarization layer in the propagation direction and the regular intervals $\Lambda$ satisfy a relationship $Wa_{\neq \Lambda} - Wa$ to change the average refractive index of the diffraction grating, the wavelength of the coherent light reflected in the diffraction grating being changed.

4. A diffracting device according to claim 2 in which a depth Da of the inverted polarization layer in the first direction and a depth Dw of the optical waveguide in the first direction satisfy a relation Da<Dw.

5. A diffracting device according to claim 2 in which the substrate is made of $LiTa_{(1-x)}Nb_xO_3$ ($0 \leq X \leq 1$).

6. A diffracting device according to claim 2 in which the optical waveguide is formed by exchanging a part of $Li^+$ ions included in the substrate for $H^+$ ions.

7. A diffracting device, comprising:

a substrate;

an optical waveguide arranged in the substrate for transmitting coherent light radiated from a light source from an incident side to an output side;

a grating, which is composed of a series of parallel grating elements periodically arranged adjacent to the optical waveguide at regular intervals in a propagation direction of the coherent light transmitting through the optical waveguide, for reflecting a part of the coherent light spreading outside the optical waveguide toward the light source through the incident side of the optical waveguide, a ratio of a width of each of the grating elements in the propagation direction to the regular intervals $\Lambda$ of the grating elements is in a first range from 0.05 to 0.24 or in a second range from 0.76 to 0.95 on condition that an equation $\Lambda = m*\lambda/(2N)$, m=2 where the symbol $\lambda$ is a wavelength of the coherent light and the symbol N is an effective refractive index of the optical waveguide.

8. A wavelength changing device, comprising;

a substrate made of a non-linear crystal, the substrate being polarized in a first direction;

an optical waveguide arranged in the substrate for transmitting fundamental waves, the optical waveguide extending in a propagation direction perpendicular to the first direction;

a plurality of inverted polarization layers periodically arranged in the substrate at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate;

a grating composed of a series of parallel grating elements which are periodically arranged on the optical waveguide at grating intervals in the propagation direction, the grating being made of a soft material which has high workability, and a first refractive index of the grating being equal to N1; and a covering layer arranged between the grating elements for covering the grating, a second refractive index of the covering layer being equal to N2 which differs from the first refractive index N1 of the grating to form a refractive change in a periodic structure consisting of the covering layer and the grating, and the fundamental waves which do not change to the second harmonic waves in the alternate rows being reflected in the periodic structure.

9. A wavelength changing device according to claim 8 in which the soft material of the grating is a photoresist material, the grating being patterned by exposing the photoresist material to exposing light before the photoresist material is developed to remove exposed areas of the photoresist material.

10. A wavelength changing device according to claim 8 in which the first refractive index N1 of the grating is smaller than the second refractive index N2 of the covering layer.

11. A wavelength changing device according to claim 8 in which the grating intervals $\Lambda 1$ of the grating satisfy a distributed Bragg condition $\Lambda 1 = m*\lambda_f/(2N)$, m=1 or 2 where the symbol $\lambda_f$ is a wavelength of the fundamental waves and the symbol N is an effective refractive index of the optical waveguide, and the phase-matching intervals $\Lambda 2$ of the inverted polarization layers satisfy a quasi-phase matching condition $\Lambda 2 = \lambda_f/\{2*(N2\omega - N\omega)\}$ where the symbol $N2\omega$ is a refractive index of the alternate rows for the second harmonic waves and the symbol $N\omega$ is a refractive index of the alternate rows for the fundamental waves.

12. A wavelength changing device according to claim 8 in which the grating is locally arranged in the neighborhood of an incident side of the optical waveguide in which the second harmonic waves do not exist, and the inverted polarization layers are locally arranged in the neighborhood of an output side of the optical waveguide through which the fundamental waves not changing to the second harmonic waves transmit.

13. A wavelength changing device according to claim 8 in which a ratio of a width of each of the grating elements in the propagation direction of the fundamental waves to the grating intervals $\Lambda 1$ of the grating elements is in a first range from 0.05 to 0.24 or in a second range from 0.76 to 0.95 on condition that an equation $\Lambda 1 = m*\lambda_f/(2N)$, m=2 where the symbol $\lambda_f$ is a Wavelength of the fundamental waves and the symbol N is an effective refractive index of the optical waveguide.

14. A wavelength changing device according to claim 8 in which the covering layer is made of a material selected from the group consisting of $Ta_2O_5$, $TiO_2$, and SiN.

15. A wavelength changing device according to claim 8 in which the substrate is made of $LiTa_{(1-x)}Nb_xO_3$ ($0 \leq X \leq 1$).

16. A wavelength changing device according to claim 8 in which the optical waveguide is formed by exchanging a part of $Li^+$ ions included in the substrate for $H^+$ ions.

17. A wavelength changing device, comprising;

a substrate made of a non-linear crystal, the substrate being polarized in a first direction;

an optical waveguide arranged in the substrate for transmitting fundamental waves, the optical waveguide extending in a propagation direction perpendicular to the first direction;

a plurality of inverted polarization layers periodically arranged in the substrate at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate;

a dielectric film arranged on the optical waveguide for confining the second harmonic waves which spread outside the optical waveguide, the fundamental waves spreading outside the optical waveguide and the dielectric film; and a grating which is composed of a series of parallel grating elements periodically arranged on the dielectric film at grating intervals in the propagation direction, the fundamental waves which spread outside the dielectric film being reflected by the grating.

18. A wavelength changing device according to claim 17 in which a product of a thickness T μm of the dielectric film and an effective refractive index n of the dielectric film ranges from 0.06 to 0.15 (0.06<nT μm<0.15).

19. A wavelength changing device according to claim 17 in which the dielectric film is made of a material selected from the group consisting of $SiO_2$, $Ta_2O_5$, $Ti_2O_5$, SiN, and $LiNbO_3$.

20. A wavelength changing device according to claim 17 in which the grating intervals Λ1 of the grating elements satisfy a distributed Bragg condition $\Lambda 1=m*\lambda_f/(2N)$ (m Is a natural number) where the symbol $\lambda_f$ is a wavelength of the fundamental waves and the symbol N is an effective refractive index of the optical waveguide, and the phase-matching intervals Λ2 of the inverted polarization layers satisfy a quasi-phase matching condition $\Lambda 2=\lambda_f/\{2*(N2\omega-N\omega)\}$ where the symbol N2ω is a refractive index of the alternate rows for the second harmonic waves and the symbol Nω is a refractive index of the alternate rows for the fundamental waves.

21. A wavelength changing device according to claim 17 in which a ratio of a width of each of the grating elements in the propagation direction of the fundamental waves to the grating intervals Λ1 of the grating elements is in a first range from 0.05 to 0.24 or in a second range from 0.76 to 0.95 on condition that an equation $\Lambda 1=m*\lambda_f/(2N)$, m=2 where the symbol $\lambda_f$ is a wavelength of the fundamental waves and the symbol N is an effective refractive index of the optical waveguide.

22. A wavelength changing device according to claim 17 in which the substrate is made of $LiTa_{(1-x)}Nb_xO_3$ ($0 \leq X \leq 1$).

23. A wavelength changing device according to claim 17 in which the optical waveguide is formed by exchanging a part of $Li^+$ ions included in the substrate for $H^+$ ions.

24. A wavelength changing device, comprising;
   a substrate made of a non-linear crystal, the substrate being polarized in a first direction;
   an optical waveguide arranged in the substrate for transmitting fundamental waves radiated from a light source, the optical waveguide extending in a propagation direction perpendicular to the first direction;
   a plurality of inverted polarization layers periodically arranged in the substrate at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate; and
   a grating, which is composed of a series of parallel grating elements periodically arranged on a side of the optical waveguide at grating intervals in the propagation direction, for reflecting a part of the fundamental waves spreading outside the optical waveguide toward the light source to fix a wavelength of the fundamental waves radiated from the light source.

25. A wavelength changing device according to claim 24 in which the grating intervals Λ1 of the grating elements satisfy a distributed Bragg condition $\Lambda 1=m*\lambda_f/(2N)$ (m is a natural number) where the symbol $\lambda_f$ Is a wavelength of the fundamental waves and the symbol N is an effective refractive index of the optical waveguide, and the phase-matching intervals Λ2 of the inverted polarization layers satisfy a quasi-phase matching condition $\Lambda 2=\lambda_f/\{2*(N2\omega-N\omega)\}$ where the symbol N2ω is a refractive index of the alternate rows for the second harmonic waves and the symbol Nω is a refractive index of the alternate rows for the fundamental waves.

26. A wavelength changing device according to claim 24 in which a ratio of a width of each of the grating elements in the propagation direction of the fundamental waves to the grating intervals Λ1 of the grating elements is in a first range from 0.05 to 0.24 or in a second range from 0.76 to 0.95 on condition that an equation $\Lambda 1=m*\lambda_f/(2N)$, m=2 where the symbol $\lambda_f$ is a wavelength of the fundamental waves and the symbol N is an effective refractive index of the optical waveguide.

27. A wavelength changing device according to claim 24 in which the substrate is made of $LiTa_{(1-x)}Nb_xO_3$ ($0 \leq X \leq 1$).

28. A wavelength changing device according to claim 24 in which the optical waveguide is formed by exchanging a part of $Li^+$ ions included in the substrate for $H^+$ ions.

29. A wavelength changing device, comprising:
   a substrate made of a non-linear crystal, the substrate being polarized in a first direction;
   an optical waveguide arranged in the substrate for transmitting fundamental waves, the optical waveguide extending in a propagation direction perpendicular to the first direction:
   a plurality of first inverted polarization layers periodically arranged in the substrate at phase-matching intervals in the propagation direction to cross the optical waveguide, a polarization direction of the first inverted polarization layers being opposite to the first direction of the substrate, a part of the fundamental waves changing to second harmonic waves in alternate rows of the first inverted polarization layers and the substrate;
   a plurality of second inverted polarization layers periodically arranged In the substrate at grating intervals in the propagation direction to cross the optical waveguide, a polarization direction of the second inverted polarization layers being opposite to the first direction of the substrate;
   an electrode arranged on the optical waveguide, in which a periodic structure of the second inverted polarization layers and the substrate are arranged, for inducing electric field which penetrates through the second inverted polarization layers and the substrate to change a first refractive index of the second inverted polarization layers and to change a second refractive index of the substrate, increase or decrease of the first refractive index being opposite to that of the second refractive index to produce a diffraction grating formed by periodic change of the first and second refractive indexes in the periodic structure, and another part of the fundamental waves being reflected in the diffraction grating; and
   an electric source for applying an electric potential to the electrode.

30. A wavelength changing device according to claim 29 in which the electric potential applied to the electrode is periodically switched on and off to modulate the second harmonic waves output from the optical waveguide.

31. A wavelength changing device according to claim 29 in which the grating intervals Λ1 of the second inverted polarization layers satisfy a distributed Bragg condition $\Lambda 1=m*\lambda_f/(2N)$ (m is a natural number) where the symbol $\lambda_f$ is a wavelength of the fundamental waves and the symbol N is an effective refractive index of the optical waveguide, and the phase-matching intervals $\Lambda 2$ of the first inverted polarization layers satisfy a quasi-phase matching condition $\Lambda 2 = \lambda_f / \{2^*(N2\omega - N\omega)\}$ where the symbol $N2\omega$ is a refractive index of the alternate rows for the second harmonic waves and the symbol $N\omega$ is a refractive index of the alternate rows for the fundamental waves.

32. A wavelength changing device according to claim 29 in which a ratio of a width of each of the second inverted polarization layers in the propagation direction of the fundamental waves to the grating intervals $\Lambda 1$ of the second inverted polarization layers is in a first range from 0.05 to 0.24 or in a second range from 0.76 to 0.95 on condition that an equation $\Lambda 1 = m^* \lambda_f / (2N)$, $m=2$ where the symbol $\lambda_f$ is a wavelength of the fundamental waves and the symbol N is an effective refractive index of the optical waveguide.

33. A wavelength changing device according to claim 29 in which a width Wa of the second inverted polarization layer in the propagation direction and the grating intervals $\Lambda$ satisfy a relation Wa≠$\Lambda$−Wa.

34. A wavelength changing according to claim 29 in which a depth Da of the second inverted polarization layer in the first direction and a depth Dw of the optical waveguide in the first direction satisfy a relation Da<Dw.

35. A wavelength changing device according to claim 29 in which the substrate is made of $LiTa_{(1-x)}Nb_xO_3$ ($0 \leq X \leq 1$).

36. A wavelength changing device according to claim 29 in which the optical waveguide is formed by exchanging a part of $Li^+$ ions included in the substrate for $H^+$ ions.

37. A wavelength changing device, comprising;
   a substrate made of a non-linear crystal, the substrate being polarized in a first direction;
   an optical waveguide arranged in the substrate for transmitting fundamental waves radiated from a light source from an incident side to an output side, the optical waveguide extending in a propagation direction perpendicular to the first direction;
   a grating, which is composed of a series of parallel grating elements periodically arranged on the optical waveguide at grating intervals in the propagation direction, for reflecting a part of the fundamental waves spreading outside the optical waveguide toward the light source through the incident side of the optical waveguide to fix a wavelength of the fundamental waves radiated from the light source, the grating being locally positioned in the neighborhood of the incident side of the optical waveguide; and
   a plurality of inverted polarization layers periodically arranged in the substrate at phase-matching intervals in the propagation direction to cross the optical waveguide, a polarization direction of the inverted polarization layers being opposite to the first direction of the substrate, a remaining part of the fundamental waves changing to second harmonic waves in alternate rows of the inverted polarization layers and the substrate.

38. A wavelength changing device according to claim 37 in which the inverted polarization layers are locally positioned in the neighborhood of the output side of the optical waveguide to prevent the second harmonic waves changed in the alternate rows from being lost.

39. A wavelength changing device, comprising:
   a substrate made of a non-linear crystal, the substrate being polarized in a first direction;
   an optical waveguide arranged in the substrate for transmitting fundamental waves radiated from a light source, the optical waveguide extending in a propagation direction perpendicular to the first direction:
   a grating, which is composed of a series of parallel grating elements periodically arranged on the optical waveguide at grating intervals $\Lambda 1$ in the propagation direction, for reflecting a part of the fundamental waves spreading outside the optical waveguide toward the light source to fix a wavelength of the fundamental waves radiated from the light source, a ratio of a width of each of the grating elements in the propagation direction to the grating intervals $\Lambda 1$ of the grating elements is in a first range from 0.05 to 0.24 or in a second range from 0.76 to 0.95 on condition that an equation $\Lambda 1 = m^* \lambda_f / (2N)$, $m=2$ where the symbol $\lambda_f$ is a wavelength of the fundamental waves and the symbol N is an effective refractive index of the optical waveguide; and
   a plurality of inverted polarization layers periodically arranged in the substrate at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate.

40. A method for manufacturing a wavelength changing device, comprising the steps of:
   preparing a substrate made of a non-linear crystal, the substrate being polarized in a first direction;
   forming an optical waveguide in the substrate to transmit fundamental waves radiated from a light source, the optical waveguide extending in a propagation direction perpendicular to the first direction of the substrate;
   periodically arranging a plurality of inverted polarization layers in the substrate at phase-matching intervals in the propagation direction to cross the optical waveguide, a polarization direction of the inverted polarization layers being opposite to the first direction of the substrate, polarization layers being arranged between the inverted a part of the fundamental waves changing to second harmonic waves in alternate rows of the inverted polarization layers and the substrate;
   patterning a soft material on the optical waveguide to form a grating which is composed of a series of parallel grating elements periodically arranged at grating intervals in the propagation direction of the fundamental waves, the soft material having high workability, and a first refractive index of the grating being equal to N1; and
   arranging a covering layer between the grating elements to cover the grating, a second refractive index of the covering layer being equal to N2 which differs from the first refractive index N1 of the grating to form a refractive change in a periodic structure consisting of the covering layer and the grating, and the fundamental waves which do not change to the second harmonic waves in the alternate rows being reflected in the periodic structure toward the light source to fix wavelength of the fundamental waves radiated from the light source.

41. A method according to claim 40 in which the step of patterning a soft material includes:
   preparing a photoresist material as the soft material;
   arranging the photoresist material on the optical waveguide to form a photoresist film;
   exposing grating pattern areas of the photoresist film to exposing light;

developing the photoresist film exposed; and removing the grating pattern areas of the photoresist film developed to form the grating made of the photoresist material.

42. A method according to claim 40 in which the first refractive index N1 of the grating is smaller than the second refractive index N2 of the covering layer.

43. A method according to claim 40 in which the grating intervals Λ1 of the grating elements satisfy a distributed Bragg condition Λ1=m*$\lambda_f$/(2N), m=1 or 2 where the symbol $\lambda_f$ is a wavelength of the fundamental waves and the symbol N is an averaged refractive index of the periodic structure, and the phase-matching intervals Λ2 of the inverted polarization layers satisfy a quasi-phase matching condition Λ2=$\lambda_f$/{2*(N2ω–Nω)} where the symbol N2ω is a refractive index of the alternate rows for the second harmonic waves and the symbol Nω is a refractive index of the alternate rows for the fundamental waves.

44. A method according to claim 40 in which the step of patterning a soft material includes:

adjusting a ratio of a width of each of the grating elements in the propagation direction of the fundamental waves to the grating intervals of the grating elements in a first range from 0.05 to 0.24 or in a second range from 0.76 to 0.95.

45. A method according to claim 40 in which the covering layer is made of a material selected from the group consisting of $Ta_2O_5$, $TiO_2$, SiN, burning type metallic oxide such as $TiO_2$.

46. A method according to claim 40 in which the substrate is made of $LiTa_{(1-x)}Nb_xO_3$ (0≦X≦1).

47. A method according to claim 40 in which the optical waveguide is formed by exchanging a part of $Li^+$ ions included in the substrate for $H^+$ ions.

48. A laser beam generating apparatus comprising:

a semiconductor laser for radiating a beam of coherent light consisting of fundamental waves; and a diffracting device for fixing a wavelength of the coherent light radiated from the semiconductor laser, the diffracting device including (1) a substrate, (2) an optical waveguide arranged in the substrate for transmitting the coherent light radiated from the semiconductor laser from an incident side to an output side, (3) a grating which is composed of a series of parallel grating elements periodically arranged adjacent to the optical waveguide at grating intervals in a propagation direction of the coherent light transmitting through the optical waveguide, the grating being made of a soft material which has high workability, and a first refractive index of the grating being equal to N1, and (4) a covering layer arranged between the grating elements for covering the grating, a second refractive index of the covering layer being equal to N2 which differs from the first refractive index N1 of the grating to form a refractive change in a periodic structure consisting of the covering layer and the grating, a part of the coherent light being reflected by the periodic structure to the semiconductor laser to fix the wavelength of the coherent light radiated from the semiconductor laser, and the coherent light of which the wavelength is fixed being output from the output side of the optical waveguide;

wherein a ratio of a width of each of the grating elements in the propagation direction of the coherent light to the grating intervals Λ of the grating elements is in a first range from 0.05 to 0.24 or in a second range from 0.76 to 0.95 on condition that an equation Λ=m*λ/(2N), m=2 where the symbol λ is a wavelength of the coherent light and the symbol N is an effective refractive index of the optical waveguide.

49. A laser beam generating apparatus according comprising:

a semiconductor laser for radiating a beam of coherent light consisting of fundamental waves; and a diffracting device for fixing a wavelength of the coherent light radiated from the semiconductor laser, the diffracting device including (1) a substrate, (2) an optical waveguide arranged in the substrate for transmitting the coherent light radiated from the semiconductor laser from an incident side to an output side, (3) a grating which is composed of a series of parallel grating elements periodically arranged adjacent to the optical waveguide at grating intervals in a propagation direction of the coherent light transmitting through the optical waveguide, the grating being made of a soft material which has high workability, and a first refractive index of the grating being equal to N1, and (4) a covering layer arranged between the grating elements for covering the grating, a second refractive index of the covering layer being equal to N2 which differs from the first refractive index N1 of the grating to form a refractive change in a periodic structure consisting of the covering layer and the grating, a part of the coherent light being reflected by the periodic structure to the semiconductor laser to fix the wavelength of the coherent light radiated from the semiconductor laser, and the coherent light of which the wavelength is fixed being output from the output side of the optical waveguide;

wherein the semiconductor laser has an active layer from which the coherent light is radiated, the optical waveguide has an incident taper region positioned in the neighborhood of the incident side, and the active layer of the semiconductor laser is arranged closely to the incident taper region of the optical waveguide at the same height as the incident taper region, the incident taper region being deeper than another region of the optical waveguide to receive the coherent light radiated from the active layer in the incident taper region.

50. A laser beam generating apparatus comprising:

a semiconductor laser for radiating a beam of coherent light consisting of fundamental waves;

a diffracting device for fixing a wavelength of the coherent light radiated from the semiconductor laser, the diffracting device including (1) a substrate, (2) an optical waveguide arranged in the substrate for transmitting the coherent light radiated from the semiconductor laser from an incident side to an output side, (3) a grating which is composed of a series of parallel grating elements periodically arranged adjacent to the optical waveguide at grating intervals in a propagation direction of the coherent light transmitting through the optical waveguide, the grating being made of a soft material which has high workability, and a first refractive index of the grating being equal to N1, and (4) a covering layer arranged between the grating elements for covering the grating, a second refractive index of the covering layer being equal to N2 which differs from the first refractive index N1 of the grating to form a refractive change in a periodic structure consisting of the covering layer and the grating, a part of the coherent light being reflected by the periodic structure to the semiconductor laser to fix the wavelength of the coherent light radiated from the semiconductor laser, and the coherent light of which the wavelength is fixed being output from the output side of the optical waveguide; and a plurality of inverted polarization layers periodically arranged in the substrate, which is made of a non-linear crystal polarized in a first direction perpendicular to the propagation direction, at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate.

51. A laser beam generating apparatus according to claim 50 in which the fundamental waves transmit through the optical waveguide in a single mode.

52. A laser beam generating apparatus, comprising:

a semiconductor laser for radiating a beam of coherent light consisting of fundamental waves; and a diffracting device for fixing a wavelength of the coherent light radiated from the semiconductor laser, the diffracting device including
 (1) a substrate made of a non-linear crystal, the substrate being polarized in a first direction,
 (2) an optical waveguide arranged in the substrate for transmitting the coherent light radiated from the semiconductor laser, the optical waveguide extending in a propagation direction perpendicular to the first direction from an incident side to an output side,
 (3) a plurality of inverted polarization layers periodically arranged in the substrate at grating intervals in the propagation direction to cross the optical waveguide, a polarization direction of the inverted polarization layers being opposite to the first direction of the substrate,
 (4) an electrode arranged on the optical waveguide, in which alternate rows of the inverted polarization layers and the substrate are arranged, for inducing electric field which penetrates through the inverted polarization layers and the substrate to change a first refractive index of the inverted polarization layers and to change a second refractive index of the substrate, increase or decrease of the first refractive index being opposite to that of the second refractive index to produce a diffraction grating formed by periodic change of the first and second refractive indexes in the alternate rows, a part of the coherent light being reflected in the diffracting grating to the semiconductor laser to fix the wavelength of the coherent light radiated from the semiconductor laser, and the coherent light of which the wavelength is fixed being output from the output side of the optical waveguide, and
 (5) an electric source for applying an electric potential to the electrode.

53. A laser beam generating apparatus according to claim 52 in which the grating intervals $\Lambda$ of the inverted polarization layers satisfy an equation $\Lambda = m*\lambda/(2N)$, $m=1$ or $2$ where the symbol $\lambda$ is a wavelength of the coherent light and the symbol $N$ is an effective refractive index of the optical waveguide.

54. A laser beam generating apparatus according to claim 52 in which a width Wa of the inverted polarization layer in the propagation direction and the grating intervals $\Lambda$ satisfy a relation $Wa \neq \Lambda - Wa$.

55. A laser beam generating apparatus according to claim 52 in which a depth Da of the inverted polarization layer in the first direction and a depth Dw of the optical waveguide in the first direction satisfy a relation Da<Dw.

56. A laser beam generating apparatus according to claim 52 in which the substrate is made of $LiTa_{(1-x)}Nb_xO_3$ ($0 \leq X \leq 1$).

57. A laser beam generating apparatus according to claim 52 in which the optical waveguide is formed by exchanging a part of $Li^+$ ions included in the substrate for $H^+$ ions.

58. A laser beam generating apparatus according to claim 52, additionally including:

a plurality of second inverted polarization layers periodically arranged in the substrate at phase-matching intervals in the propagation direction to cross the optical waveguide, a polarization direction of the inverted polarization layers being opposite to the first direction of the substrate, the fundamental waves changing to second harmonic waves in alternate rows of the second inverted polarization layers and the substrate.

59. A laser beam generating apparatus, comprising;

a semiconductor laser for radiating a beam of fundamental waves; and a wavelength changing device for fixing a wavelength of the fundamental waves radiated from the semiconductor laser, the wavelength changing device including
 (1) a substrate made of a non-linear crystal, the substrate being polarized in a first direction,
 (2) an optical waveguide arranged in the substrate for transmitting the fundamental waves radiated from the semiconductor laser, the optical waveguide extending in a propagation direction perpendicular to the first direction from an incident side to an output side,
 (3) a plurality of inverted polarization layers periodically arranged in the substrate at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate,
 (4) a dielectric film arranged on the optical waveguide for confining the second harmonic waves which spread outside the optical waveguide, the fundamental waves spreading outside the optical waveguide and the dielectric film, and
 (5) a grating which is composed of a series of parallel grating elements periodically arranged on the dielectric film at grating intervals in the propagation direction, the fundamental waves which spread outside the dielectric film being reflected by the grating to the semiconductor laser to fix the wavelength of the fundamental waves radiated from the semiconductor laser, and the second harmonic waves of which the wavelength is fixed being output from the output side of the optical waveguide.

60. A laser beam generating apparatus according to claim 59 in which a product of a thickness T μm of the dielectric film and an effective refractive index n of the dielectric film ranges from 0.06 to 0.15 (0.06<nT μm<0.15).

61. A laser beam generating apparatus according to claim 59 in which the dielectric film is made of a material selected from the group consisting of $SiO_2$, $Ta_2O_5$, $Ti_2O_5$, SiN, and $LiNbO_3$.

62. A laser beam generating apparatus according to claim 59 In which the grating intervals $\Lambda 1$ of the grating elements satisfy a distributed Bragg condition $\Lambda 1 = m*\lambda_f/(2N)$ (m is a natural number) where the symbol $\lambda_f$ is a wavelength of the fundamental waves and the symbol N is an effective refractive index of the optical waveguide, and the phase-matching intervals $\Lambda 2$ of the inverted polarization layers satisfy a quasi-phase matching condition $\Lambda 2 = \lambda_f/\{2*(N2\omega - N\omega)\}$ where the symbol $N2\omega$ is a refractive Index of the alternate rows for the second harmonic waves and the symbol $N\omega$ is a refractive index of the alternate rows for the fundamental waves.

63. A laser beam generating apparatus according to claim 59 in which a ratio of a width of each of the grating elements in the propagation direction of the fundamental waves to the grating intervals $\Lambda 1$ of the grating elements is in a first range from 0.05 to 0.24 or in a second range from 0.76 to 0.95 on condition that an equation $\Lambda 1 = m*\lambda_f/(2N)$, $m=2$ where the symbol $\lambda_f$ is a wavelength of the fundamental waves and the symbol N is an effective refractive index of the optical waveguide.

64. A laser beam generating apparatus according to claim 59 in which the substrate is made of $LiTa_{(1-x)}Nb_xO_3$ ($0 \leq X \leq 1$).

65. A laser beam generating apparatus according to claim 59 in which the optical waveguide is formed by exchanging a part of $Li^+$ ions included in the substrate for $H^+$ ions.

66. A laser beam generating apparatus, comprising:

a semiconductor laser for radiating a beam of coherent light consisting of fundamental waves; and a diffracting device for fixing a wavelength of the coherent light radiated from the semiconductor laser, the diffracting device including
  (1) a substrate,
  (2) an optical waveguide arranged in the substrate for transmitting the coherent light radiated from the semiconductor laser from an incident side to an output side, and
  (3) a grating, which is composed of a series of parallel grating elements periodically arranged adjacent to the optical waveguide at regular intervals in a propagation direction of the coherent light transmitting through the optical waveguide, for reflecting a part of the coherent light spreading outside the optical waveguide toward the semiconductor laser to fix the wavelength of the coherent light radiated from the semiconductor laser, a ratio of a width of each of the grating elements in the propagation direction to the regular intervals $\Lambda$ of the grating elements being in a first range from 0.05 to 0.24 or in a second range from 0.76 to 0.95 on condition that an equation $\Lambda = m*\lambda/(2N)$, $m=2$ where the symbol $\lambda$ is a wavelength of the coherent light and the symbol N is an effective refractive index of the optical waveguide, and the coherent light of which the wavelength is fixed being output from the output side of the optical waveguide.

67. A laser beam generating apparatus, comprising:

a semiconductor laser for radiating a beam of fundamental waves; and a wavelength changing device for fixing a wavelength of the fundamental waves radiated from the semiconductor laser, the wavelength changing device including
  (1) a substrate made of a non-linear crystal, the substrate being polarized in a first direction,
  (2) an optical waveguide arranged in the substrate for transmitting the fundamental waves radiated from the semiconductor laser, the optical waveguide extending in a propagation direction perpendicular to the first direction from an incident side to an output side,
  (3) a grating, which is composed of a series of parallel grating elements which are periodically arranged on the optical waveguide at grating intervals in the propagation direction and is locally positioned in the neighborhood of the incident side of the optical waveguide, for reflecting a part of the fundamental waves spreading outside the optical waveguide toward the semiconductor laser to fix the wavelength of the fundamental waves radiated from the semiconductor laser, and
  (4) a plurality of inverted polarization layers periodically arranged in the substrate at phase-matching intervals in the propagation direction to cross the optical waveguide, a polarization direction of the inverted polarization layers being opposite to the first direction of the substrate, a remaining part of the fundamental waves changing to second harmonic waves in alternate rows of the inverted polarization layers and the substrate, and the second harmonic waves of which the wavelength is fixed being output from the output side of the optical waveguide.

68. A laser beam generating apparatus, comprising:

a semiconductor laser having an active layer for radiating a beam of coherent light from the active layer; and a diffracting device for fixing a wavelength of the coherent light radiated from the semiconductor laser, the diffracting device including
  (1) a substrate,
  (2) an optical waveguide arranged in the substrate for transmitting the coherent light from an incident side to an output side, the optical waveguide having an incident taper region positioned in the neighborhood of the incident side, the active layer of the semiconductor laser being arranged closely to the incident taper region at the same height as the incident taper region, and the incident taper region being deeper than another region of the optical waveguide to receive the coherent light radiated from the active layer in the incident taper region,
  (3) a grating, which is composed of a series of parallel grating elements periodically arranged adjacent to the optical waveguide at grating intervals in a propagation direction of the coherent light transmitting through the optical waveguide, for reflecting a part of the coherent light, spreading outside the optical waveguide toward the semiconductor laser to fix the wavelength of the coherent light radiated from the semiconductor laser, the grating elements being made of a soft material which has high workability, and a first refractive index of the grating being equal to N1, and
  (4) a covering layer arranged between the grating elements for covering the grating, a second refractive index of the covering layer being equal to N2 which differs from the first refractive index N1 of the grating to form a refractive change in a periodic structure consisting of the covering layer and the grating, and a part of the coherent light being reflected in the periodic structure to diffract the coherent light.

69. An optical information processing apparatus for reading or writing information from/in an information medium, comprising:

a semiconductor laser for radiating a beam of coherent light consisting of fundamental waves;

a diffracting device for fixing a wavelength of the coherent light radiated from the semiconductor laser, the diffracting device including
  (1) a substrate,
  (2) an optical waveguide arranged in the substrate for transmitting the coherent light radiated from the semiconductor laser from an incident side to an output side,
  (3) a grating which is composed of a series of parallel grating elements periodically arranged adjacent to the optical waveguide at grating intervals in a propagation direction of the coherent light transmitting through the optical waveguide, the grating being made of a soft material which has high workability, and a first refractive index of the grating being equal to N1, and
  (4) a covering layer arranged between the grating elements for covering the grating, a second refractive index of the covering Layer being equal to N2 which differs from the first refractive index N1 of the grating to form a refractive change in a periodic structure consisting of the covering layer and the grating, a part of the coherent light being reflected by the periodic structure to the semiconductor laser to fix the wavelength of the coherent light radiated from the semiconductor laser, and the coherent light of which the wavelength is fixed being output from the output side of the optical waveguide;

an optical system for converging the coherent light output from the output side of the optical waveguide at the information medium; and a detector for detecting intensity of the coherent light reflected by the information medium, the intensity of the coherent light detected depending on the information stored in the information medium;

a plurality of inverted polarization layers periodically arranged in the substrate, which is made of a non-linear crystal polarized in a first direction perpendicular to the propagation direction, at phase-matching intervals in the propagation direction to cross the optical waveguide, a polarization direction of the inverted polarization layers being opposite to the first direction of the substrate, a part of the fundamental waves changing to second harmonic waves in alternate rows of the inverted polarization layers and the substrate, and the second harmonic waves being converged at the information medium and the intensity of the second harmonic waves being detected by the detector.

70. An integrated optical circuit, comprising:

a substrate;

an optical waveguide arranged in the substrate for transmitting coherent light from an incident side to an output side;

a semiconductor laser arranged closely to the incident side of the optical waveguide, a beam of the coherent light being directly radiated from the semiconductor laser to the optical waveguide;

a grating, which is composed of a series of parallel grating elements periodically arranged adjacent to the optical waveguide at grating intervals in a propagation direction of the coherent light transmitting through the optical waveguide, for reflecting a part of the coherent light spreading outside the optical waveguide toward the semiconductor laser to fix a wavelength of the coherent light radiated from the semiconductor laser; and a plurality of converging devices compactly arranged on the optical waveguide for converging the coherent light not reflected by the grating at an information medium to read information stored in the information medium.

71. An integrated optical circuit according to claim 70 in which the converging devices include a grating lens consisting of a second grating which is composed of a series of parallel second grating elements periodically arranged in a direction perpendicular to the propagation direction for collimating the coherent light;

a light deflection device for radiating elastic waves into the optical waveguide to deflect the coherent light collimated by the grating lens; and a grating coupler consisting of a plurality of arch-shaped grating elements periodically arranged in the propagation direction for converging the coherent light deflected by the light deflection device at the information medium.

72. An integrated optical circuit according to claim 70 in which the converging devices include a grating lens consisting of a plurality of first arch-shaped grating elements periodically arranged in the propagation direction for collimating the coherent light;

a grating coupler consisting of a plurality of second arch-shaped grating elements periodically arranged in the propagation direction for converging the coherent light collimated by the grating lens at the information medium and collimating coherent light reflected by the information medium; and a grating beam splitter consisting of a plurality of second grating elements periodically arranged in a direction perpendicular to the propagation direction for splitting the coherent light collimated by the grating coupler in two beams, each of the beams being detected by a detector.

73. An integrated optical circuit according to claim 70 in which the optical waveguide is a three-dimensional optical waveguide.

74. An integrated optical circuit according to claim 70 in which the substrate is made of $LiTa_{(1-x)}Nb_xO_3$ ($0 \leq X \leq 1$).

75. An integrated optical circuit according to claim 70 in which the optical waveguide is formed by exchanging a part of $Li^+$ ions included in the substrate for $H^+$ ions.

76. An integrated optical circuit, comprising:

a semiconductor laser for radiating a beam of fundamental waves;

a substrate made of a non-linear crystal, the substrate being polarized in a first direction;

a first optical waveguide arranged in the substrate for transmitting the fundamental waves radiated from the semiconductor laser, the first optical waveguide extending in a propagation direction perpendicular to the first direction from an incident side to an output side;

a grating composed of a series of parallel grating elements which are periodically arranged adjacent to the first optical waveguide at grating intervals in the propagation direction, a part of the fundamental waves being reflected by the grating towards the semiconductor laser to fix a wavelength of the fundamental waves radiated from the semiconductor laser, and the grating being locally positioned in the neighborhood of the incident side of the first optical waveguide;

an electrode arranged on the first optical waveguide positioned in the neighborhood of the output side for inducing electric field which penetrates through the first optical waveguide to reduce a refractive index of the first optical waveguide;

a second optical waveguide arranged in parallel closely to the first optical waveguide for transmitting fundamental waves transferred from the first optical waveguide according to an electro-magnetic coupling in cases where electric field is not induced in the first optical waveguide by the electrode; and a plurality of inverted polarization layers periodically arranged at phase-matching intervals in the propagation direction to cross the second optical waveguide, a polarization direction of the inverted polarization layers being opposite to the first direction of the substrate, the fundamental waves changing to second harmonic waves in alternate rows of the inverted polarization layers and the substrate.

77. An integrated optical circuit according to claim 76 in which the first and second optical waveguides are respectively a three-dimensional optical waveguide.

78. An integrated optical circuit according to claim 76 in which the substrate is made of $LiTa_{(1-x)}Nb_xO_3$ ($0 \leq X \leq 1$).

79. An integrated optical circuit according to claim 76 in which the first and second optical waveguides are respectively formed by exchanging a part of $Li^+$ ions included in the substrate for $H^+$ ions.

* * * * *